(12) United States Patent
Cernea et al.

(10) Patent No.: US 9,064,547 B2
(45) Date of Patent: Jun. 23, 2015

(54) 3D NON-VOLATILE MEMORY HAVING LOW-CURRENT CELLS AND METHODS

(71) Applicant: SanDisk 3D LLC, Milpitas, CA (US)

(72) Inventors: Raul Adrian Cernea, Santa Clara, CA (US); Yung-Tin Chen, Santa Clara, CA (US); George Samachisa, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/196,956

(22) Filed: Mar. 4, 2014

(65) Prior Publication Data

US 2014/0254231 A1    Sep. 11, 2014

Related U.S. Application Data

(60) Provisional application No. 61/773,043, filed on Mar. 5, 2013.

(51) Int. Cl.
| | |
|---|---|
| *G11C 5/02* | (2006.01) |
| *G11C 5/06* | (2006.01) |
| *G11C 13/00* | (2006.01) |
| *H01L 27/24* | (2006.01) |

(Continued)

(52) U.S. Cl.
CPC .............. *G11C 5/06* (2013.01); *G11C 13/0002* (2013.01); *G11C 5/04* (2013.01); *G11C 5/025* (2013.01); *H01L 45/06* (2013.01); *H01L 45/08* (2013.01); *H01L 45/085* (2013.01); *H01L 45/1226* (2013.01); *H01L 45/142* (2013.01); *H01L 45/143* (2013.01); *H01L 45/144* (2013.01); *H01L 45/146* (2013.01); *H01L 45/147* (2013.01); *H01L 45/148* (2013.01); *H01L 45/149* (2013.01); *H01L 27/2454* (2013.01); *H01L 27/249* (2013.01); *H01L 45/065* (2013.01)

(58) Field of Classification Search
CPC .......... G11C 5/025; G11C 5/04; G11C 5/063; G11C 11/4097; G11C 7/18
USPC ........................................ 365/51, 113, 163
See application file for complete search history.

(56) References Cited

U.S. PATENT DOCUMENTS

| | | |
|---|---|---|
| 5,172,338 A | 12/1992 | Mehrotra et al. |
| 5,570,315 A | 10/1996 | Tanaka et al. |
| 5,774,397 A | 6/1998 | Endoh et al. |

(Continued)

OTHER PUBLICATIONS

Notification of Transmittal of the International Search Report and the Written Opinion of the International Searching Authority, or the Declaration, mailed on Jun. 27, 2014, 11 pages.

*Primary Examiner* — Jason Lappas
(74) *Attorney, Agent, or Firm* — Davis Wright Tremaine LLP

(57) ABSTRACT

A 3D array of nonvolatile memory has each read/write element accessed at a crossing between a word line and a bit line. The read/write element forms a tubular electrode having an outside shell of R/W material enclosing an oxide core. In a rectangular form, one side of the electrode contacts the word line and another side contacts the bit line. The thickness of the shell rather than its surface areas in contact with the word line and bit line determines the conduction cross-section and therefore the resistance. By adjusting the thickness of the shell, independent of its contact area with either the word line or bit line, each read/write element can operate with a much increased resistance and therefore much reduced current. Processes to manufacture a 3D array with such tubular R/W elements 3D array are also described.

18 Claims, 50 Drawing Sheets

(51) Int. Cl.
  *G11C 5/04* (2006.01)
  *H01L 45/00* (2006.01)

(56) References Cited

U.S. PATENT DOCUMENTS

| | | | |
|---|---|---|---|
| 6,046,935 A | 4/2000 | Takeuchi et al. | |
| 6,222,762 B1 | 4/2001 | Guterman et al. | |
| 6,373,746 B1 | 4/2002 | Takeuchi et al. | |
| 6,456,528 B1 | 9/2002 | Chen | |
| 6,522,580 B2 | 2/2003 | Chen et al. | |
| 6,538,922 B1 | 3/2003 | Khalid et al. | |
| 6,643,188 B2 | 11/2003 | Tanaka et al. | |
| 6,678,192 B2 | 1/2004 | Gongwer et al. | |
| 6,771,536 B2 | 8/2004 | Li et al. | |
| 6,781,877 B2 | 8/2004 | Cernea et al. | |
| 7,023,739 B2 | 4/2006 | Chen et al. | |
| 7,177,191 B2 | 2/2007 | Fasoli et al. | |
| 7,237,074 B2 | 6/2007 | Guterman et al. | |
| 7,324,393 B2 | 1/2008 | Chan et al. | |
| 7,342,279 B2 | 3/2008 | Harari et al. | |
| 2006/0184720 A1 | 8/2006 | Sinclair et al. | |
| 2009/0001344 A1 | 1/2009 | Schricker et al. | |
| 2009/0141547 A1 | 6/2009 | Jin et al. | |
| 2011/0140068 A1 | 6/2011 | Ozawa et al. | |
| 2012/0147649 A1 | 6/2012 | Samachisa et al. | |
| 2012/0147650 A1* | 6/2012 | Samachisa et al. | 365/51 |

* cited by examiner

READ Bias Voltage and Leakage Current Flow
in a double-sided word line architecture Single-Sided Word line Structure Single-Sided Word line Structure READ Bias Voltage and Leakage Current Flow

Single-Sided Word line Structure

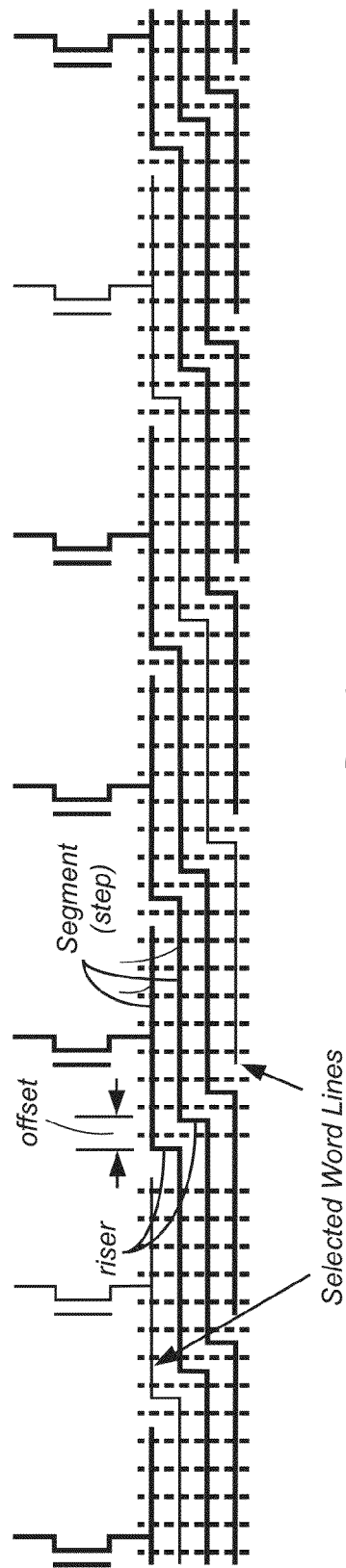
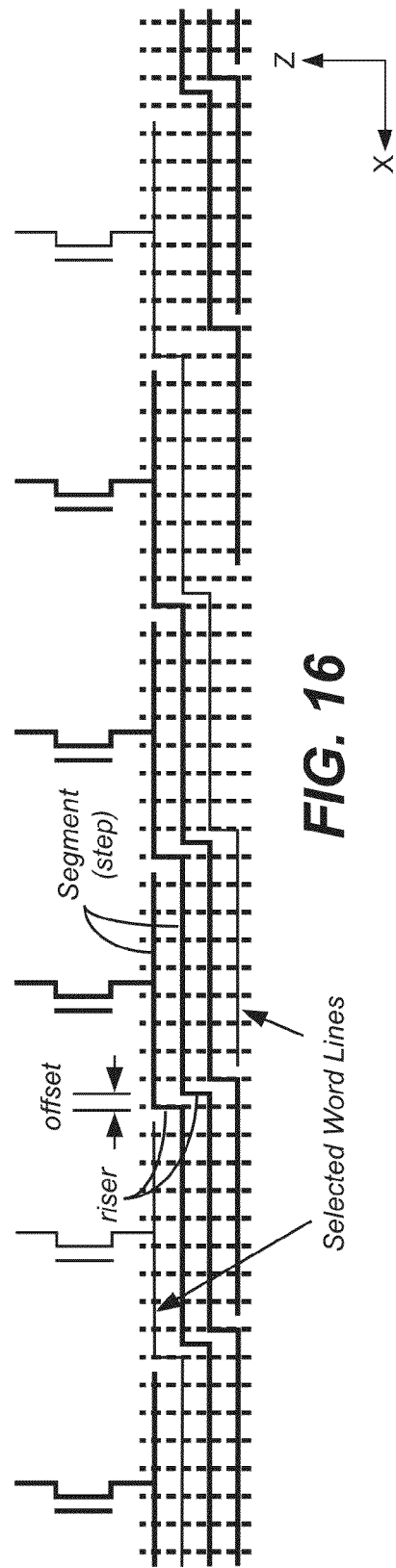
FIG. 15
FIG. 16

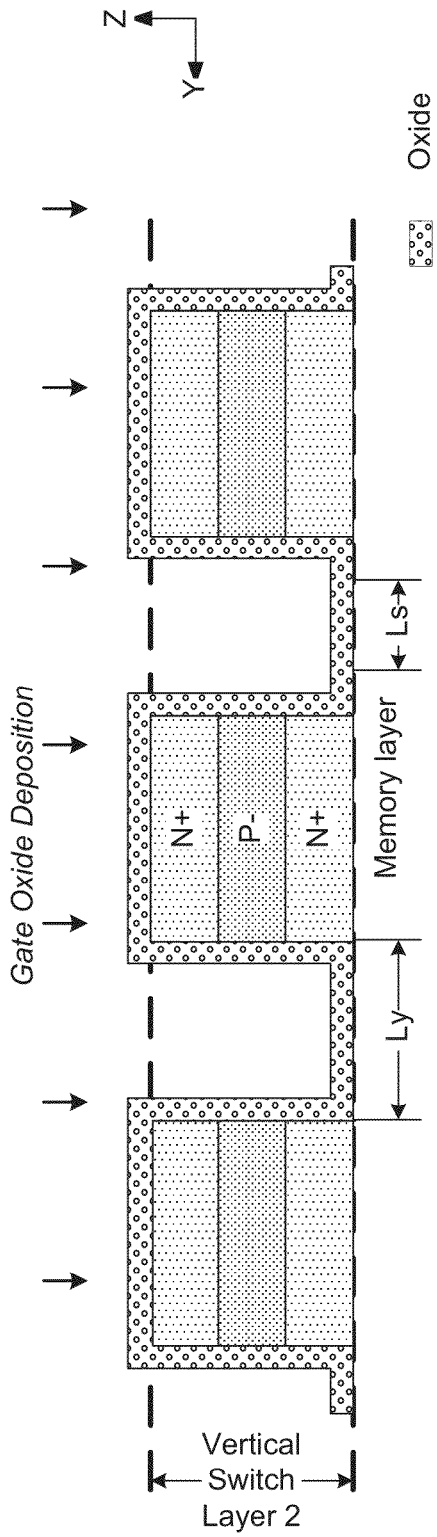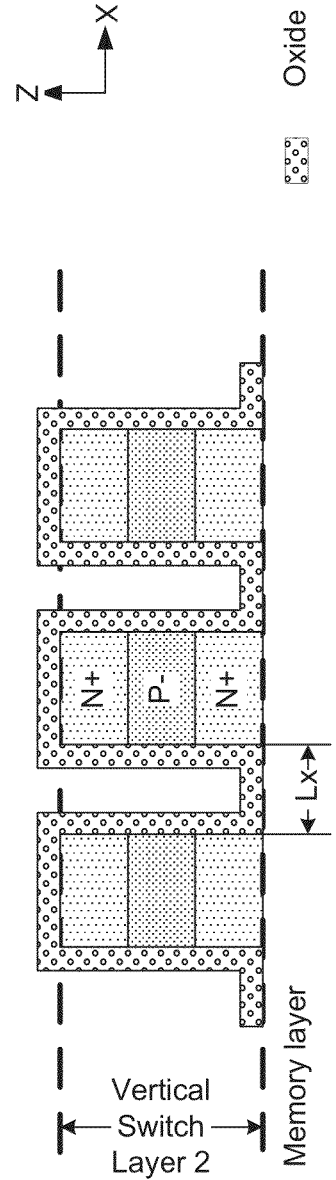
FIG. 30A
FIG. 30B

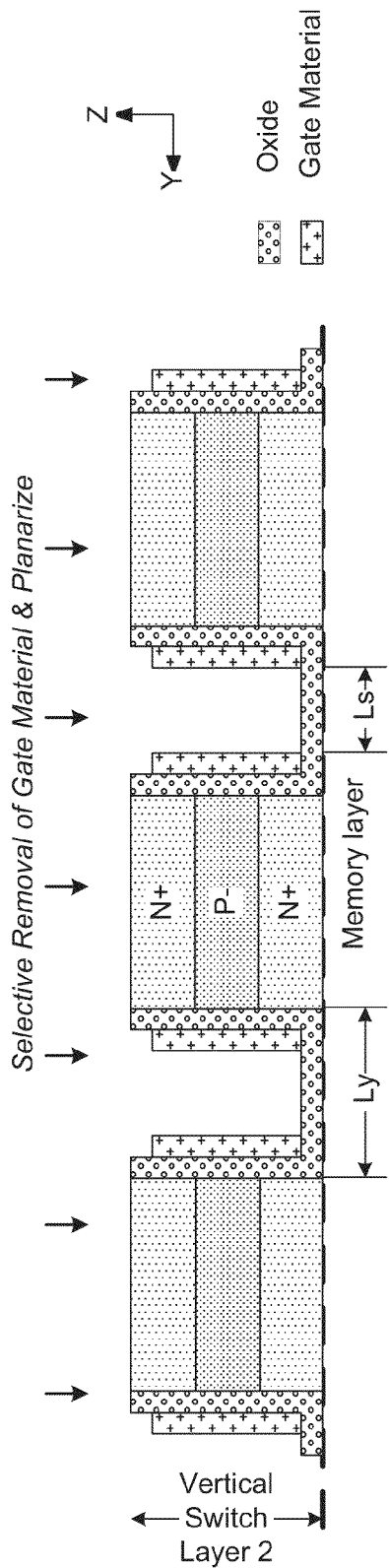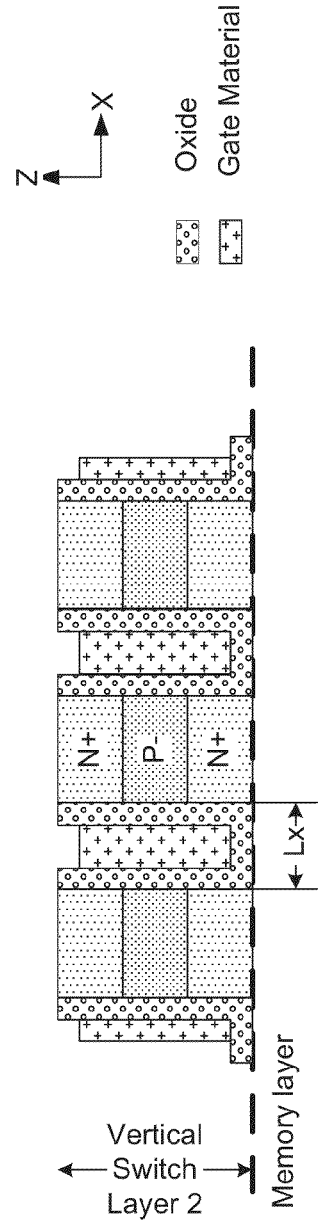
FIG. 32A
FIG. 32B

Previous R/W element
relative to Local Bit Line and Word Line

Hollow R/W element
relative to Local Bit Line and Word Line

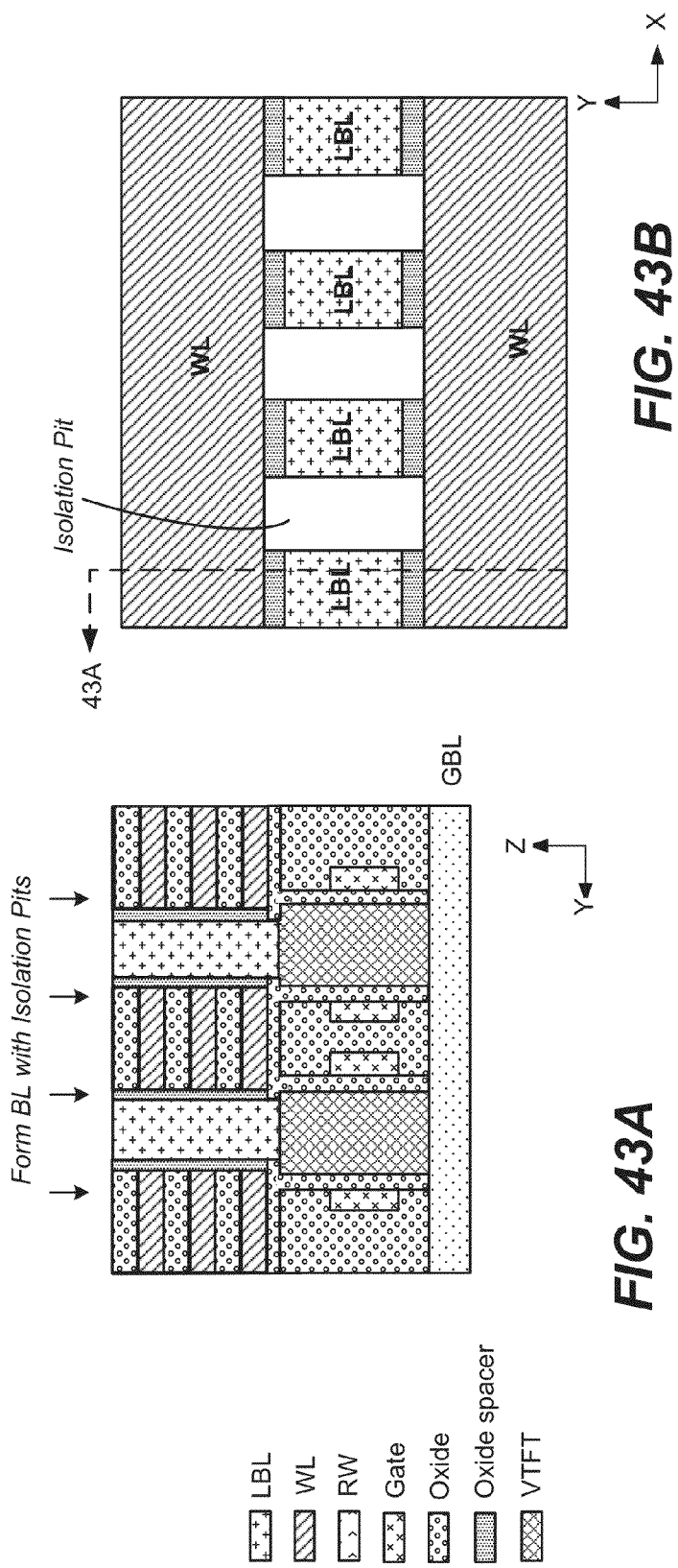

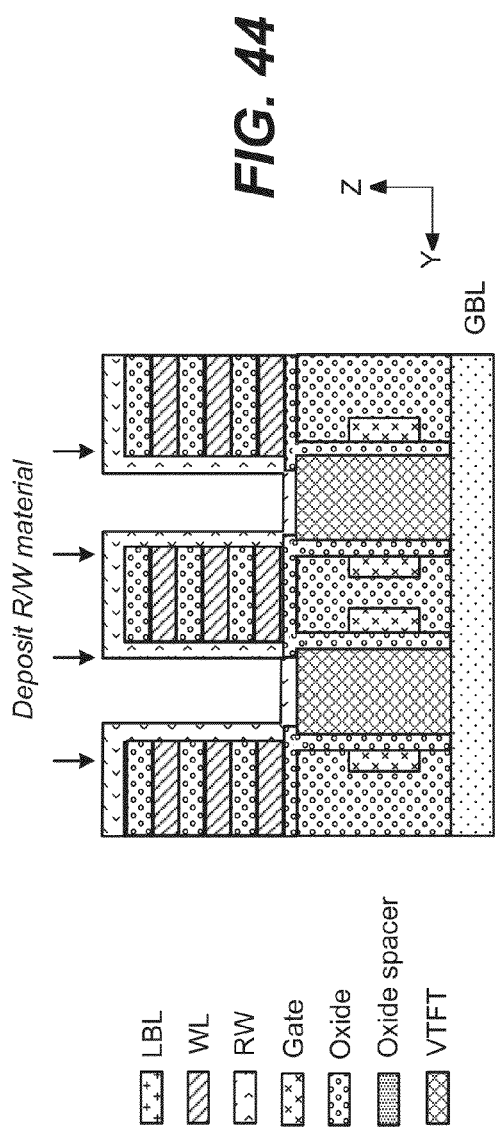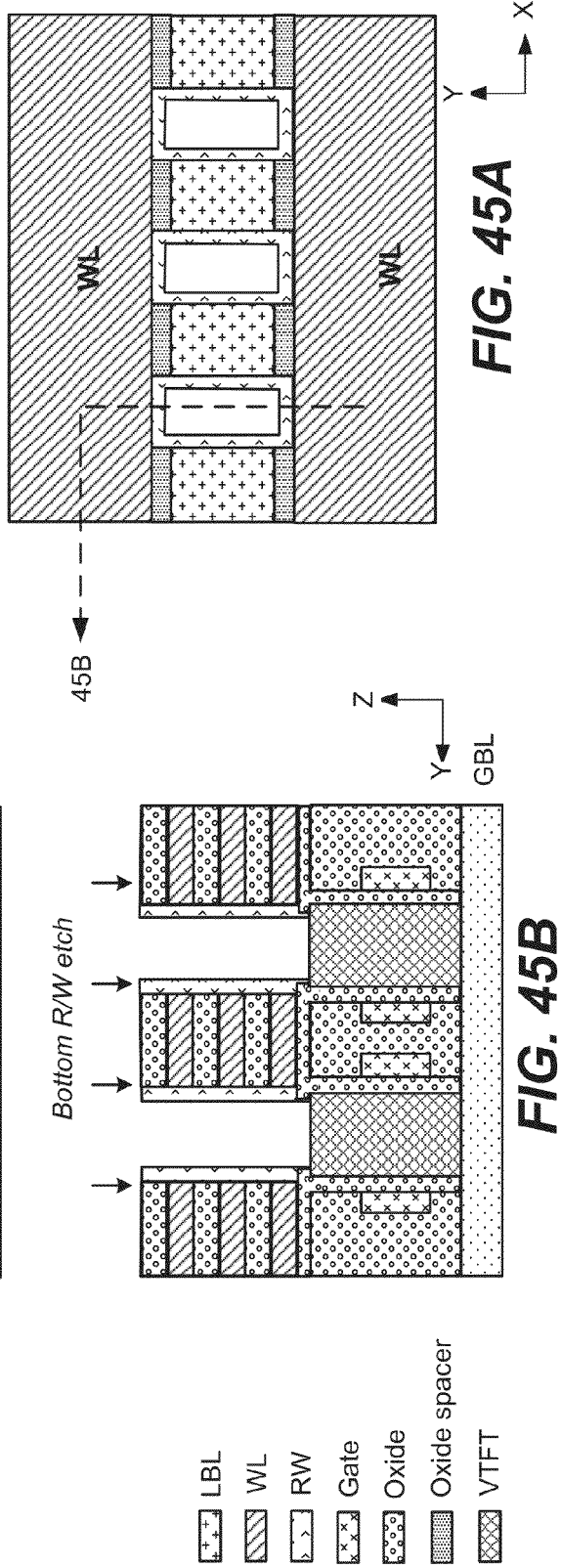

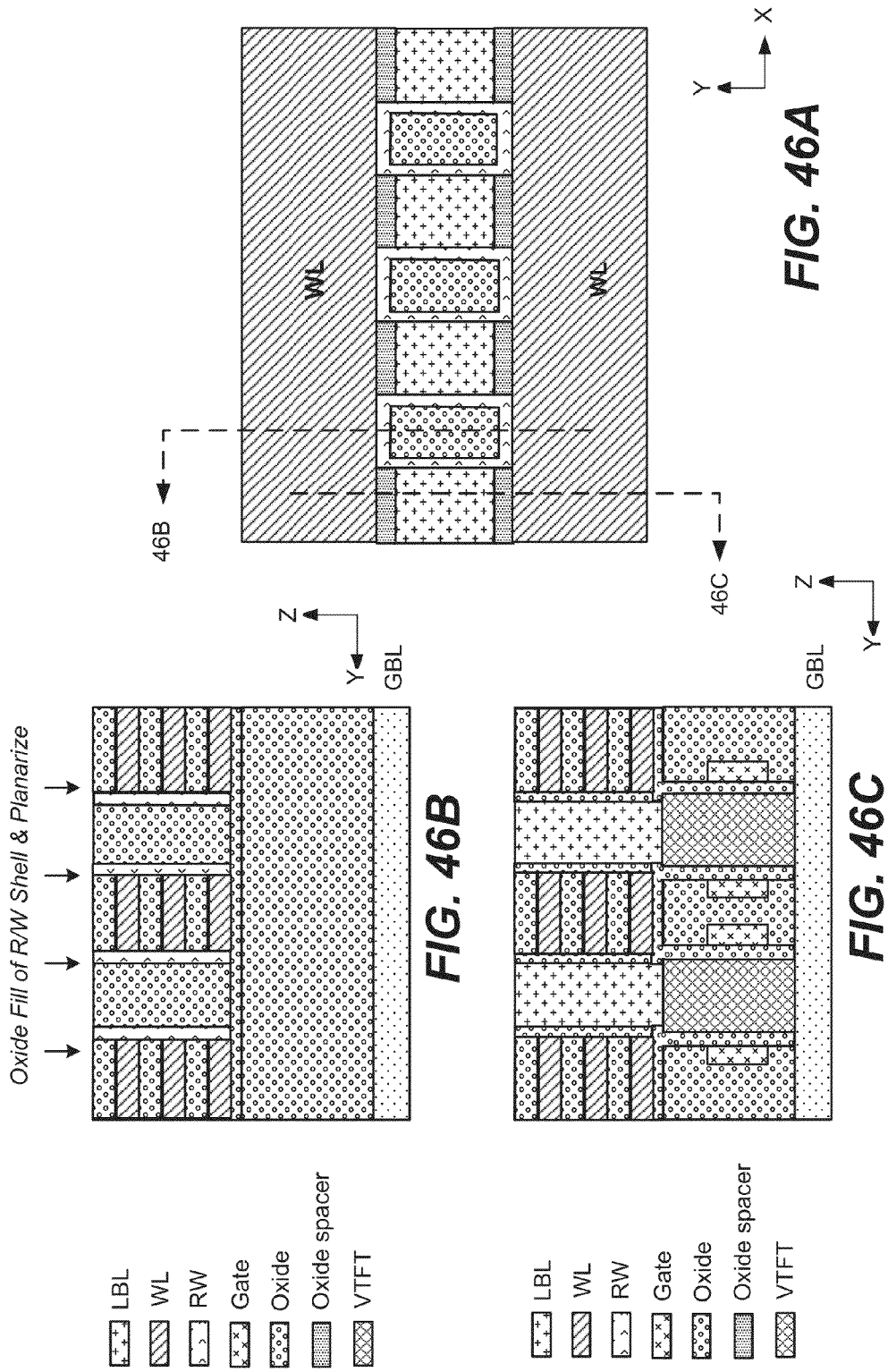

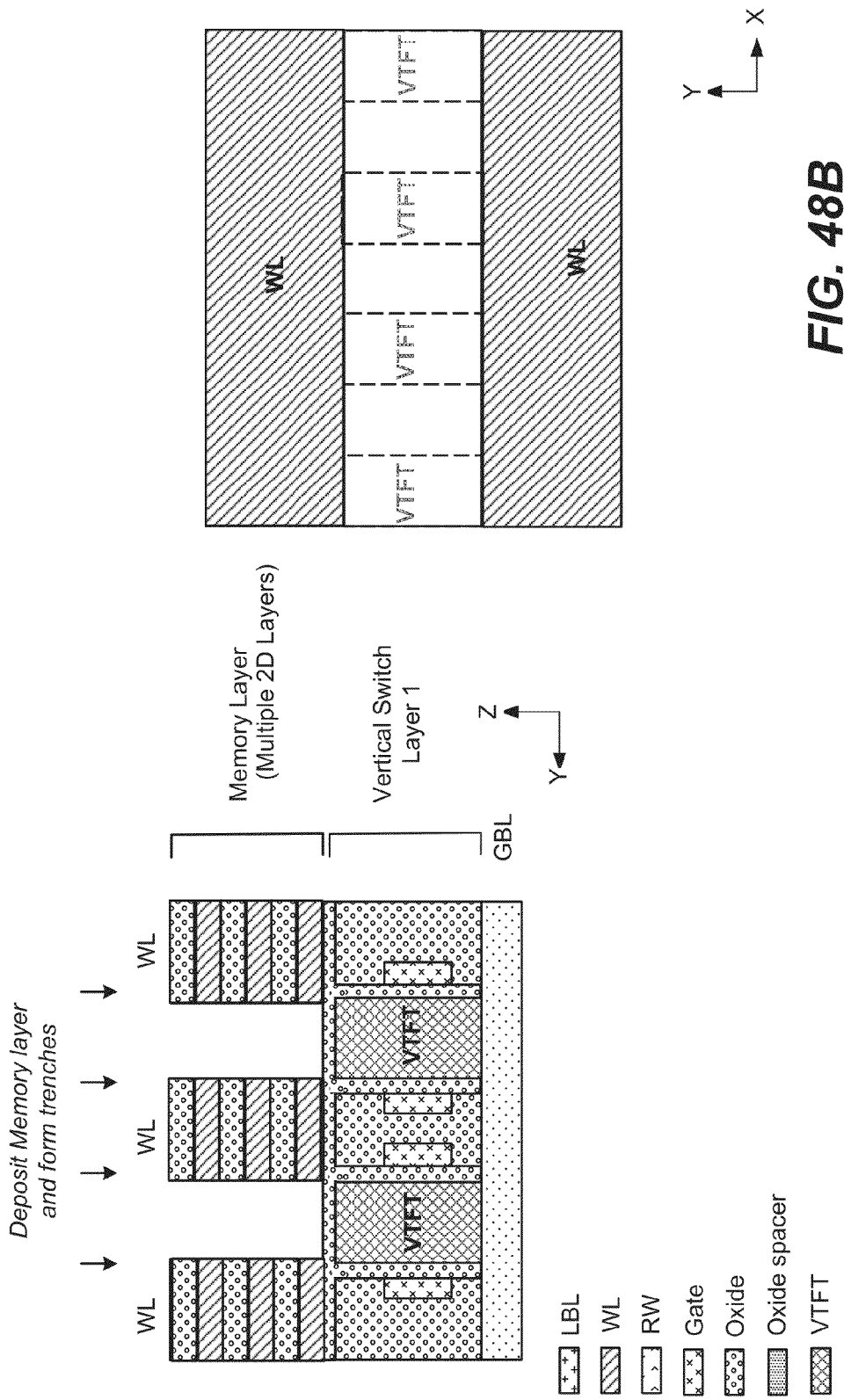

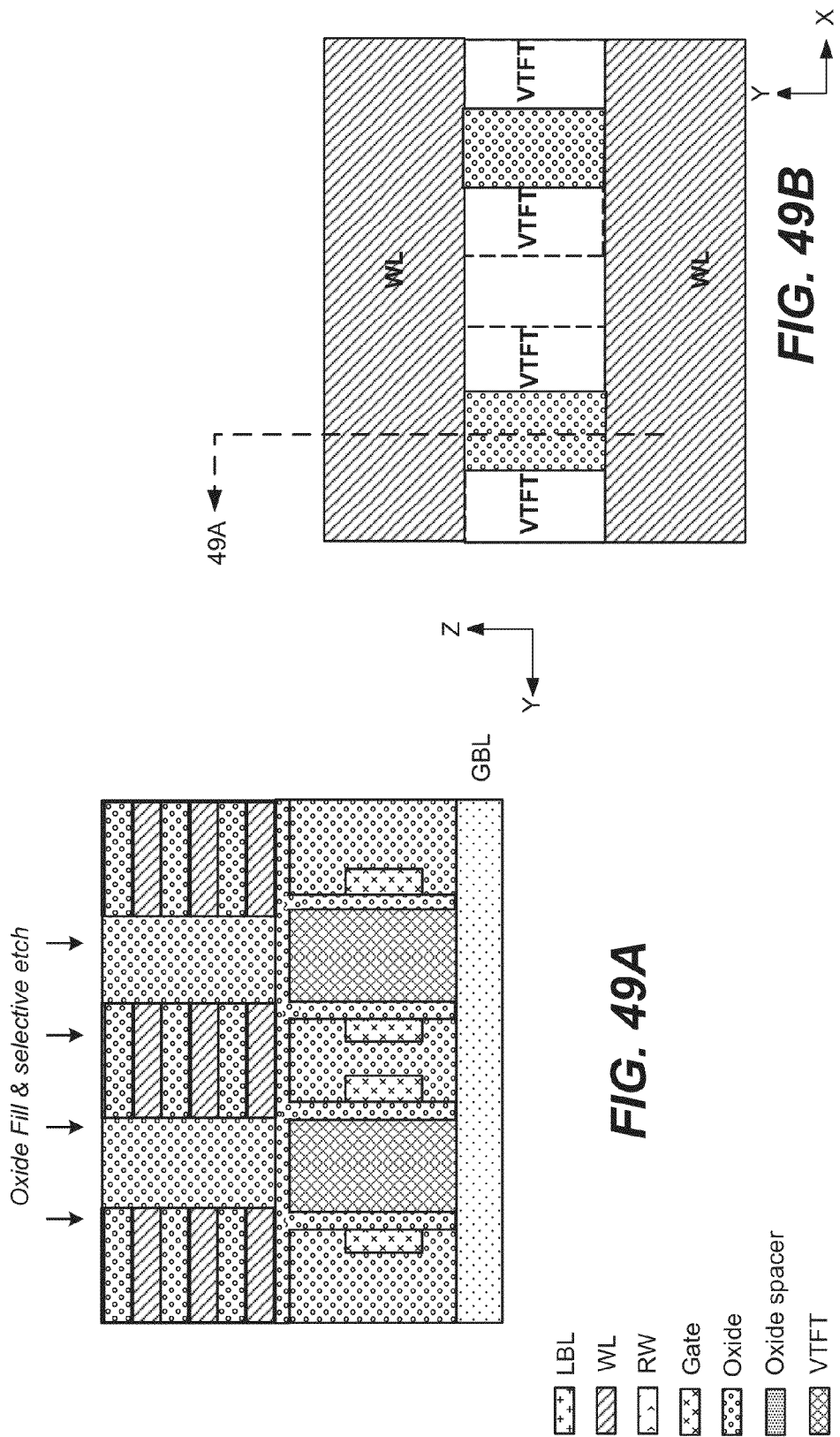

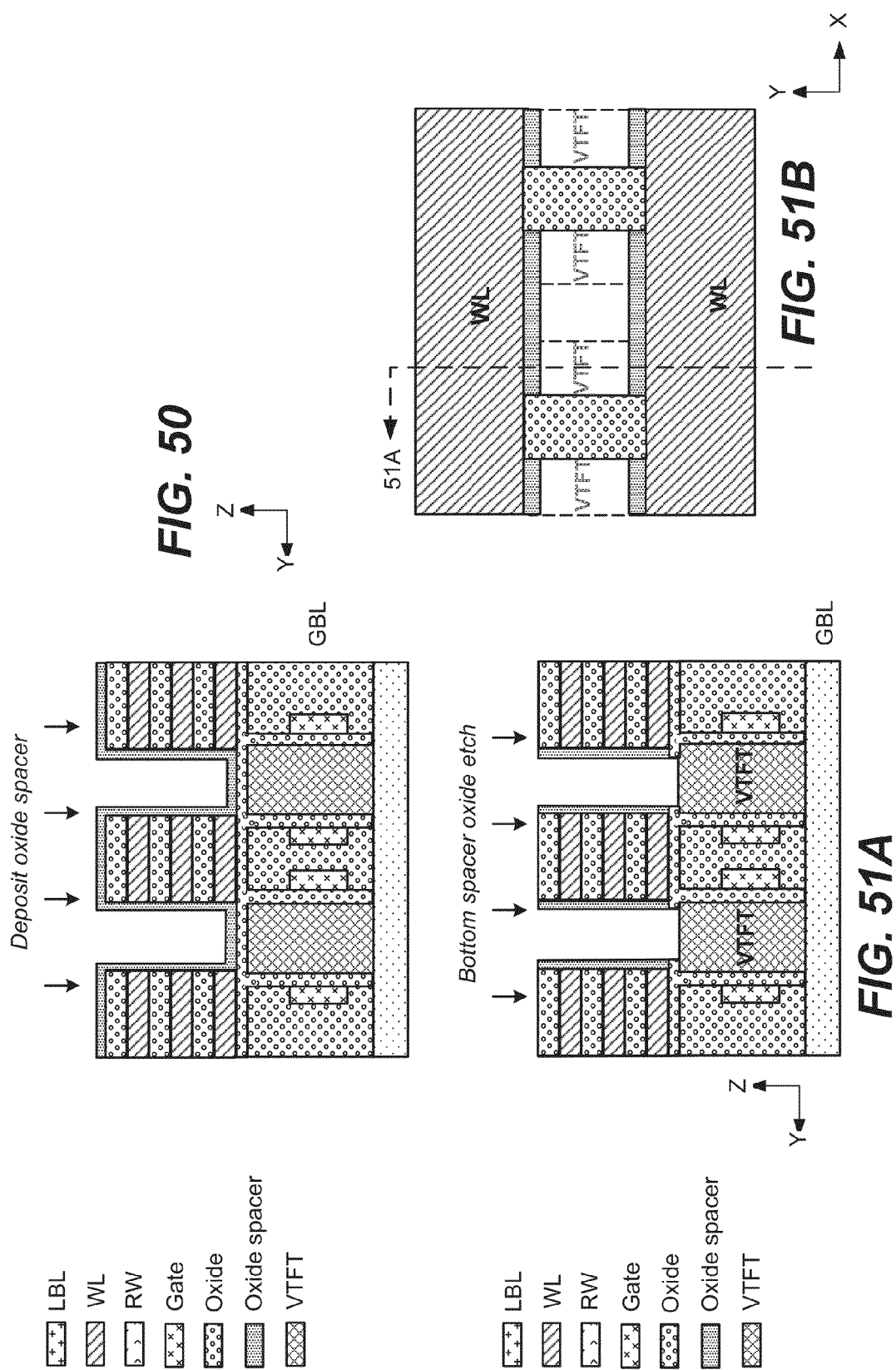

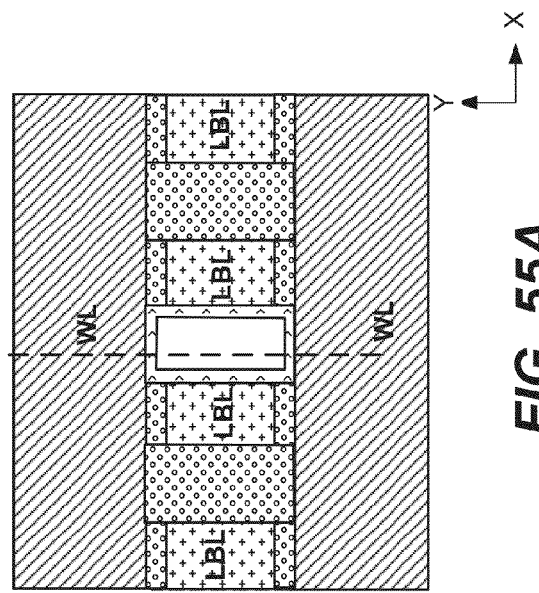
FIG. 55A
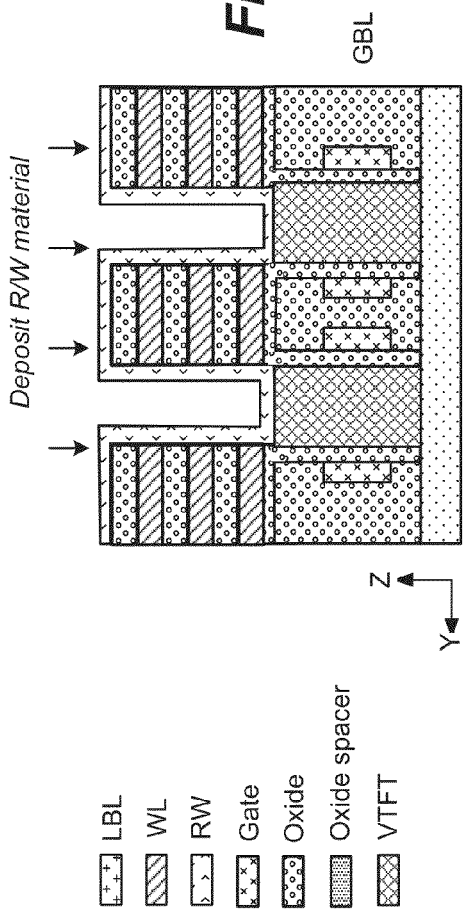
FIG. 54
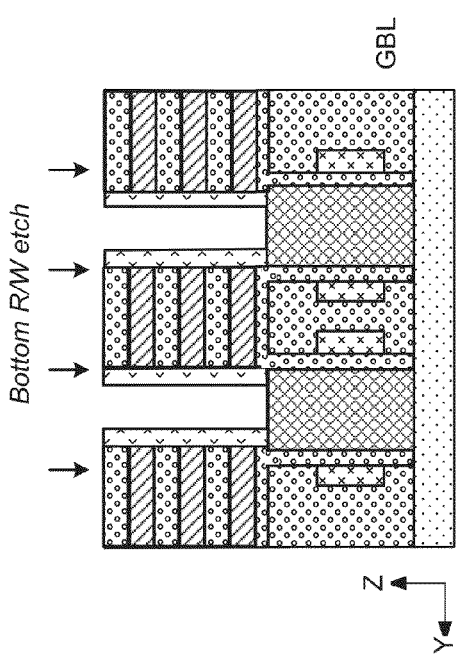
FIG. 55B
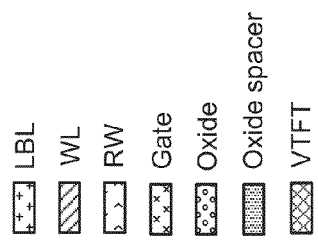

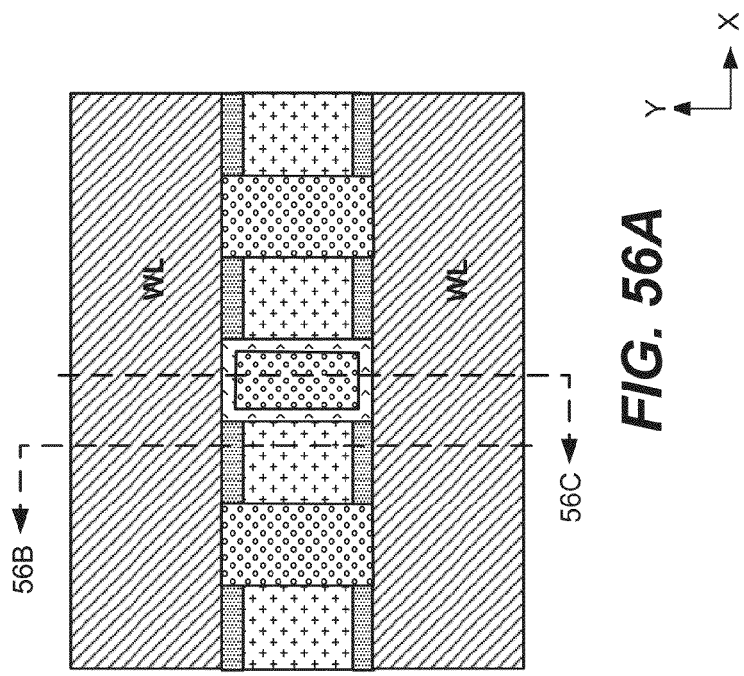
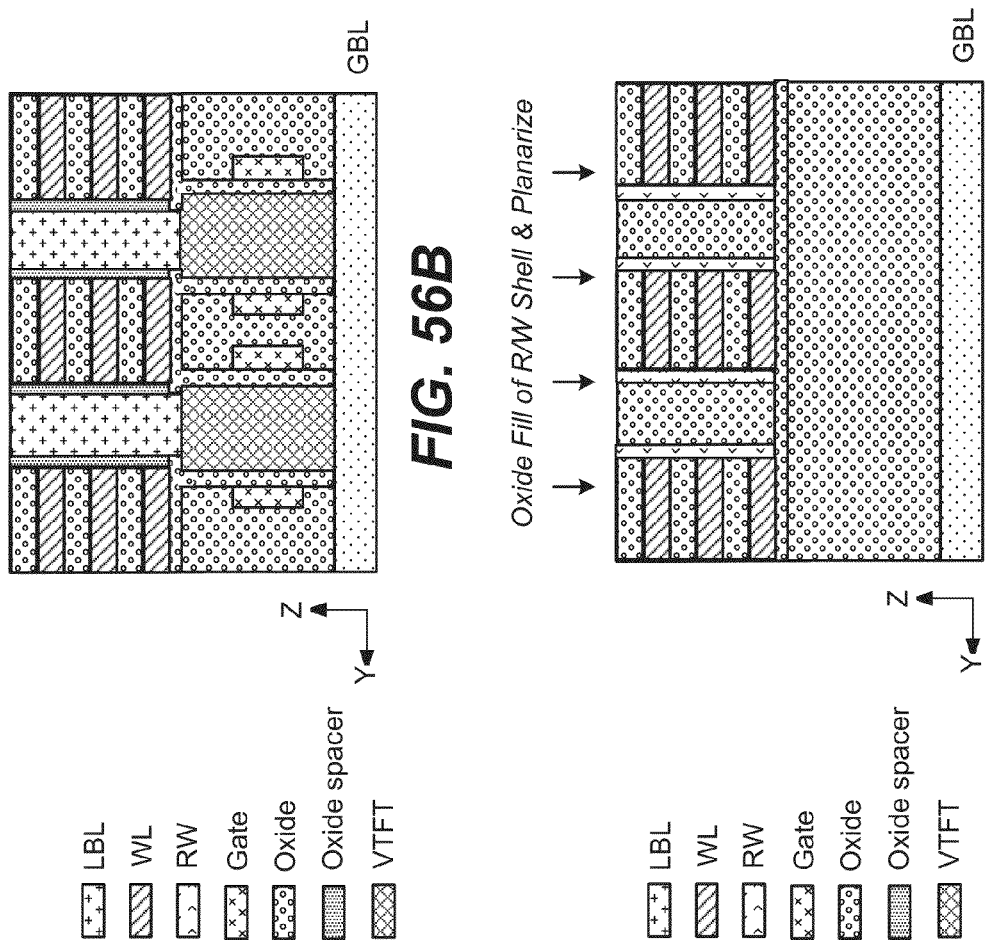
FIG. 56A
FIG. 56B
FIG. 56C

3D NON-VOLATILE MEMORY HAVING LOW-CURRENT CELLS AND METHODS

CROSS-REFERENCE TO RELATED APPLICATIONS

The benefit is claimed for the following: U.S. provisional patent application of Raul Adrian Cernea, Yung-Tin Chen, Henry Chien and George Samachisa, Application No. 61/773,043 filed on Mar. 5, 2013. The entire disclosure of said provisional patent application is being incorporated herein by reference.

BACKGROUND

The subject matter of this application is the structure, use and making of re-programmable non-volatile memory cell arrays, and, more specifically, to three-dimensional arrays of memory storage elements formed on and above semiconductor substrates.

Uses of re-programmable non-volatile mass data storage systems utilizing flash memory are widespread for storing data of computer files, camera pictures, and data generated by and/or used by other types of hosts. A popular form of flash memory is a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of flash memory systems in widespread use is the flash drive, which is a hand held memory system in a small elongated package that has a Universal Serial Bus (USB) plug for connecting with a host by plugging it into the host's USB receptacle. SanDisk Corporation, assignee hereof, sells flash drives under its Cruzer, Ultra and Extreme Contour trademarks. In yet another form of flash memory systems, a large amount of memory is permanently installed within host systems, such as within a notebook computer in place of the usual disk drive mass data storage system. Each of these three forms of mass data storage systems generally includes the same type of flash memory arrays. They each also usually contain its own memory controller and drivers but there are also some memory only systems that are instead controlled at least in part by software executed by the host to which the memory is connected. The flash memory is typically formed on one or more integrated circuit chips and the controller on another circuit chip. But in some memory systems that include the controller, especially those embedded within a host, the memory, controller and drivers are often formed on a single integrated circuit chip.

There are two primary techniques by which data are communicated between the host and flash memory systems. In one of them, addresses of data files generated or received by the system are mapped into distinct ranges of a continuous logical address space established for the system. The extent of the address space is typically sufficient to cover the full range of addresses that the system is capable of handling. As one example, magnetic disk storage drives communicate with computers or other host systems through such a logical address space. The host system keeps track of the logical addresses assigned to its files by a file allocation table (FAT) and the memory system maintains a map of those logical addresses into physical memory addresses where the data are stored. Most memory cards and flash drives that are commercially available utilize this type of interface since it emulates that of magnetic disk drives with which hosts have commonly interfaced.

In the second of the two techniques, data files generated by an electronic system are uniquely identified and their data logically addressed by offsets within the file. Theses file identifiers are then directly mapped within the memory system into physical memory locations. Both types of host/memory system interfaces are described and contrasted elsewhere, such as in patent application publication no. US 2006/0184720 A1.

Flash memory systems typically utilize integrated circuits with arrays of memory cells that individually store an electrical charge that controls the threshold level of the memory cells according to the data being stored in them. Electrically conductive floating gates are most commonly provided as part of the memory cells to store the charge but dielectric charge trapping material is alternatively used. A NAND architecture is generally preferred for the memory cell arrays used for large capacity mass storage systems. Other architectures, such as NOR, are typically used instead for small capacity memories. Examples of NAND flash arrays and their operation as part of flash memory systems may be had by reference to U.S. Pat. Nos. 5,570,315, 5,774,397, 6,046,935, 6,373,746, 6,456,528, 6,522,580, 6,643,188, 6,771,536, 6,781,877 and 7,342,279.

The amount of integrated circuit area necessary for each bit of data stored in the memory cell array has been reduced significantly over the years, and the goal remains to reduce this further. The cost and size of the flash memory systems are therefore being reduced as a result. The use of the NAND array architecture contributes to this but other approaches have also been employed to reducing the size of memory cell arrays. One of these other approaches is to form, on a semiconductor substrate, multiple two-dimensional memory cell arrays, one on top of another in different planes, instead of the more typical single array. Examples of integrated circuits having multiple stacked NAND flash memory cell array planes are given in U.S. Pat. Nos. 7,023,739 and 7,177,191.

Another type of re-programmable non-volatile memory cell uses variable resistance memory elements that may be set to either conductive or non-conductive states (or, alternately, low or high resistance states, respectively), and some additionally to partially conductive states and remain in that state until subsequently re-set to the initial condition. The variable resistance elements are individually connected between two orthogonally extending conductors (typically bit and word lines) where they cross each other in a two-dimensional array. The state of such an element is typically changed by proper voltages being placed on the intersecting conductors. Since these voltages are necessarily also applied to a large number of other unselected resistive elements because they are connected along the same conductors as the states of selected elements being programmed or read, diodes are commonly connected in series with the variable resistive elements in order to reduce leakage currents that can flow through them. The desire to perform data reading and programming operations with a large number of memory cells in parallel results in reading or programming voltages being applied to a very large number of other memory cells. An example of an array of variable resistive memory elements and associated diodes is given in patent application publication no. US 2009/0001344 A1.

SUMMARY OF THE INVENTION

3D Array of Read/Write Elements with Low Current Cells

According to a general context of the invention, a nonvolatile memory is provided with a 3D array of read/write (R/W) memory elements accessible by an x-y-z framework of an array of local bit lines or bit line pillars in the z-direction and word lines in multiple layers in the x-y plane perpendicular to the z-direction. An x-array of global bit lines in the y-direction is switchably coupled to individual ones of the local bit line pillars along the y-direction. This is accomplished by a select transistor between each of the individual local bit line pillars and a global bit line. Each select transistor is a pillar select device that is formed as a vertical structure, switching between a local bit line pillar and a global bit line.

According to one aspect of the invention, a nonvolatile memory is provided with a 3D array of read/write (R/W) memory elements as memory cells. Each R/W memory element can be set or reset to at least one of two resistive states. The reading of an R/W memory cell is by detecting a corresponding current resulting from one these resistive states. It is preferable to operate with low current and high resistive states. The resistance of these resistive states depends also on the dimension of the R/W elements. Since each R/W element is formed at a crossing between a word line and a bit line, the dimension is predetermined by the process technology. This aspect of the invention provides another degree of freedom to adjust the resistance of the R/W memory element. This is accomplished by providing the R/W memory element in the form of a shell enclosing an oxide core. The thickness of the shell rather than its surface areas in contact with the word line and bit line controls the conduction cross-section and therefore the resistance. By adjusting the thickness of the shell, independent of the electrode's contact area with either the word line or bit line, each R/W element can operate with a much increased resistance and therefore much reduced current.

In particular, the bit lines oriented in the vertical direction serve multiple layers of 2D arrays. Each layer is a 2D array of R/W elements with the word lines in the horizontal or lateral direction. Each R/W element is in the form of a rectangular tube extending in the vertical direction. Thus, the R/W element is a shell with a rectangular cross-section and extended along the z-axis through the multiple layers. At each crossing between a pair of bit line and word line, a first side of the rectangular tube serves as a first electrode in contact with the bit line and a second side of the rectangular tube serves a second electrode in contact with the word line.

In a first embodiment, the shell structure R/W elements are formed in between every vertical local bit line along the x-axis.

In a second embodiment in which the shell structure R/W elements are formed in between every other LBL along the x-axis. Essentially a page of vertical local bit lines is formed in the x-axis between two word lines but isolated from each of them by a layer of oxide spacer. The shell structure R/W elements are in the form of rectangular tubes in the z-axis formed in between a local bit line and an dummy oxide block in place of another local bit line. Thus, each shell structure R/W element is in contact with a first side with the local bit line. Also, each pair of word lines across the y-axis is sandwiching the shell structure R/W element and is in contact with a second two opposite sides of the shell structure R/W element. It will be seen that when a circuit is formed between each pair of crossing bit line and word line, there is one conduction path as compared to two conduction paths in the first embodiment. The cell area in this alternative embodiment is the word line's thickness times the R/W shell thickness.

The low current R/W elements are applicable to a 3D memory structure with vertical local bit lines and horizontally formed active R/W memory elements. The 3D memory structure is defined with respect to an x-y-z coordinate system. The local bit lines (LBLs) are in the z-direction, the word lines (WLs) are in the x-direction.

According to a first method of forming a slab of multi-plane memory with low-current R/W elements each having a shell structure, alternate word line and oxide layers are first formed on top of a vertical switching layer. Trenches are cut in the slab to expose a 2-D array of vertical switches in the vertical switching layer. A layer of oxide spacer is deposited into the trenches and portions of it are etched out to expose individual vertical switches in the trenches. Then the trenches are filled with bit line material, such as polysilicon. Individual bit line pillars are isolated at individual vertical switches after isolation pits are formed by removing the polysilicon thereat. Then a layer of R/W material is deposited in the isolation pits to form a shell structure. The shell is then filled with oxide to provide structure integrity.

According to a second method of forming a slab of multi-plane memory with low-current R/W elements each having a shell structure, alternate word line and oxide layers are first formed on top of a vertical switching layer. Trenches are cut in the slab to expose a 2-D array of vertical switches in the vertical switching layer. Then the trenches are first filled with oxide and portions of it are etched out leaving space for bit line pillars and isolation pits between every other bit line pillars in each trench. Then layer of oxide spacer is deposited into the space and portions of it are etched out to expose individual vertical switches in the trenches. Then the space is filled with bit line material, such as polysilicon. Individual bit line pillars are isolated at individual vertical switches after isolation pits are formed by removing the polysilicon thereat. Then a layer of R/W material is deposited in the isolation pits to form a shell structure. The shell is then filled with oxide to provide structure integrity.

Various aspects, advantages, features and details of the innovative three-dimensional variable resistive element memory system are included in a description of exemplary examples thereof that follows, which description should be taken in conjunction with the accompanying drawings.

All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 15 illustrates a cross-section view of the 3D array along the y-direction according to an embodiment in which the word line step to the next memory layer is made in between the bit lines.

FIG. 16 illustrates a cross-section view of the 3D array along the y-direction according to an embodiment in which the various staggered word line steps are stacked as close as possible.

FIG. 30A is a cross-sectional view along the x-axis illustrating depositing a gate oxide layer on top of the channel pillars.

FIG. 30B is a cross-sectional view along the y-axis of FIG. 30A.

FIG. 32A is a cross-sectional view along the x-axis illustrating further etch back of the gate material layer.

FIG. 32B is a cross-sectional view along the y-axis of FIG. 32A.

FIG. 43A is a cross-sectional view in the x-direction, illustrating the process of isolating the LBLs in the trenches by RIE etching away the portions of N+ poly and oxide not on top of the VTFTs using a bit line mask to create isolation pits.

FIG. 43B is a top plan view in the z-direction of the structure shown in FIG. 43A.

FIG. 44 is a cross-sectional view in the x-direction, illustrating the process of depositing a layer of R/W material of predetermined thickness in the isolation pits.

FIG. 45A is a top plan view in the z-direction illustrating the process of etching the R/W material from the bottom of the isolation pits to create a shell structure R/W element.

FIG. 45B is a cross-sectional view in the x-direction of the structure across the section 45B shown in FIG. 45A.

FIG. 46A is a top plan view in the z-direction, illustrating the process of filling the shell structure R/W elements in the isolation pits with an oxide core.

FIG. 46B is a cross-sectional view in the x-direction of the structure across the section 46B shown in FIG. 46A.

FIG. 46C is a cross-sectional view in the x-direction of the structure across the section 46C shown in FIG. 46A.

FIG. 48A is a cross-sectional view in the x-direction illustrating the process of cutting trenches in the slab of the multiple 2D layers of the memory layer on top of the array of VTFTs in the switching layer 1.

FIG. 48B is a top plan view in the z-direction, illustrating that trenches are cut in the slab aligned with the pillar switches (VTFTs) in the vertical switch layer below the slab.

FIG. 49A is a cross-sectional view in the x-direction, illustrating the process of filling the trenches with oxide.

FIG. 49B is a top plan view in the z-direction of the structure shown in FIG. 49A.

FIG. 50 is a cross-sectional view in the x-direction, illustrating the process of depositing a layer of oxide spacer over the open pits.

FIG. 51A is a cross-sectional view in the x-direction, illustrating the process of etching the oxide from the bottom of the trenches and the top of the slab.

FIG. 51B is a top plan view in the z-direction of the structure shown in FIG. 51A.

FIG. 54 is a cross-sectional view in the x-direction, illustrating the process of depositing a layer of R/W material of predetermined thickness in the isolation pits.

FIG. 55A is a top plan view in the z-direction illustrating the process of etching the R/W material from the bottom of the isolation pits to create a shell structure R/W element.

FIG. 55B is a cross-sectional view in the x-direction of the structure across the section 55B shown in FIG. 55A.

FIG. 56A is a top plan view in the z-direction, illustrating the process of filling the shell structure R/W elements in the isolation pits with an oxide core.

FIG. 56B is a cross-sectional view in the x-direction of the structure across the section 56B shown in FIG. 56A.

FIG. 56C is a cross-sectional view in the x-direction of the structure across the section 56C shown in FIG. 56A.

DESCRIPTION OF EXEMPLARY EMBODIMENTS

Figure 1:
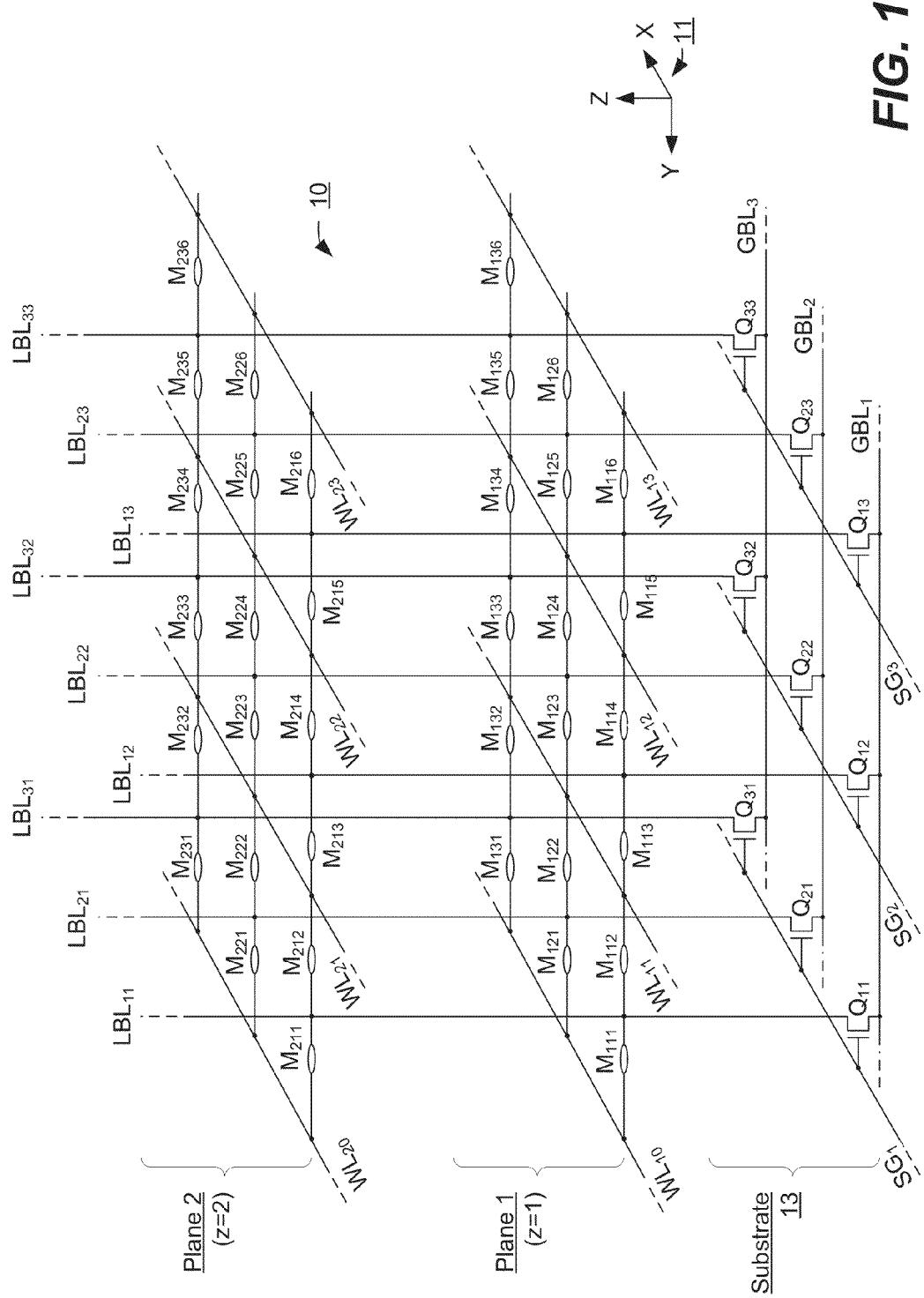
FIG. 1 illustrates schematically an architecture of a three-dimensional memory in the form of an equivalent circuit of a portion of such a memory.

Referring initially to FIG. 1, an architecture of a three-dimensional memory 10 is schematically and generally illustrated in the form of an equivalent circuit of a portion of such a memory. This is a specific example of the three-dimensional array summarized above. A standard three-dimensional rectangular coordinate system 11 is used for reference, the directions of each of vectors x, y and z being orthogonal with the other two.

A circuit for selectively connecting internal memory elements with external data circuits is preferably formed in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, control gate lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the control gate lines $SG_y$ receives a voltage that turns on the select devices to which it is connected. The remaining control gate lines receive voltages that keep their connected select devices off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory storage elements $M_{zxy}$ are formed in a plurality of planes positioned at different distances in the z-direction above the substrate 13. Two planes 1 and 2 are illustrated in FIG. 1 but there will typically be more, such as 4, 6 or even more. In each plane at distance z, word lines WL are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines WL are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Figure 2:
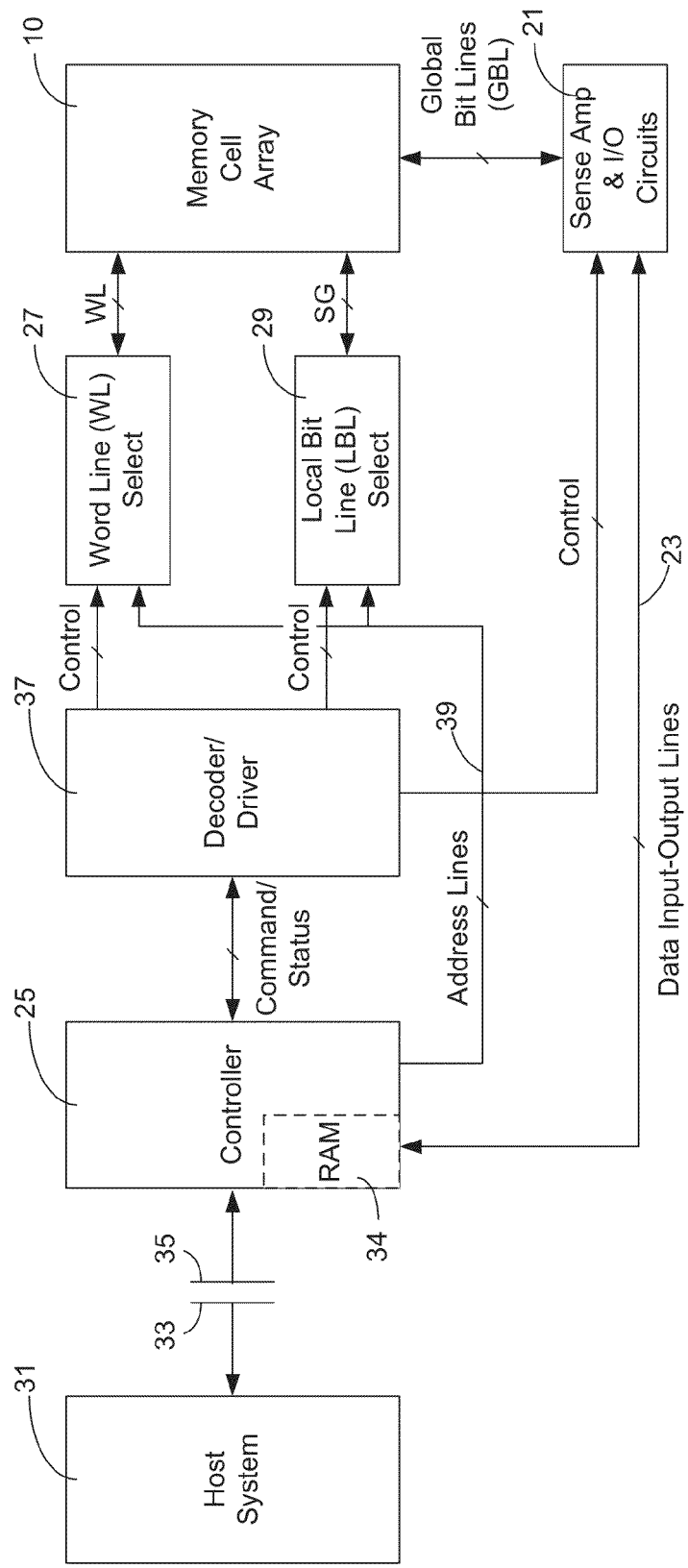
FIG. 2 is a block diagram of an illustrative memory system that can use the three-dimensional memory of FIG. 1.

FIG. 2 is a block diagram of an illustrative memory system that can use the three-dimensional memory 10 of FIG. 1. Sense amplifier and I/O circuits 21 are connected to provide (during programming) and receive (during reading) analog electrical quantities in parallel over the global bit-lines $GBL_x$ of FIG. 1 that are representative of data stored in addressed storage elements $M_{zxy}$. The circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the sense amplifier and I/O circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and select gate control lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

The memory system controller 25 typically receives data from and sends data to a host system 31. The controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

The memory system controller 25 conveys to decoder/driver circuits 37 commands received from the host. Similarly, status signals generated by the memory system are communicated to the controller 25 from the circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and sense amplifier and I/O circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory element array 10 of FIG. 1, the system is not limited to use of only that array architecture. A given memory system may alternatively combine this type of memory with other another type including flash memory, such as flash having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory cell arrays. Resetting a block of memory elements to a common state corresponds to erasing a block of flash memory cells to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
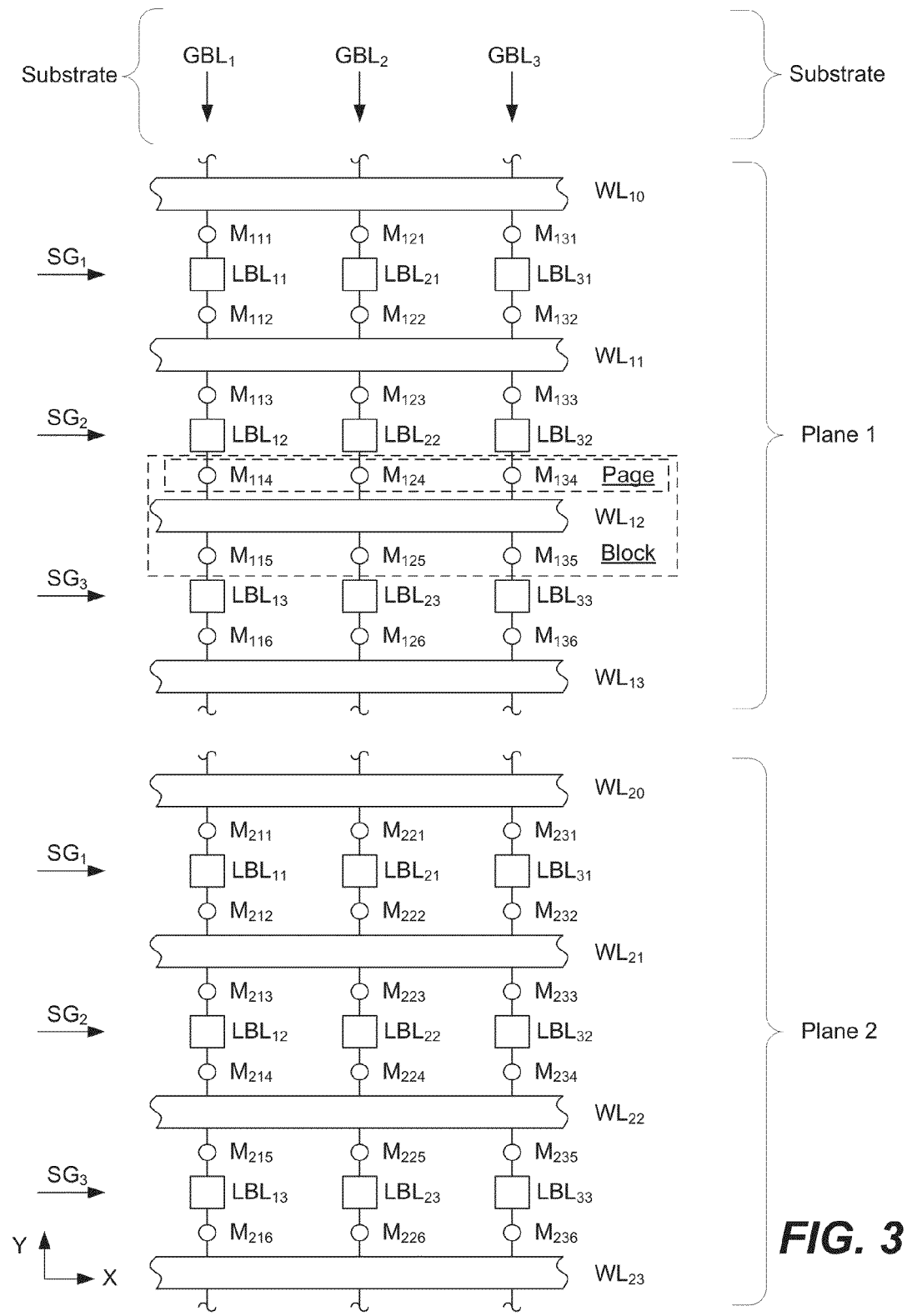
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1", depending upon the memory element state.

To reset (erase) a block of memory elements, the memory elements in that block are placed into their high resistance state. This state will be designated as the logical data state "1", following the convention used in current flash memory arrays but it could alternatively be designated to be a "0". As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to zero volts, by the sense amplifier and I/O circuits 21 of FIG. 2.
2. Set at least the two select gate lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, like something in a range of 1-3 volts, typically 2 volts. The block shown in FIG. 3 includes the word line $WL_{12}$, so the select gate lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.

3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1". For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
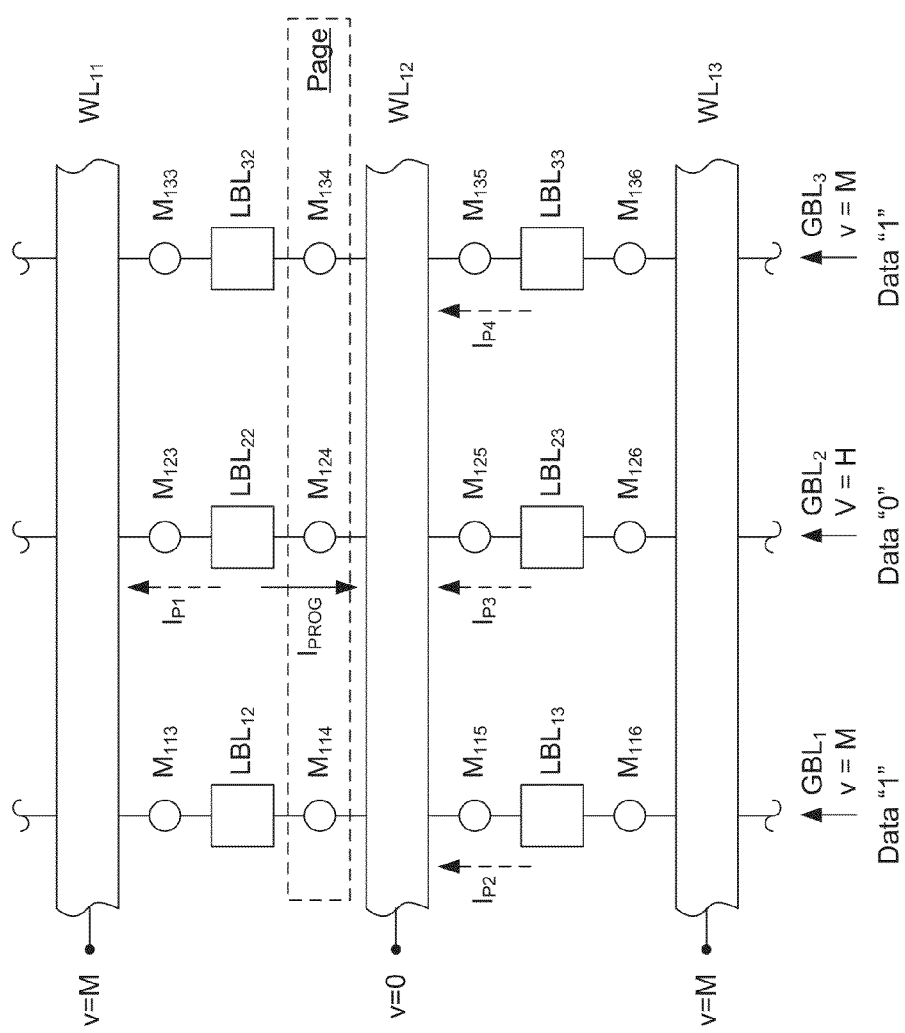
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the select gate lines below and on either side of the selected word line to the H' voltage level, in order to select a page for programming. For the page indicated in FIGS. 3 and 4, the H' voltage is placed on select gate line $SG_2$ in order to turn on select devices $Q_{12}$, $Q_{22}$ and $Q_{32}$ (FIG. 1). All other select gate lines, namely lines $SG_1$ and $SG_3$ in this example, are set to 0 volts in order to keep their select devices off. The select gate line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected select gate line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-8 planes may generally be used in most cases.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
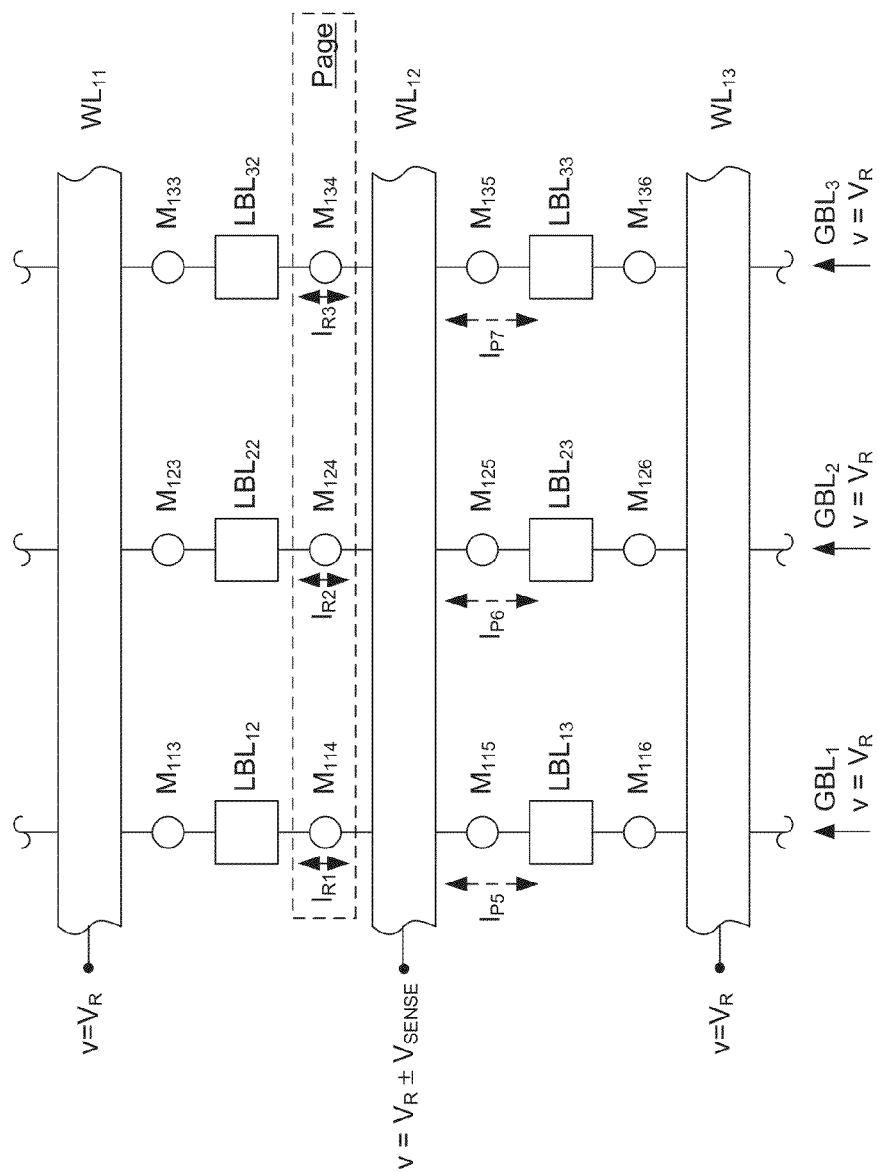
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn on one row of select devices by placing a voltage on the control line adjacent to the selected word line in order to define the page to be read. In the example of FIGS. 1 and 5, a voltage is applied to the control line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the sense amplifier and I/O circuits 21 of FIG. 2, and assume the potential $V_R$ of the global bit lines to which they are connected. All other local bit lines LBLs are allowed to float.

3. Set the selected word line ($WL_{12}$) to a voltage of $V_R \pm V\text{sense}$. The sign of Vsense is chosen based on the sense amplifier and has a magnitude of about 0.5 volt. The voltages on all other word lines remain the same.

4. Sense current flowing into ($V_R$+Vsense) or out of ($V_R$−Vsense) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the sense amplifier and I/O circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.

5. Turn off the select devices ($Q_{12}$, $Q_{22}$ and $Q_{32}$) by removing the voltage from the select gate line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R \pm V$sense without flowing through the sense amplifiers. These parasitic currents will not flow through the selected local bit lines ($LBL_{12}$, $LBL_{22}$ and $LBL_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V$sense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two-step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p-n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials.

The level of parasitic currents increases with the number of planes and with the number of memory elements connected along the individual word lines within each plane. But since the number of word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory cell to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory cells on each current path and thus the leakage currents are reduced as is the number of unselected cells disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 8), or N+n cells are associated with a data operation. For a large N this means that the number of cells affected by a data operation is approximately one-half as many as in a conventional three-dimensional array.

Materials Useful for the Memory Storage Elements

The material used for the non-volatile memory storage elements $M_{zxy}$ in the array of FIG. 1 can be a chalcogenide, a metal oxide, or any one of a number of materials that exhibit a stable, reversible shift in resistance in response to an external voltage applied to or current passed through the material.

Figure 6:
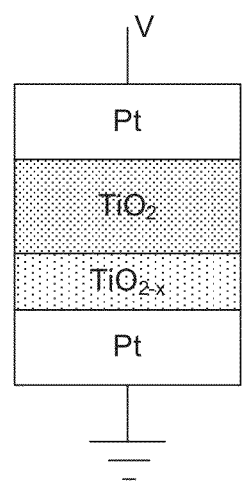
FIG. 6 illustrates an example memory storage element.

Metal oxides are characterized by being insulating when initially deposited. One suitable metal oxide is a titanium oxide ($TiO_x$). A previously reported memory element using this material is illustrated in FIG. 6. In this case, near-stoichiometric $TiO_2$ bulk material is altered in an annealing process to create an oxygen deficient layer (or a layer with oxygen vacancies) in proximity of the bottom electrode. The top platinum electrode, with its high work function, creates a high potential Pt/$TiO_2$ barrier for electrons. As a result, at moderate voltages (below one volt), a very low current will flow through the structure. The bottom Pt/$TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier Pt/$TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure of FIG. 6. Under this positive bias, the oxygen vacancies move away from the proximity of the top Pt/$TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials include HfOx, ZrOx, WOx, NiOx, CoOx, CoalOx, MnOx, $ZnMn_2O_4$, ZnOx, TaOx, NbOx, HfSiOx, HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 5 nm to 50 nm.

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. The switching mechanism from low-to-high resistance and the opposite is not well understood. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

3D Arrays with Reduced Leakage Currents

Conventionally, diodes are commonly connected in series with the variable resistive elements of a memory array in order to reduce leakage currents that can flow through them. The highly compact 3D reprogrammable memory described in the present invention has an architecture that does not require a diode in series with each memory element while able to keep the leakage currents reduced. (Of course, using a diode will further control the leakage currents at the expense of more processing and possible more occupied space.) This is possible with short local vertical bit lines which are selectively coupled to a set of global bit lines. In this manner, the structures of the 3D memory are necessarily segmented and couplings between the individual paths in the mesh are reduced.

Even if the 3D reprogrammable memory has an architecture that allows reduced current leakage, it is desirable to further reduce them. As described earlier and in connection with FIG. 5, parasitic currents may exist during a read operation and these currents have two undesirable effects. First, they result in higher power consumption. Secondly, and more seriously, they may occur in the sensing path of the memory element being sensed, cause erroneous reading of the sensed current.

Figure 7:
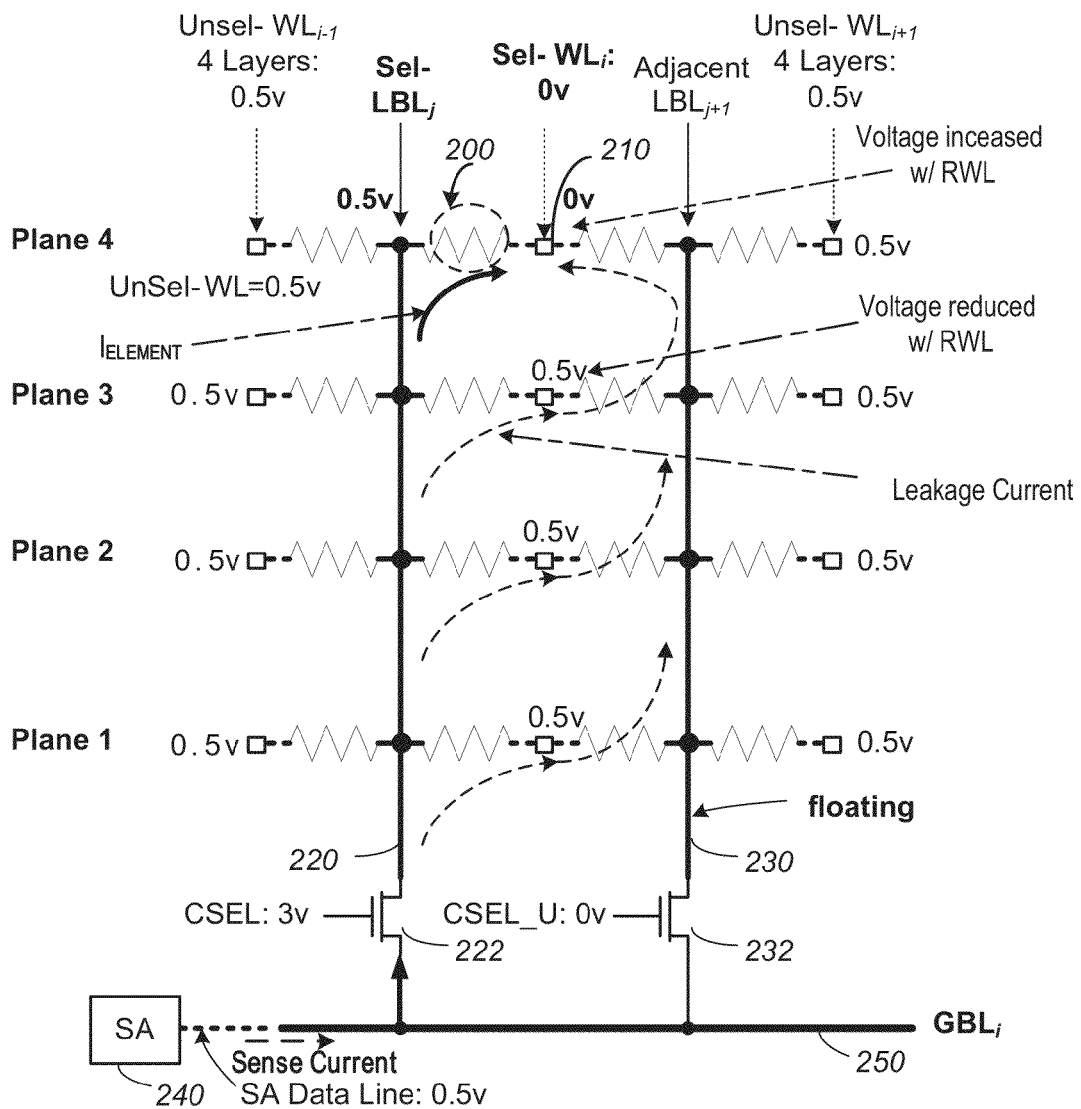
FIG. 7 illustrates the read bias voltages and current leakage across multiple planes of the 3D memory shown in FIG. 1 and FIG. 3.

FIG. 7 illustrates the read bias voltages and current leakage across multiple planes of the 3D memory shown in FIG. 1 and FIG. 3. FIG. 7 is a cross-sectional view across 4 planes along the x-direction of a portion of the perspective 3D view of the memory shown in FIG. 1. It should be clear that while FIG. 1 shows the substrate and 2 planes, FIG. 7 shows the substrate and 4 planes to better illustrate the effect of current leakage from one plane to another.

In accordance with the general principle described in connection with FIG. 5, when the resistive state of a memory element 200 in FIG. 7 is to be determined, a bias voltage is applied across the memory element and its element current $I_{ELEMENT}$ sensed. The memory element 200 resides on Plane 4 and is accessible by selecting the word line 210 (Sel-WLi) and the local bit line 220 (Sel-LBLj). For example, to apply the bias voltage, the selected word line 210 (Sel-WLi) is set to 0v and the corresponding selected local bit line 220 (Sel-LBLj) is set to a reference such as 0.5V via a turned on select gate 222 by a sense amplifier 240. With all other unselected word line in all planes also set to the reference 0.5V and all unselected local bit lines also set to the reference 0.5V, then the current sensed by the sense amplifier 240 will just be the $I_{ELEMENT}$ of the memory element 200.

The architecture shown in FIG. 1 and FIG. 7 has the unselected local bit lines (LBLj+1, LBLj+2, . . . ) and the selected local bit line (Sel-LBLj) all sharing the same global bit line 250 (GBLi) to the sense amplifier 240. During sensing of the memory element 200, the unselected local bit lines can only be isolated from the sense amplifier 240 by having their respective select gate such as gate 232 turned off. In this way, the unselected local bit lines are left floating and will couple to the reference 0.5V by virtue of adjacent nodes which are at 0.5V. However, the adjacent nodes are not exactly at the reference 0.5V. This is due to a finite resistance in each word line (perpendicular to the plane in FIG. 7) which results in a progressive voltage drop away from one end of the word line at which 0.5V is applied. This ultimately results in the floating, adjacent unselected local bit lines coupling to a voltage slightly different from the reference 0.5V. In this instance, there will be leakage currents between the selected and unselected local bit lines as illustrated by broken flow lines in FIG. 7. Then sensed current is then $I_{ELEMENT}$+leakage currents instead of just $I_{ELEMENT}$. This problem becomes worse will increasing word line's length and resistivity.

Single-Sided Word Line Architecture

Another 3D memory architecture includes memory elements arranged in a three-dimensional pattern defined by rectangular coordinates having x, y and z-directions and with a plurality of parallel planes stacked in the z-direction. The memory elements in each plane are accessed by a plurality of word lines and local bit lines in tandem with a plurality of global bit lines. The plurality of local bit lines are in the z-direction through the plurality of planes and arranged in a two dimensional rectangular array of rows in the x-direction and columns in the y-directions. The plurality of word lines in each plane are elongated in the x-direction and spaced apart in the y-direction between and separated from the plurality of local bit lines in the individual planes. A non-volatile, reprogramming memory element is located near a crossing between a word line and local bit line and accessible by the word line and bit line and wherein a group of memory elements are accessible in parallel by a common word line and a row of local bit lines. The 3D memory has a single-sided word line architecture with each word line exclusively connected to one row of memory elements. This is accomplished by providing one word line for each row of memory elements instead of sharing one word line between two rows of memory elements and linking the memory element across the array across the word lines. While the row of memory elements is also being accessed by a corresponding row of local bit lines, there is no extension of coupling for the row of local bit lines beyond the word line.

A double-sided word line architecture has been described earlier in that each word line is connected to two adjacent rows of memory elements associated with two corresponding rows of local bit lines, one adjacent row along one side of the word line and another adjacent row along the other side. For example, as shown in FIG. 1 and FIG. 3, the word line $WL_{12}$ is connected on one side to a first row (or page) of memory elements ($M_{114}$, $M_{124}$, $M_{134}$, . . . ) associated respectively with local bit lines ($LBL_{12}$, $LBL_{22}$, $LBL_{32}$, . . . ) and also connected on another side to a second row (or page) of memory elements ($M_{115}$, $M_{125}$, $M_{135}$, . . . ) associated respectively with local bit lines ($LBL_{13}$, $LBL_{23}$, $LBL_{33}$, . . . )

Figure 8:
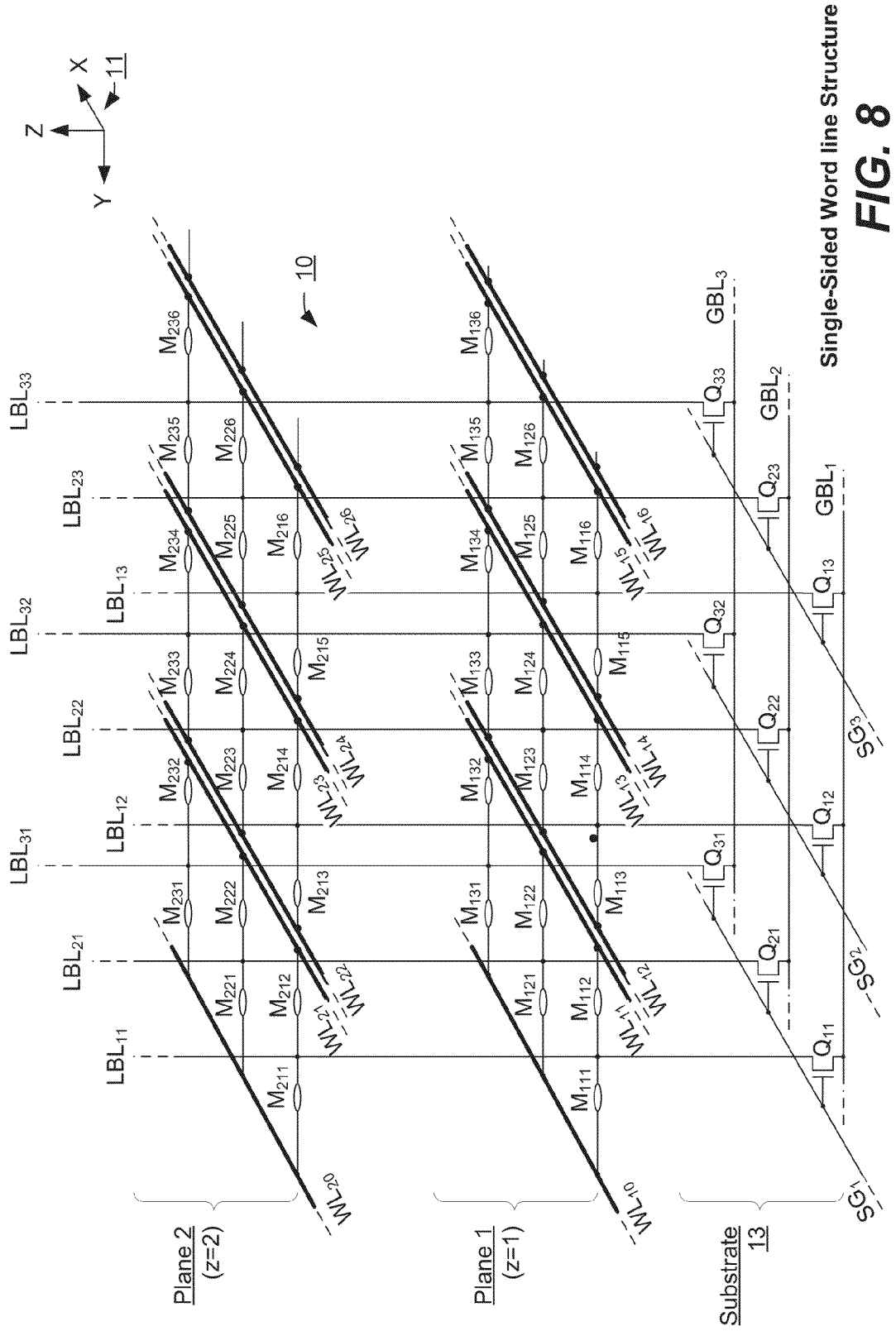
FIG. 8 illustrates schematically a single-sided word line architecture.

FIG. 8 illustrates schematically a single-sided word line architecture. Each word line is connected to an adjacent row of memory elements associate with one row of local bit lines on only one side.

The 3D memory array with the double-sided word line architecture illustrated in FIG. 1 can be modified to the single-sided word line architecture where each word line except ones at an edge of the array will be replaced by a pair of word lines. In this way, each word line is connecting exclusively to one row of memory elements. Thus, the word line $WL_{12}$ shown in FIG. 1 is now replaced in FIG. 8 by the pair of word lines $WL_{13}$ and $WL_{14}$. It will be seen that WL13 is connected to one row of memory elements ($M_{114}$, $M_{124}$, $M_{134}$, ...) and WL14 is connected to one row of memory elements ($M_{115}$, $M_{125}$, $M_{135}$, ...) As described before, a row of memory elements constitutes a page which is read or written to in parallel.

Figure 9:
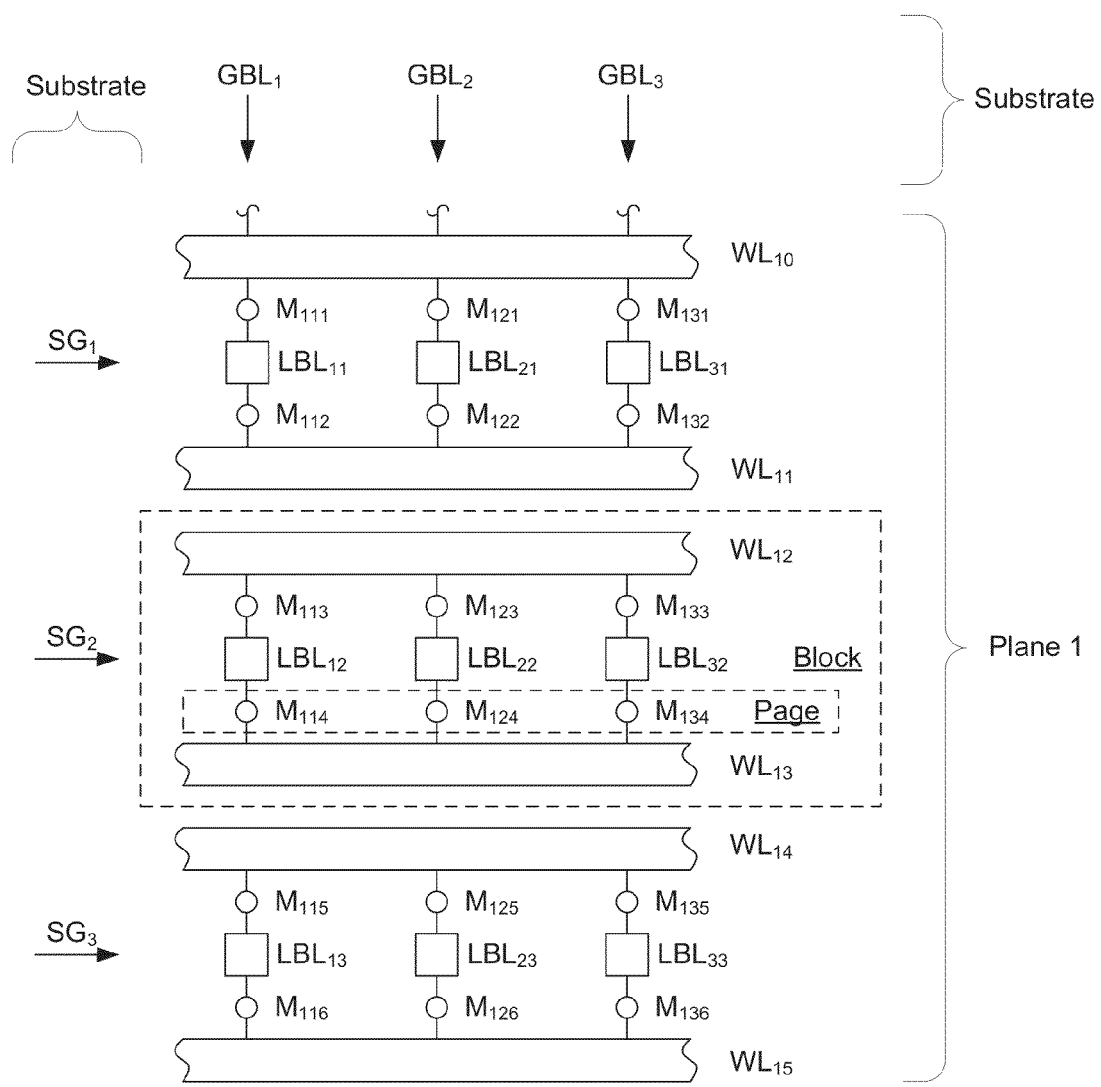
FIG. 9 illustrates one plane and substrate of the 3D array with the single-sided word line architecture.

FIG. 9 illustrates one plane and substrate of the 3D array with the single-sided word line architecture. Going from the double-sided word line architecture of FIG. 3, similarly, $WL_{12}$ in FIG. 3 would be replaced by the pair $WL_{13}$, $WL_{14}$ in FIG. 9, etc. In FIG. 3, a typical double-sided word line (e.g., $WL_{12}$) is connected to two rows of memory elements (on both side of the word line). In FIG. 9, each single-sided word line (e.g., $WL_{13}$) is connected to only one row of memory elements.

FIG. 9 also illustrates a minimum block of memory elements that is erasable as a unit to be defined by two row of memory elements ($M_{113}$, $M_{123}$, $M_{133}$, ...) and ($M_{114}$, $M_{124}$, $M_{134}$, ...) sharing the same row of local bit lines (e.g., $LBL_{12}$, $LBL_{22}$, $LBL_{32}$, ...)

Figure 10:
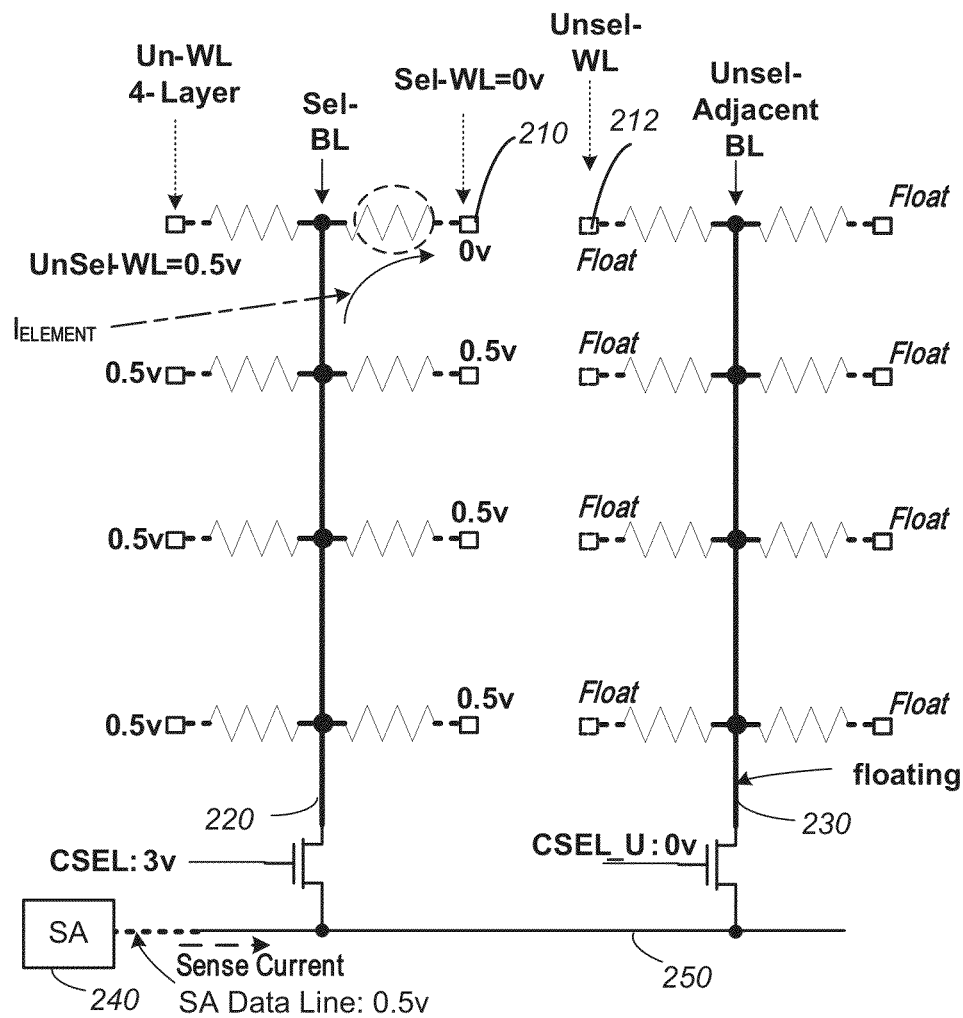
FIG. 10 illustrates the elimination of leakage currents in the single-sided word-line architecture 3-D array of FIG. 8 and FIG. 9.

FIG. 10 illustrates the elimination of leakage currents in the single-sided word-line architecture 3-D array of FIGS. 8 and 9. The analysis of leakage current is similar to that described with respect to FIG. 7. However, with the single-sided word-line architecture, the selected local bit line 220 (Sel-LBLj) is not coupled to an adjacent bit line 230 across the separated word lines 210 and 212. Thus there is no leakage current between adjacent local bit lines and the sense current in the sense amplifier 240 via the global bit line 250 and the local bit line 220 will be just that from the current of the memory element $I_{ELEMENT}$.

The single-sided word-line architecture doubles the number of word lines in the memory array compared to the architecture shown in FIG. 1. However, this disadvantage is offset by providing a memory array with less leakage currents among the memory elements.

The single-sided word-line architecture is disclosed in PCT International Publication No. WO 2010/117914 A1, and United States Patent Application Publication No. 20120147650, the entire disclosure of these are incorporated herein by reference.

Sensing Error Due to Local Bit Line Voltage Variations

As described in the embodiments of FIG. 1 and FIG. 8, a selected R/W element, M, is accessed by a pair of selected word line WL and local bit line LBL. In a read operation, the current through the R/W element is sensed by a sense amplifier via a global bit line GBL coupled to the selected local bit line LBL. The examples given in FIG. 7 and FIG. 10 has the R/W element, M, connected between a selected local bit line and a selected word line. The selected local bit line is set to 0.5V and the selected word line is set to 0V. All other word lines and local bit lines are preferable set to the same voltage as the selected local bit line to eliminate current leakage.

The voltage on a local bit line is sourced from a bit line driver associated with a sense amplifier, typically located on one end of a global bit line. The voltage established on a local bit line could be highly variable dependent on the position of the local bit line as well as the resistive state of the cell (R/W element) it is accessing.

The voltages of the individual local bit line are dependent on the positions of the respective local bit lines relative to the bit line driver. A local bit line LBL is relative short, as it only transverses the layers across the z-direction, so the voltage drop along it is insignificant. However, the global bit line is long in comparison, and due to the finite resistance of the global bit line, an IR voltage drop along it can cause the bit line driver to supply reduced voltage to the local bit line.

Figure 11A:
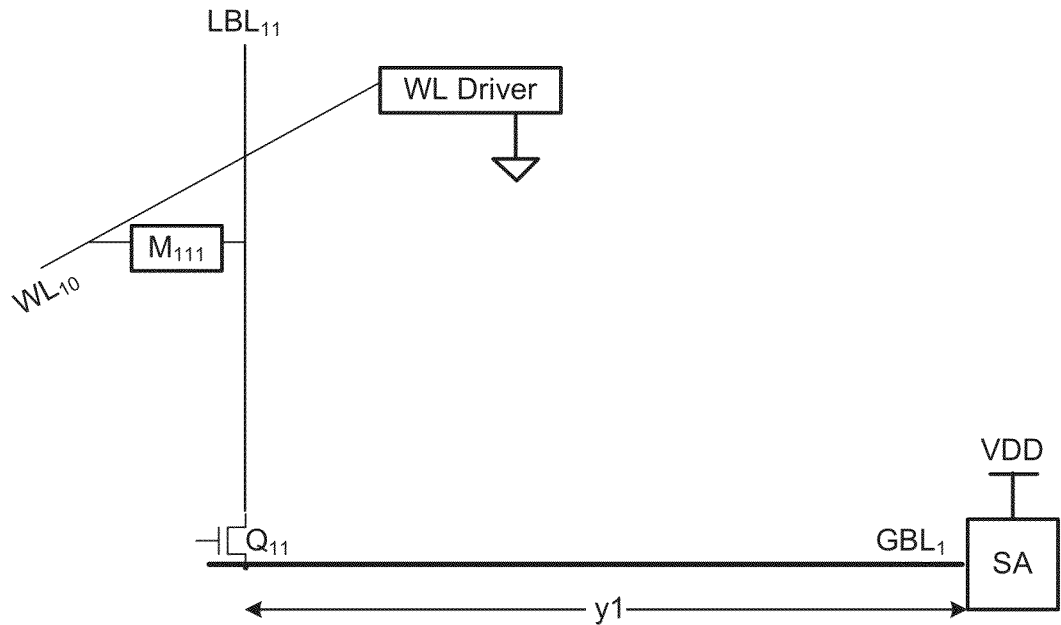
FIG. 11A illustrates the local bit line $LBL_{11}$ is coupled to the sense amplifier via a segment of global bit line $GBL_1$ having a length y1.
Figure 11B:
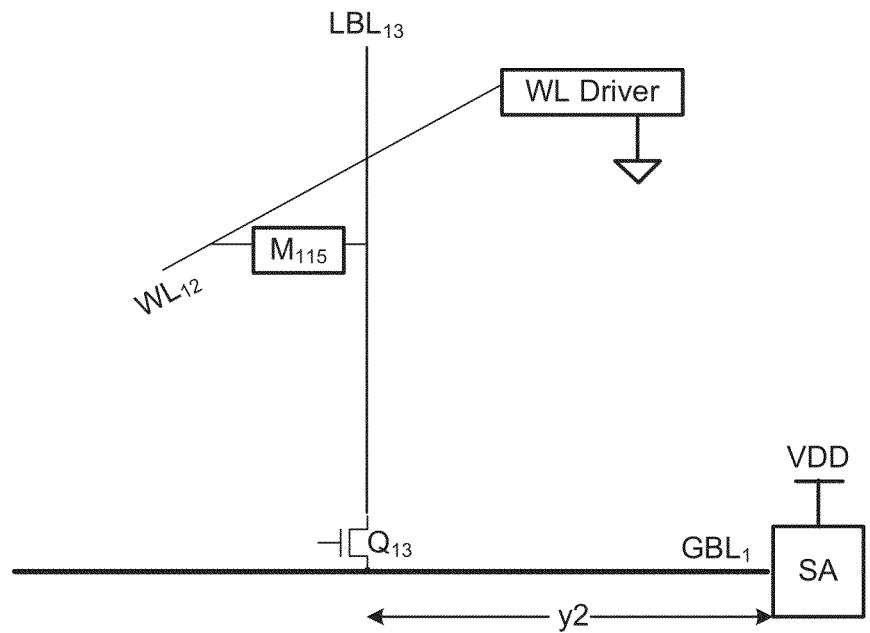
FIG. 11B illustrates the local bit line $LBL_{13}$ is coupled to the sense amplifier via a segment of global bit line $GBL_1$ having a length y2.

FIGS. 11A and 11B respectively illustrate the different path lengths of two local bit lines to their sense amplifiers. In FIG. 11A, the local bit line $LBL_{11}$ is coupled to the sense amplifier via a segment of global bit line $GBL_1$ having a length y1. Thus the IR drop in the path due to the segment is $IR_{GBL(y1)}$. In FIG. 11B, the local bit line $LBL_{13}$ is coupled to the sense amplifier via a segment of global bit line $GBL_1$ having a length y2. Thus the IR drop in the path due to the segment is $IR_{GBL(y2)}$.

The problem is further exacerbated if the bit line driver is sensitive to the serial resistance of the circuit path during sensing, as is the case with a source-follower configuration. The bit line voltage in this case depends upon the current flowing through the transistor of the source follower. Thus, the various bit lines could be driven to different voltages depending on the serial resistance in the respective circuit paths.

Figure 12:
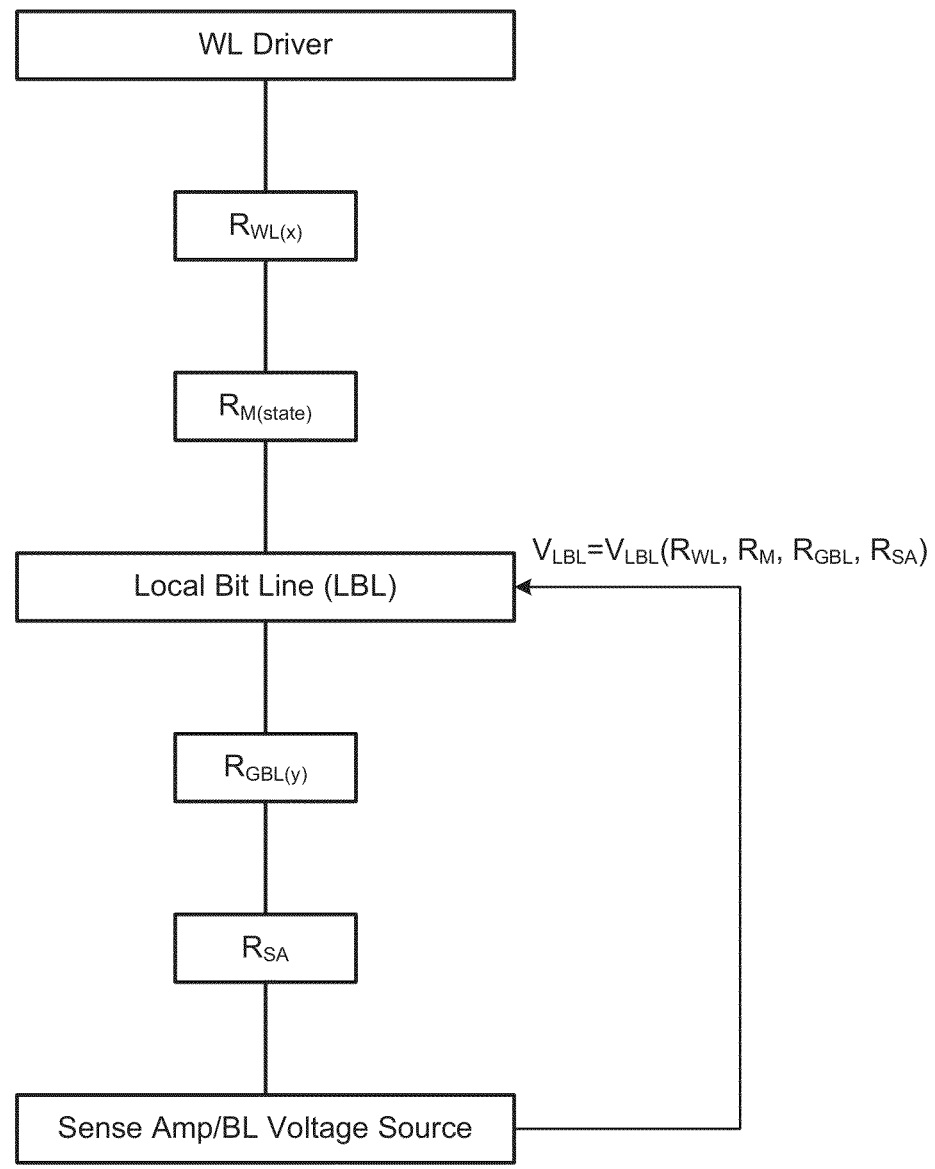
FIG. 12 illustrates the resistance along a circuit path of a selected cell M between a word line driver and a sense amplifier.

FIG. 12 illustrates the resistance along a circuit path of a selected cell M between a word line driver and a sense amplifier. The sense amplifier also acts as a bit line driver. The resistance includes the resistance of a segment of the selected word line ($R_{WL(x)}$), the resistance of the R/W element ($R_M$) which is state dependent, the resistance of the segment of the global bit line ($R_{GBL(y)}$) and the resistance of the sense amplifier ($R_{SA}$).

The cell's actual current value and cell's current reading by the sense amplifier are both affected by cell position, sense amplifier resistance, data pattern of neighboring cells and word line resistivity. In an ideal situation, if a cell is close to the sense amplifier, $R_{GBL(y=0)}=0$. If the sense amplifier is emulated by VDD, $R_{SA}=0$. If the word line is ideally conductive, $R_{WL(x)}=0$.

In general, these resistances all contribute to reducing the cell current. With the cell farther away from the sense amplifier and a real sense amplifier, and more conductive neighboring cells, alternative paths become more and more significant. Thus, the sense amplifier will read a cell current reduced from its actual one.

The non-constant voltages among the local bit lines will exacerbate current leakage in the network of the 3D array. For example, the adjacent unselected word lines are biased to the same voltage as the selected local bit line to avoid leakage and it will be uncertain if the local bit line voltage is variable.

Worst still during read, the non-uniform local bit line voltage will lead to loss of margin between the different resistive states of the R/W elements and cause memory states to be the overlapping and indistinguishable.

Bit Line Voltage Control

According to one aspect of the invention, the voltages of each local bit line is set to a precise value in spite of variable circuit path length and circuit serial resistance that can otherwise cause a bit line driver to drive a variable voltage on the local bit line. This is accomplished by a voltage clamp on each bit line. The voltage clamp is controlled by a feedback circuit comparing an actual voltage at the local bit line with a reference voltage. The actual voltage at the local bit line is detected via a segment of the global bit line in which no current flows.

Figure 13:
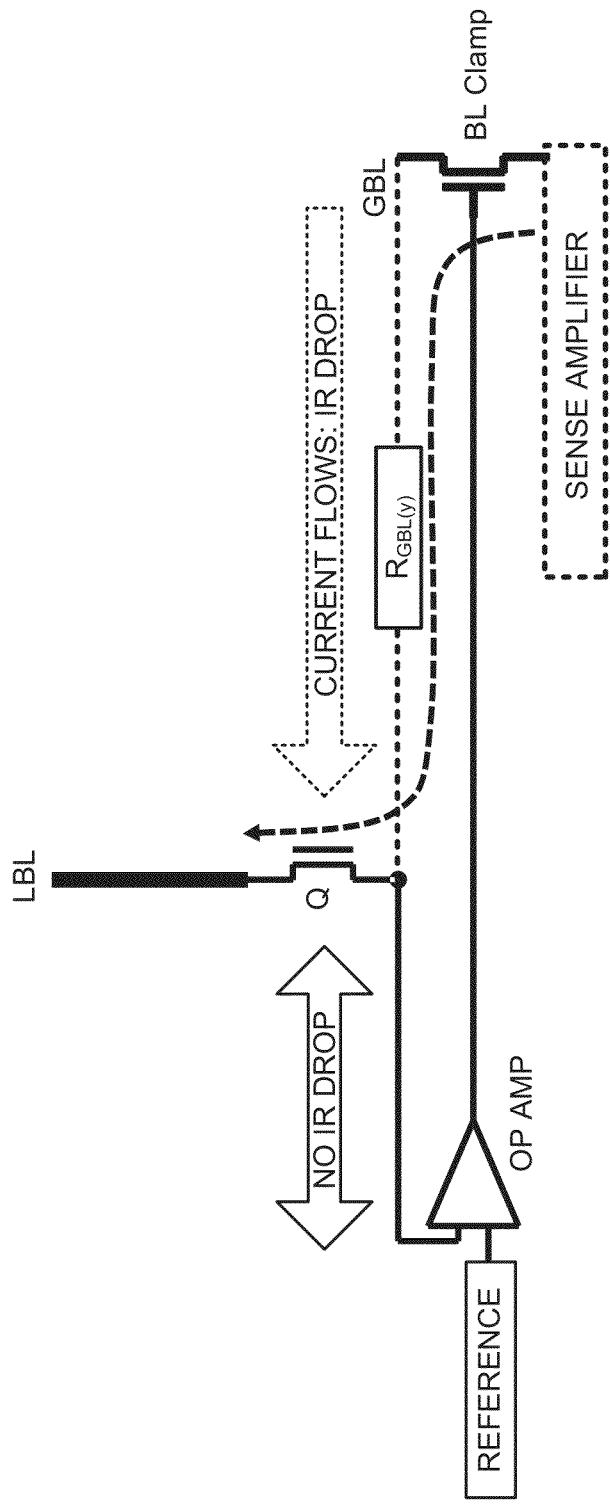
FIG. 13 illustrates a bit line control circuit that keeps the bit line voltage fixed to a reference voltage.

FIG. 13 illustrates a bit line control circuit that keeps the bit line voltage fixed to a reference voltage. A sense amplifier is connected to a first end of the global bit line GBL. The bit line LBL is coupled to the sense amplifier via a first segment of the GBL. The sense amplifier serves as a bit line driver to drive the local bit line to a given voltage as well as sensing a current in the local bit line. The remaining portion of the GBL forms the second segment of the GBL. A voltage clamp (BL Clamp) operates with a supply voltage from the sense amplifier to clamp the voltage at the LBL. The actual voltage at the LBL can be detected from a second end of the GBL via the second segment. Since no current flows in the second segment, there is no IR drop in the second segment. This actual voltage is compared to a reference voltage by a comparator such as an op amp. The output of the comparator feeds a control voltage to control the BL clamp. For example, the BL clamp can be implemented by a transistor with the output of the comparator supplied to the gate of the transistor. In order to maintain a local bit line voltage of $V_{LBL}$, the control voltage will be $V_{LBL}+V_T$, where $V_T$ is the threshold of the transistor. In this way, the voltage of the local bit line can be set to a predetermined value irrespective of the variable resistance $R_{GBL(y)}$ of the first segment of the global bit line GBL to the voltage supply.

One implementation of the bit line control circuit is to have the sense amplifiers located at the first end of the global bit line in the 3D array and the comparator located at the second end of the global bit line. A conducting line connects the output of the comparator to the voltage clamp across and under the 3D array. The bit line control circuit can be implemented as another layer below the 3D array.

When the voltages of the local bit lines in the 3D array are well controlled during read and programming, the problems of leakage and loss of margin mentioned above are reduced.

3D Array Architecture with Staircase Word Lines

According to another aspect of the invention, a nonvolatile memory is provided with a 3D array of read/write (R/W) memory elements accessible by an x-y-z framework of an array of local bit lines or bit line pillars in the z-direction and word lines in multiple memory layers in the x-y plane perpendicular to the z-direction. An x-array of global bit lines in the y-direction is switchably coupled to individual ones of the local bit line pillars along the y-direction.

Furthermore, the switchably coupling of a local bit line pillar to a corresponding global bit line is accomplished by a select transistor. The select transistor is a pillar select device that is formed as a vertical structure, switching between a local bit line pillar and a global bit line. The pillar select devices, are not formed within a CMOS layer, but are formed in a separate layer (pillar select layer) above the CMOS layer, along the z-direction between the array of global bit lines and the array of local bit lines.

Furthermore, each word line has multiple segments in a staircase structure traversing the multiple memory layers in which each segment of the word line lies in a layer and corresponds to a step in the staircase. Thus each word line has a segment in each memory layer and ultimately rises to the top of the 3D array as an exposed word line segment to be connected to a word line driver.

Figure 14:
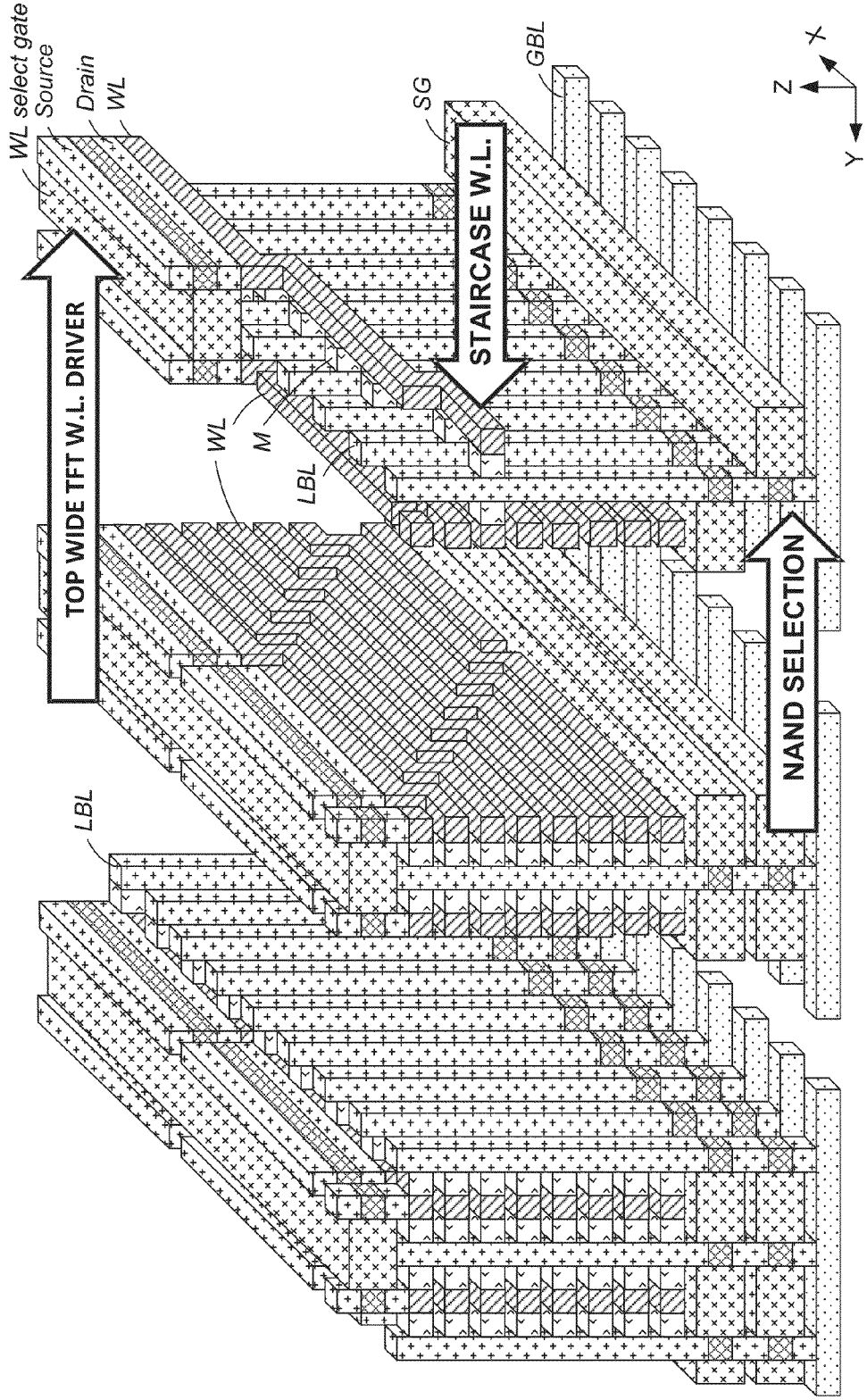
FIG. 14 is an isometric view of a portion of the 3D array with a structure having staircase word lines.

FIG. 14 is an isometric view of a portion of the 3D array with a structure having staircase word lines. The gross structure is a 3D array of memory cells M at crossings between a 2D array of local bit lines LBLs in the z-direction and segments of word lines WLs in each memory layer in the x-y plane. For ease of illustration, FIG. 14 shows each word line segment in a memory layer able to select 4 local bit lines. In practice, each word line segment can select other number of local bit lines in each memory layer. For example, if there are 8 memory layers, then, each word line has 8 segments. If each segment can select 16 bit lines in each memory layer, then each word line can select 16×8=128 local bit lines in parallel across all 8 memory layers. The top segment is also connected to a word line driver.

FIG. 15 illustrates a cross-section view of the 3D array along the y-direction according to an embodiment in which the word line step to the next memory layer is made in between the bit lines. In this example, each word line segment selects 8 local bit lines in each step or memory layer. There are 4 memory layers. Each step rises to the next layer in between a pair of adjacent local bit lines. Two adjacent staircase word lines on adjacent layers are staggered so that their risers are offset by the pitch of the local bit lines. The R/W element cross section, defined by the bit line and the word line, is constant.

FIG. 16 illustrates a cross-section view of the 3D array along the y-direction according to an embodiment in which the various staggered word line steps are stacked as close as possible. In this example, each word line segment selects 8 local bit lines in each step or memory layer. There are 4 memory layers. Each step rises to the next layer in between a pair of adjacent local bit lines. Two adjacent staircase word lines on adjacent layers are staggered so that their risers are offset by half the pitch of the local bit lines. The R/W element cross section differs. However, this configuration yields better array efficiency and has shorter word lines.

The advantage of the staircase word line architecture is that word lines from different memory layers can be accessed easily as each eventually can be accessed and selected from the top of the 3D array. In this way, interconnect and decoding are much simplified and there is no need to have multiple word lines connected in parallel to share limited resources. This will avoid the individual word line drivers having to drive a large load in the form of a large number of word lines in parallel and the ICC can be reduced. Within a given ICC budget, the performance is improved. Drivers implemented by devices with weaker drive power than CMOS devices may be used. Also, by avoiding multiple word lines connected in parallel, disturb is reduced.

Figure 17:
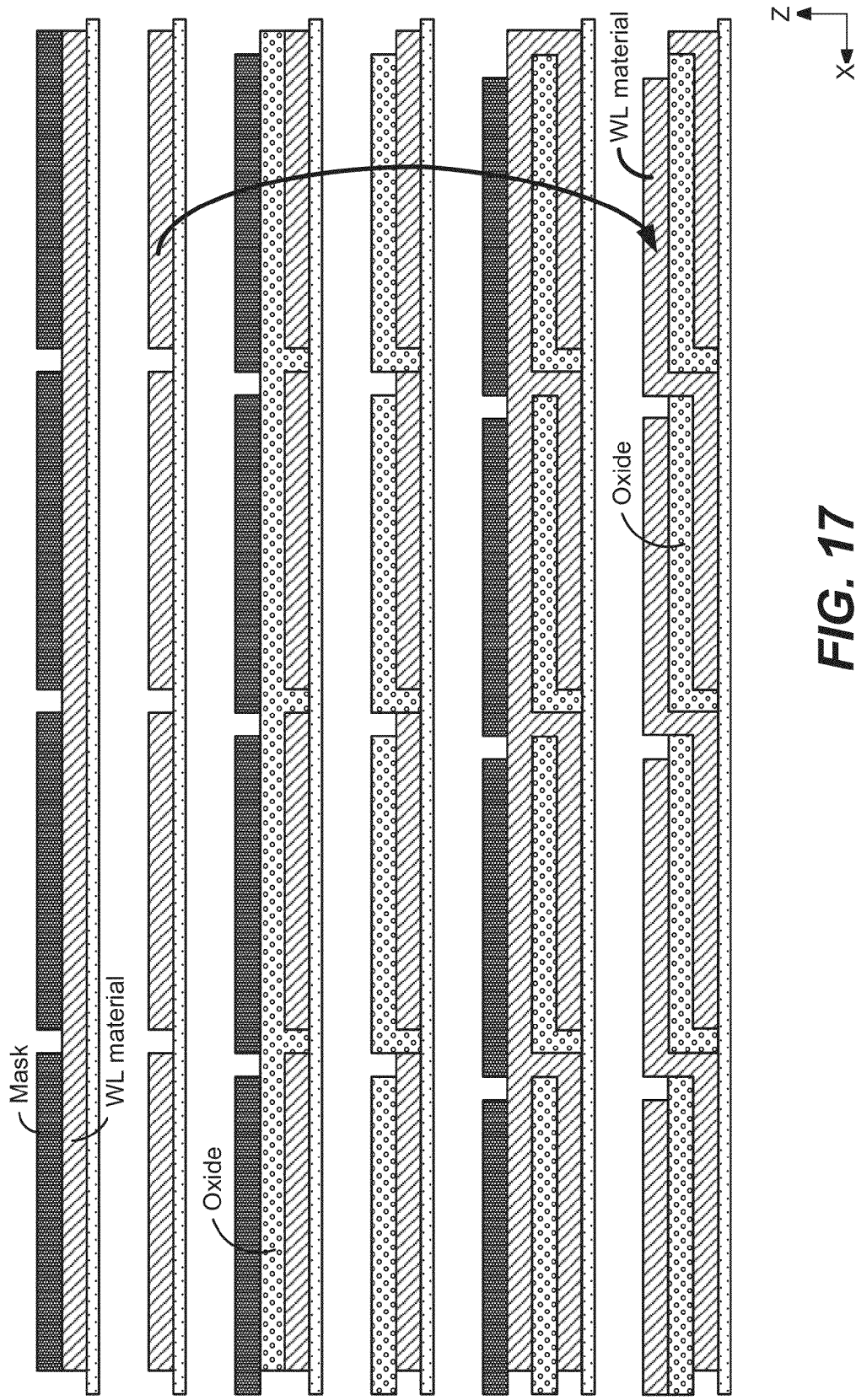
FIG. 17 illustrates from top to bottom a series of process steps to fabricate a 3D array with staircase word lines.

FIG. 17 illustrates from top to bottom a series of process steps to fabricate a 3D array with staircase word lines. In this example, each memory layer is formed by two mask applications.

1) A masking layer is laid over the word line layer to enable notches to be etched in the word line layer.

2) Notches are etched in the word line layer.

3) An oxide layer is deposited on top of the word line layer, followed by the same masking layer but offset by a notch to enable notches to be etched in the oxide layer. The current notches are aligned adjacent to the previous notches.

4) Notches are etched in the oxide layer.

5) A second word line layer is formed on top of the oxide layer and making connection with the lower word line layer through the notches in the oxide layer. This followed by the same masking layer but offset by a notch being laid over the second word line layer.

6) Notches are etched in the second word line layer. And so the process repeats itself as in 3) for the next layer.

3D Array Architecture with Word Line Drivers on Top

According to yet another aspect of the invention, the word line driver is implemented as a word line driver layer on the top end of the 3D array. This is accomplished by forming a TFT device in contact with a top segment of a staircase word line.

This is distinct from conventional implementation where the word line driver is formed as CMOS devices on the substrate layer and contact is made with a word line among the multiple memory layers by means of vertical interconnects such as zias.

Figure 18:
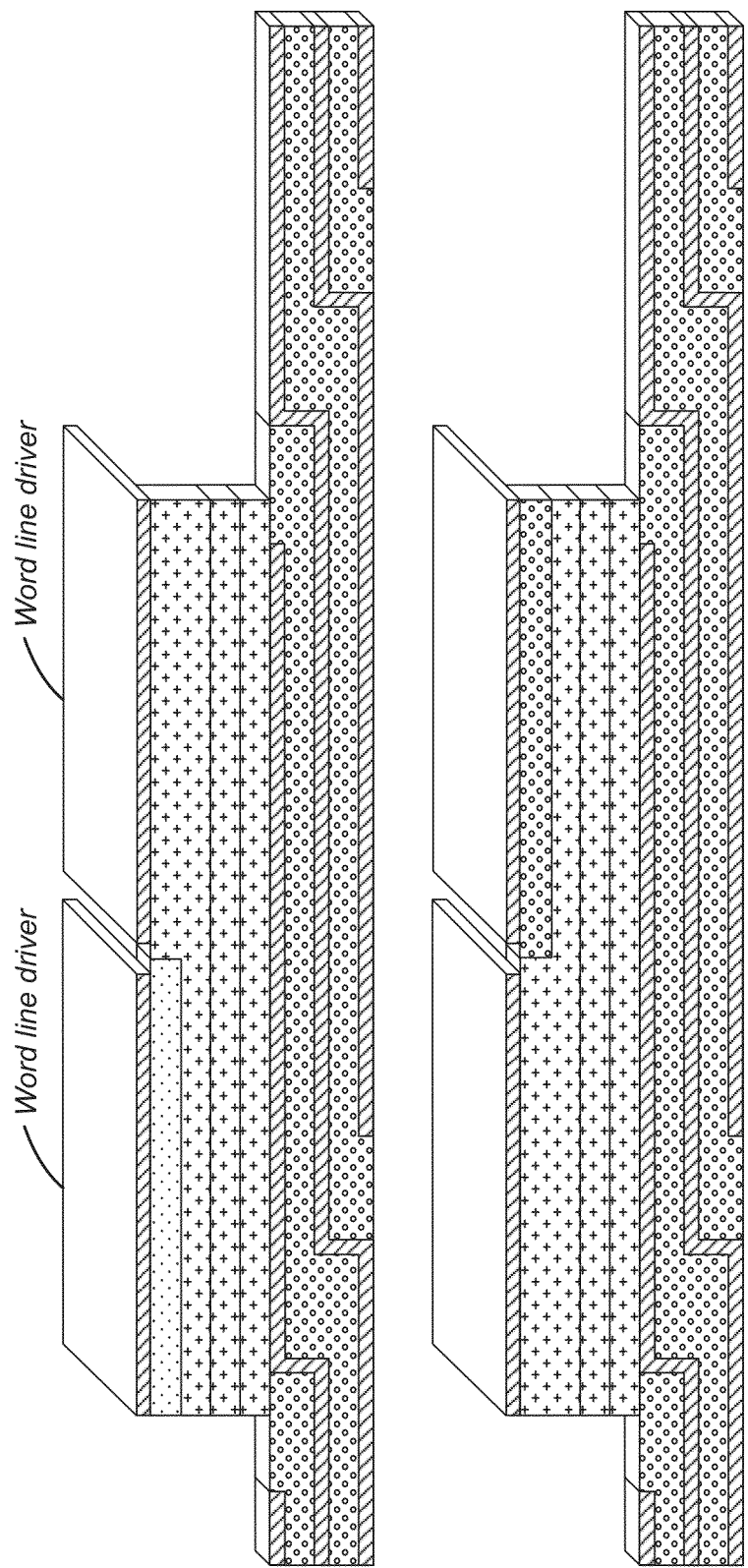
FIG. 18 illustrates a word line driver formed as a vertical structure on top of the 3D array of memory layers.

FIG. 18 illustrates a word line driver formed as a vertical structure on top of the 3D array of memory layers. The word line driver is preferably implemented by a TFT transistor similar to the pillar select device between the local bit line and the global bit line. The word line driver can then switch between an exposed word line segment and a word line power source (not shown). The word line driver can have a width as wide as the segment of a word line. FIG. 18 shows two adjacent word line drivers, respectively switching two adjacent segments from two word lines.

The staircase word line architecture enables each word line to be access from either top or bottom of the 3D memory array. Since the CMOS layer at the bottom is already crowded with metal lines and other active devices such as sense amplifiers and op amps, it is advantageous to locate the word line drivers to the top of the 3D memory array. Even though TFT transistors are not as powerful as CMOS devices, it is possible to use them to drive the staircase word lines because 1) the individual word lines are now easy to drive as explained earlier and 2) the driver can be as wide as the segment of a word line.

Efficient 3D Array Architecture with Staircase Word Lines

The embodiments of 3D arrays with staircase word lines shown in FIG. 15 and FIG. 16 each has L memory layers with each word line traversing the layers in the form of a staircase. At each layer, a step of the staircase crosses a segment of R local bit lines. Then the word line rises via a riser to the next layer to cross another segment therein. Thus, the array, as seen in the x-z plane, comprises a bank of local bit lines. The bit lines are oriented in the z-axis direction across all memory layers and the bank is extended in the x-axis direction. Each flight of staircase word line traverses the memory layers in the bank from a bottom edge to a top edge. In the x-z plane, the bank is superimposed with multiple flights of staircase word line closely stacked in the x-axis direction, so that each memory layer is accessible by a segment from a different flight of staircase word line.

Since the segments in each memory layer are all aligned along the same horizontal baseline, they cannot be so tightly stacked in the x-axis direction so as to prevent shorting among them. The embodiment shown in FIG. 15 has an offset of the pitch of a bit line between two segments. The embodiment shown in FIG. 16 has an offset of half the pitch of a bit line between two segments.

In general, if there are L layers, ideally each local bit line that runs across all L layers should have an independent word line crossing at each layer. However, it can be seen that in both the embodiment of FIG. 15 and the embodiment of FIG. 16, not all the bit lines are crossed by a word line at every layer. These result from the finite offsets in these embodiment and lead to inefficient utilization of space and resources. For example in FIG. 15, at the top layer, there is one bit line not crossed by a word line for every R+1 bit lines. In this case, where R=8, it can be seen that for every 9 local bit lines, there is an idle one on the top memory layer. Similarly, the same is true for the bottom memory layer. For a total of 4 layers, and with a waste of 1 in 9 per top or bottom layer, this amounts to a loss in density of 2/(9×2), or a total of 11%. If the number of layers is increased the loss in density is reduced. However, this will require more layers and also longer word lines, which could lead to drawing excessive currents.

An efficient 3D array architecture with staircase word lines is implemented with no offset between segments along each memory layer. Essentially this is accomplished by raising an end portion of each segment away from the horizontal baseline. In this way, there will be room along the horizontal baseline at the end of the segment for the next segment to be placed there.

Figure 19:
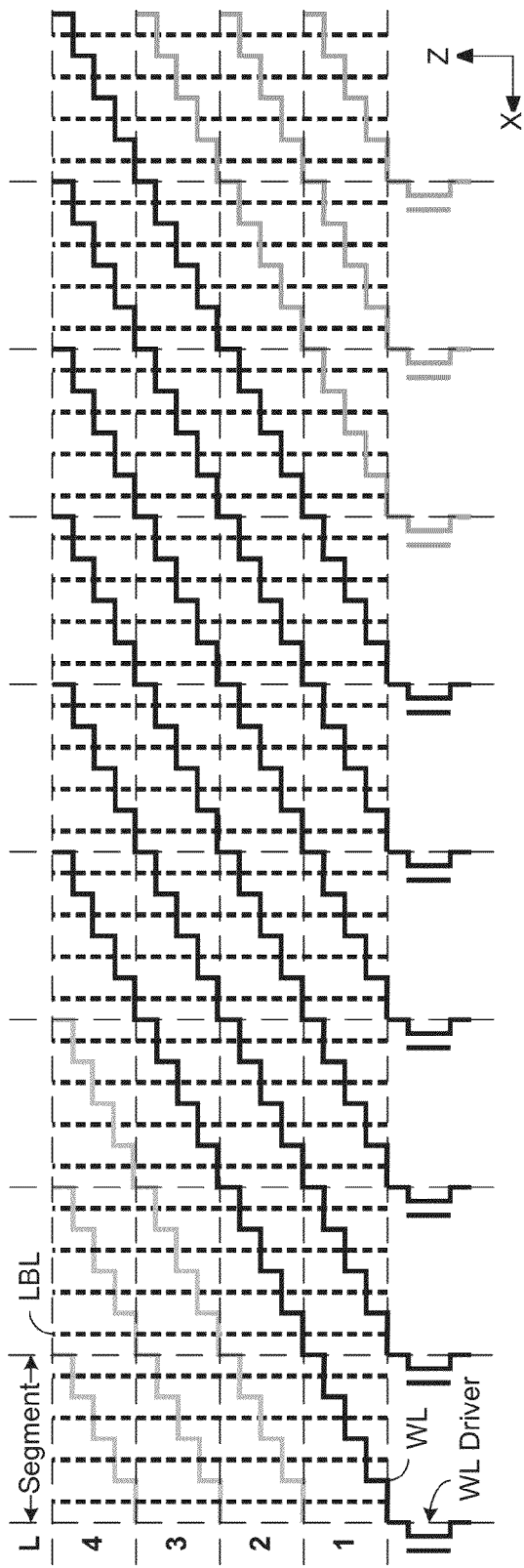
FIG. 19 is a schematic illustration of a cross-section view of the efficient 3D array projected on the x-z plane.

FIG. 19 is a schematic illustration of a cross-section view of the efficient 3D array projected on the x-z plane. An example in this embodiment has the number of memory layers to be L=4 and the number of local bit lines LBL crossed by a segment of a word line in each memory layer to be R=4. At each memory layer, instead of having each word line WL segment crossing horizontally the R=4 local bit lines, it is made to ramp up as it crosses the 4 local bit lines so that the crossing with the next bit line is higher in the z-axis direction compared to that of the current bit line. In this embodiment, the ramping up is uniform across the bit lines. In the example shown where R=4, the ramp up of the segment consists of stepping up after crossing each of the four local bit lines in the segment. In this way, for each memory layer, towards the end of each segment, the bulk of the segment will be raised away from the horizontal baseline. This allows room for the next segment to follow immediately along the horizontal baseline.

In this example, essentially each word line has 4 ramping segments, one for each memory layer, and each segment crosses 4 local bit lines. Thus, each word line crosses 16 local bit lines across the 4 memory layers. It is possible to have different word line lengths. For example, a shortest ramping word line segment can be crossing just 2 local bit lines per memory layer (i.e., R=2). In that case, the pitch of the word line drivers will be 2 local bit lines. For a memory with 4 layers (i.e., L=4), each word line will cross R×L=2×4=8 local bit lines.

In another embodiment, the word line segment in a layer crosses the local bit lines horizontally similar to that shown in FIG. 15 and FIG. 16 but rises up to cross the last one or two bit lines near the end of the segment.

The efficient 3D array architecture avoids the wastage associated with the embodiments shown in FIG. 15 and FIG. 16. As can be seen from FIG. 19, the bank of local bit lines are essentially traversed by uniform flights of staircase word line, except for the ones (shown in grey-out shade) near the left and right edges of the bank. These edge exceptions can be ignored or not formed at all. Even though a small number of local bit lines are depicted in the bank shown in FIG. 19 for ease of illustration, in practice there are many more local bit lines. Given the vast majority of regular bit lines in the core of the bank, the wastage due to the edge is diminishing.

Figure 20:
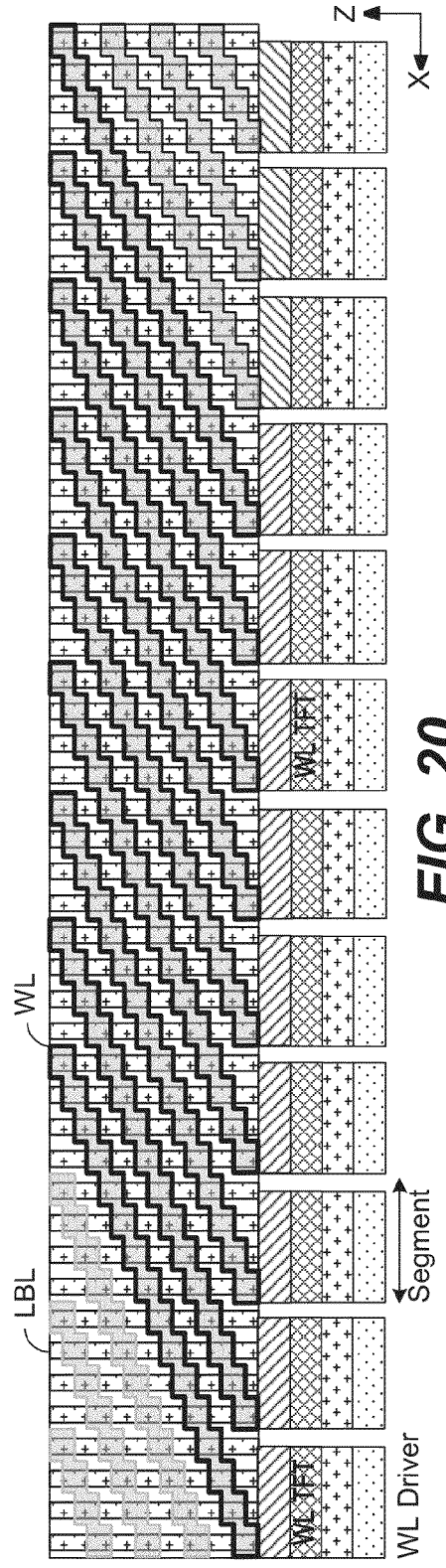
FIG. 20 illustrates the device structure of the efficient 3D array shown schematically in FIG. 19.

FIG. 20 illustrate the device structure of the efficient 3D array shown schematically in FIG. 19. In one embodiment, the local bit lines and word lines are formed from doped polysilicon.

Figure 21:
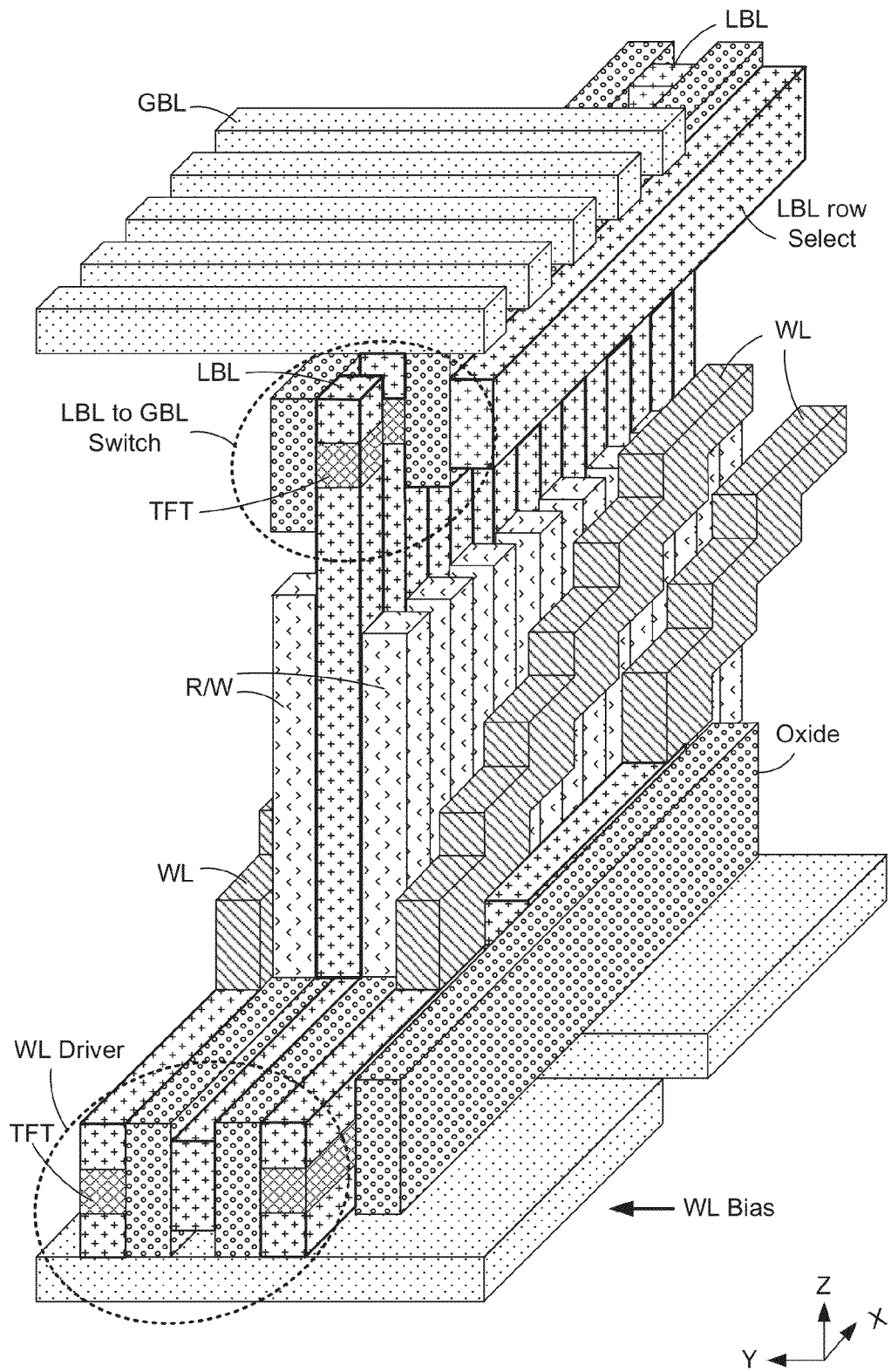
FIG. 21 is an isometric view of a portion of the efficient 3D array shown in FIG. 19.

FIG. 21 is an isometric view of a portion of the efficient 3D array shown in FIG. 19. The gross structure is a 3D array of memory cells (R/W material) at crossings between a 2D array of local bit lines LBLs in the z-direction and segments of word lines WLs in each memory layer in the x-y plane. For ease of illustration, FIG. 19 shows one bank of LBLs in one memory layer and crossed by one staircase word line segment. The WL segment, which itself is of staircase form is able to select 6 local bit lines. In this embodiment, the word line driver is located at the bottom of the 3D array on the substrate (not shown) side. This allows an alternative architecture of the global bit lines being positioned on the top of the 3D array with corresponding switches to access the local bit lines.

FIG. 22A-FIG. 22H illustrate a series of process steps to fabricate from the efficient 3D array shown in FIG. 19.

Figure 22:
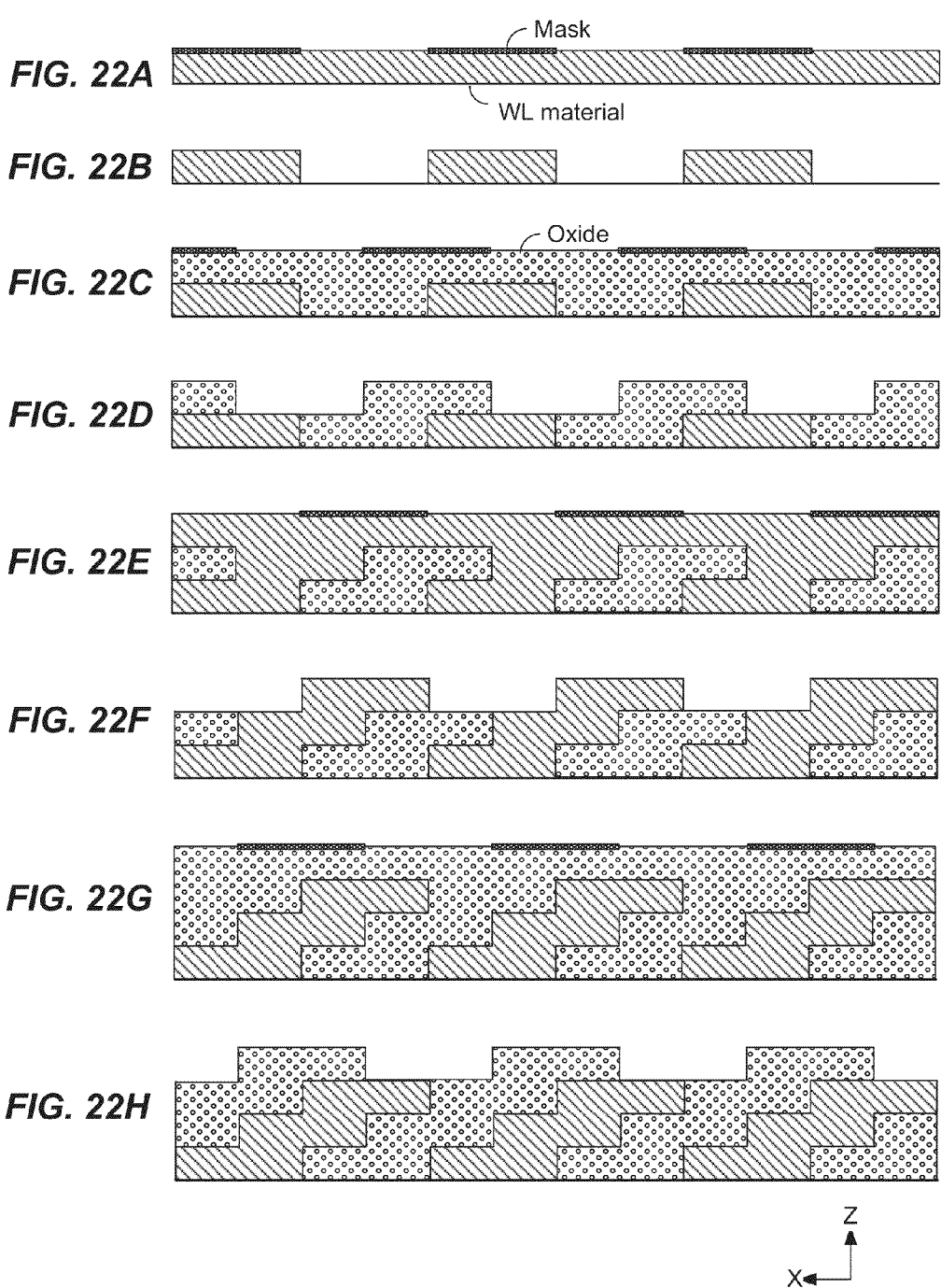
FIG. 22A illustrates one of a series of process steps to fabricate the efficient 3D array shown in FIG. 19, including where a masking layer is laid over the word line layer to enable trenches to be etched in the word line layer.
FIG. 22B illustrates one of a series of process steps to fabricate the efficient 3D array shown in FIG. 19, including where trenches are etched in the word line layer.
FIG. 22C illustrates a series of process steps to fabricate the efficient 3D array shown in FIG. 19, including where an oxide layer is deposited on top of the word line layer, followed by a masking layer.
FIG. 22D illustrates a series of process steps to fabricate the efficient 3D array shown in FIG. 19, including where trenches are etched in the oxide layer.
FIG. 22E illustrates a series of process steps to fabricate the efficient 3D array shown in FIG. 19, including where a second word line layer is formed on top of the oxide layer and making connection with the lower word line layer through the trenches in the oxide layer.
FIG. 22F illustrates a series of process steps to fabricate the efficient 3D array shown in FIG. 19, including where trenches are etched in the second word line layer.
FIG. 22G illustrates a series of process steps to fabricate the efficient 3D array shown in FIG. 19, including where the process repeats itself as in that shown in FIG. 22C for the next layer of oxide and masking layer to build up the staircase structure of the word line.
FIG. 22H illustrates a series of process steps to fabricate the efficient 3D array shown in FIG. 19, including where the process repeats itself as in that shown in FIG. 22D where trenches are etched in the oxide layer in order to build up progressively the staircase structure of the word line.

In FIG. 22A, a masking layer is laid over the word line layer to enable notches to be etched in the word line layer.

In FIG. 22B, notches are etched in the word line layer.

In FIG. 22C, an oxide layer is deposited on top of the word line layer, followed by the same masking layer but offset by half a notch length to the left to enable notches to be etched in the oxide layer. The current notches are offset to the previous notches by half a notch length each.

In FIG. 22D, notches are etched in the oxide layer.

In FIG. 22E, a second word line layer is formed on top of the oxide layer and making connection with the lower word line layer through the notches in the oxide layer. This is followed by the same masking layer but offset by yet another half a notch length to the left over the second word line layer.

In FIG. 22F, Notches are etched in the second word line layer.

In FIG. 22G, the process repeats itself as in that shown in FIG. 22C for the next layer of oxide and masking layer to build up the staircase structure of the word line.

In FIG. 22H, the process repeats itself as in that shown in FIG. 22D where notches are etched in the oxide layer in order to build up progressively the staircase structure of the word line.

Figure 23:
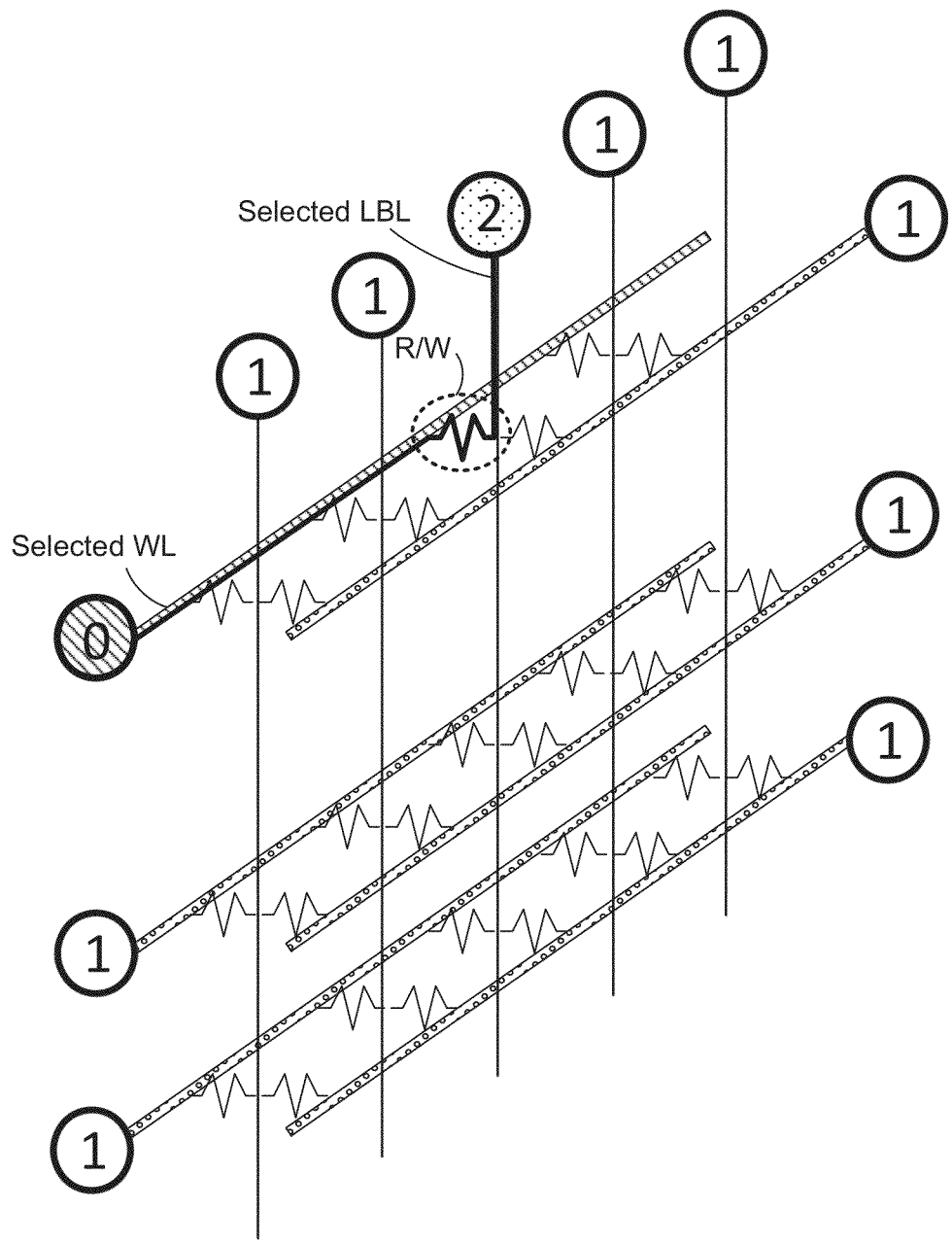
FIG. 23 illustrates the biasing condition for setting or resetting a R/W element.

FIG. 23 illustrate the biasing condition for setting or resetting a R/W element. For simplicity of illustration, the biasing voltages are 0V (no bias), 1V (half bias) and 2V (full bias). An R/W element is selected for setting or resetting when it is exposed to the full bias voltage of 2V. This is arranged with the selected local bit line LBL set to full bias of 2V and the selected word line WL set to no bias of 0V in order to develop maximum potential difference across the selected R/W element. To prevent the other R/W elements from changing state, all other unselected WLs and LBLs are set to half bias of 1V so that each will see a maximum of 1V potential difference. It will be seen that the unselected bit lines and word lines are still drawing current at half bias. As explained above, a short word line is preferable as it will allow ICC current consumption to be under control.

High Capacity Local Bit Line Switches

As shown earlier (e.g., in FIG. 21), the each bank of local bit lines LBL are selectively switched to a set of global bit lines by a corresponding set of (pillar) switches. One end of each local bit line along the z-axis direction is switchably connected to a global bit line along the y-axis direction.

Figure 24:
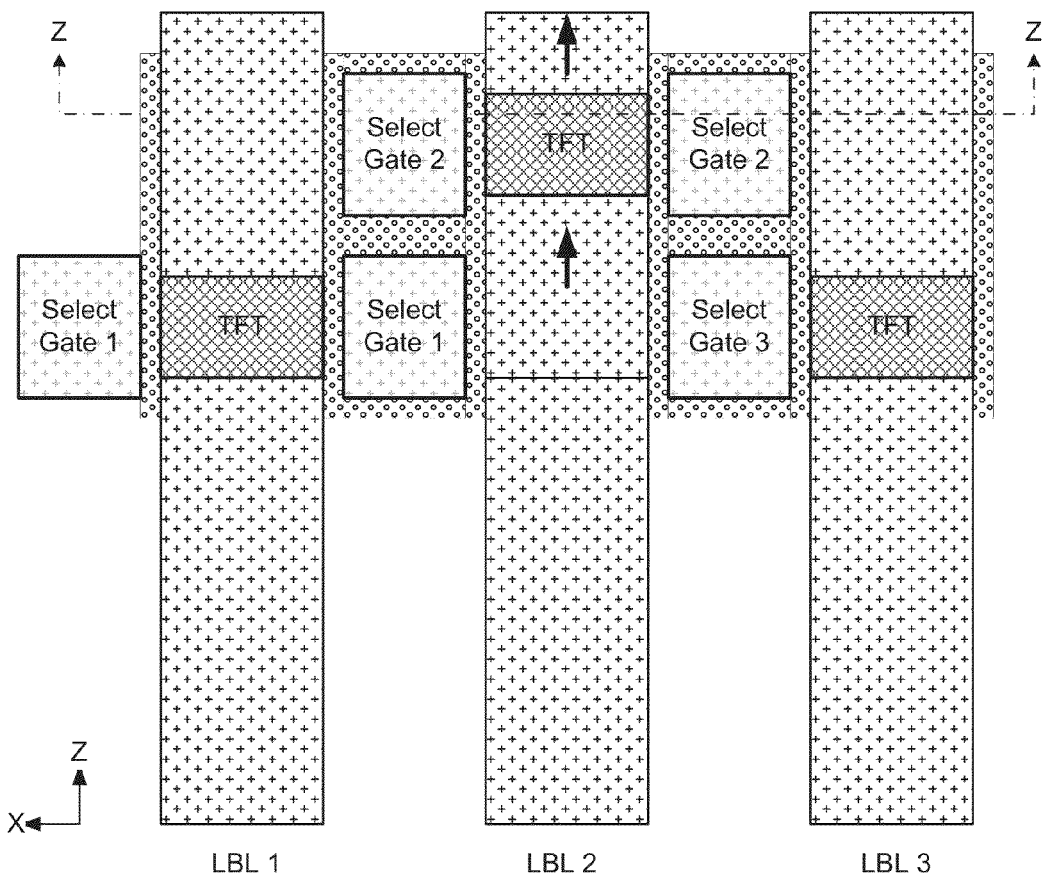
FIG. 24 illustrates an architecture for high capacity local bit line switches.

FIG. 24 illustrates an architecture for high capacity local bit line switches. Essentially, the switch is a TFT transistor formed vertically adjacent to a local bit line in the 3D array built on top of the CMOS substrate. An issue is that TFT transistors are relatively not as powerful as CMOS transistors and therefore their current capacity must be maximized by maximizing their size and surface area. Since there is a TFT transistor for each local bit line, it is preferably formed in-line at one end of the local bit line. Along the z-axis direction, on either side of the TFT are portion of the local bit line. If the local bit lines are formed from N-doped polysilicon, then the TFT material is P-doped polysilicon. A thin gate oxide separates the TFT from a select gate. In this way a NPN transistor is formed. Since the gate oxide and the gate have to be formed between two local bit lines, the gates are limited in size so that each switches one bit line and not the adjacent bit line. In the preferred embodiment, the TFT transistors of adjacent bit lines are not aligned horizontally, rather they are staggered as shown in FIG. 24. In this way, the space adjacent each TFT can be used exclusively to form the gate for that TFT, thereby maximizing the size of the gate.

In a preferred embodiment, the efficacy of the TFT transistor can be further enhanced when the gate is formed by wrapping around the TFT transistor, thereby increasing the surface area of the gate to the TFT.

Figure 25:
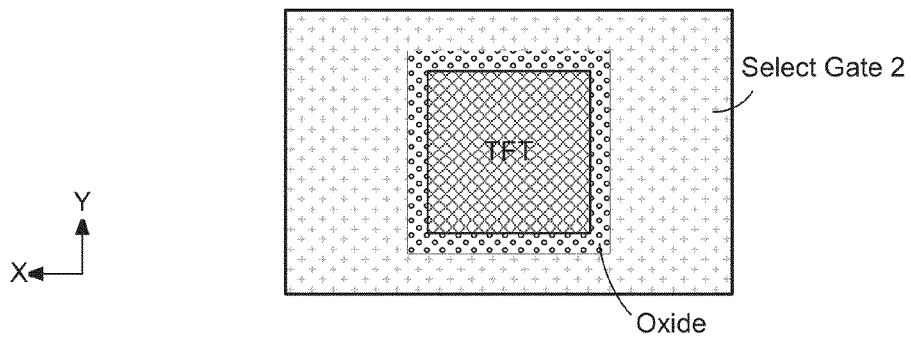
FIG. 25 illustrates a cross sectional view of the switch shown in FIG. 24A along the line z-z.

FIG. 25 illustrates a cross sectional view of the switch shown in FIG. 24 along the line z-z. The select gate 2 wraps around the TFT and the channel width of the TFT is effective quadrupled, with conduction on all four sides.

Method for Forming a Surround Gate of Vertical Switch in a 3D Memory

The vertical switches such as (LBL to GBL switches) as well as the word line drivers shown in FIG. 21 are preferably implemented by a bank of vertically aligned (z-axis) TFTs, each controlled by a surround gate. For example, as shown in FIG. 21, the surround gates for the LBL to GBL switches form a LBL row select line along the x-axis which selects a row of LBLs.

Figure 26:
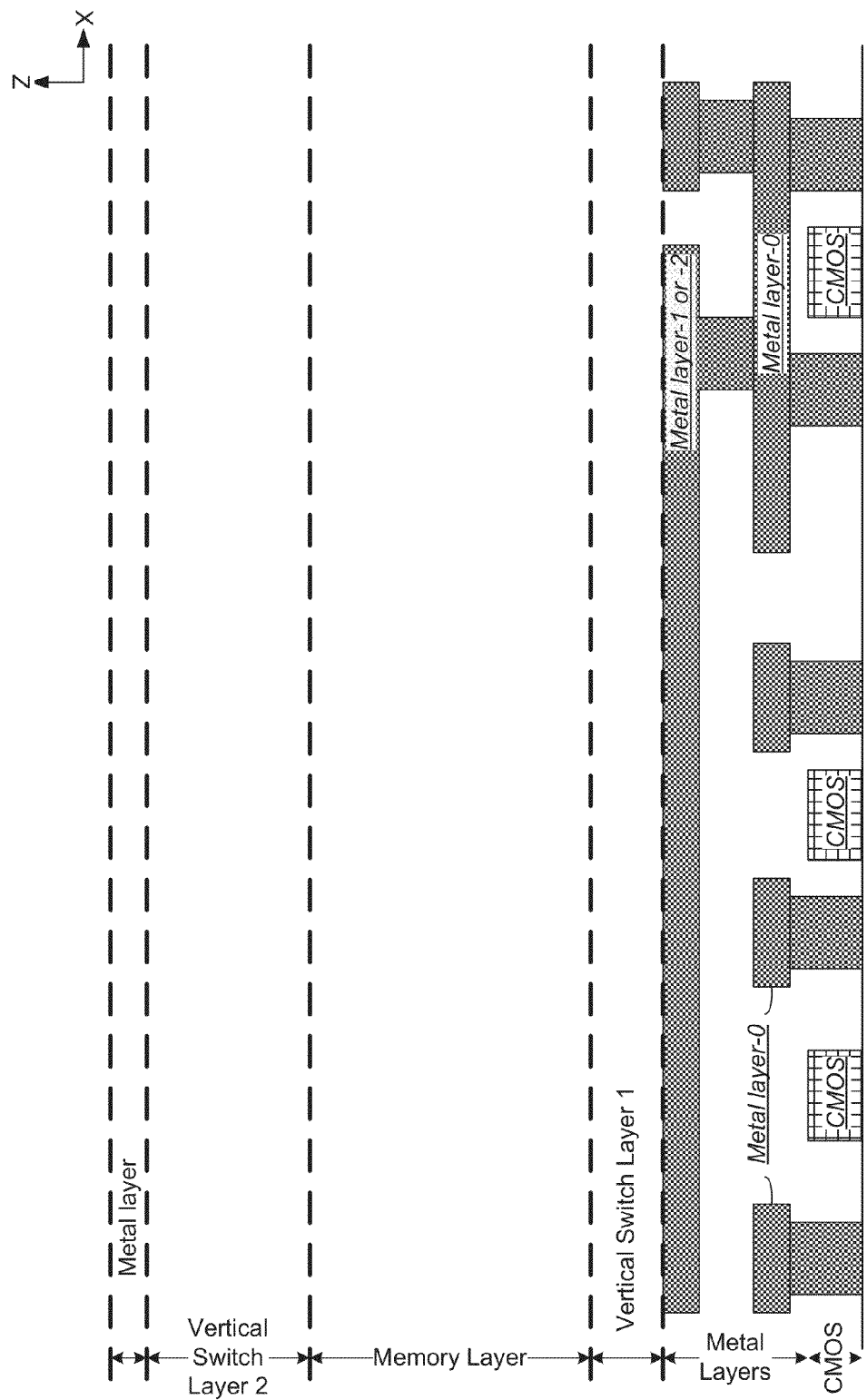
FIG. 26 illustrates the vertical select device in the overall scheme of an exemplary 3D memory device in a cross-sectional view from the y-direction along the global bit lines and perpendicular to the word lines.

FIG. 26 illustrates the vertical select device in the overall scheme of an exemplary 3D memory device in a cross-sectional view from the y-direction along the global bit lines and perpendicular to the word lines. Essentially, the 3D memory device comprises five gross layers: a CMOS and metal layer; a vertical switch layer 1; a memory layer; a vertical switch layer 2 and a top metal layer. The 3D memory elements are fabricated in a memory layer on top of the CMOS and metal layer. In the CMOS and metal layer, the CMOS provides a substrate for forming CMOS devices and for supporting the other gross layers on top of it. On top of the CMOS there may be several metal layers, such as metal layer-0, metal layer-1 and metal layer-2. The vertical select layer 1 and layer 2 contain similar vertical select switches in the form of thin-film transistors (TFTs) which provide selective access to the word lines WLs and local bit lines LBLs in the memory layer.

In one 3D architecture shown in FIG. 8, the global bit lines GBLs are at the bottom of the memory layer and therefore are formed as one of these metal layers, such as metal layer-1 or metal layer-2. The vertical switch layer 1 then contains the LBL to GBL switches connecting the GBLs to the vertical local bit lines in the memory layer. Access to the word line are via the top metal layer from the top side the memory layer and therefore the word line drivers are implemented in the vertical switch layer 2 connecting each word line to a metal pad at top metal layer.

In another 3D architecture shown in FIG. 21, the top and bottom access to the word lines WLs and global bit lines GBLs are reversed. In particular, the GBLs are formed as a top metal layer above of the memory layer.

According to another aspect of the invention, in a 3D memory device with structures arranged in a three-dimensional pattern defined by rectangular coordinates having x, y and z-directions and with a plurality of parallel x-y planes stacked in the vertical z-direction over a semiconductor substrate, and including a memory layer, a method of forming a vertical switching layer which provides access to the memory layer comprises forming a 2-D array of TFT channels of vertical thin-film transistors (TFTs) to provide switching access to structures in the memory layer, forming a gate oxide layer wrapping around each TFT channel in the x-y plane, forming a gate material layer over of the gate oxide layer, wherein the TFT channels in the 2-D array have a separation of lengths Lx and Ly along the x- and y-axis respectively and such that said gate material layer has a thickness that merges to form a row select line along the x-axis while maintaining a separation of length Ls between individual row select lines.

Figure 27:
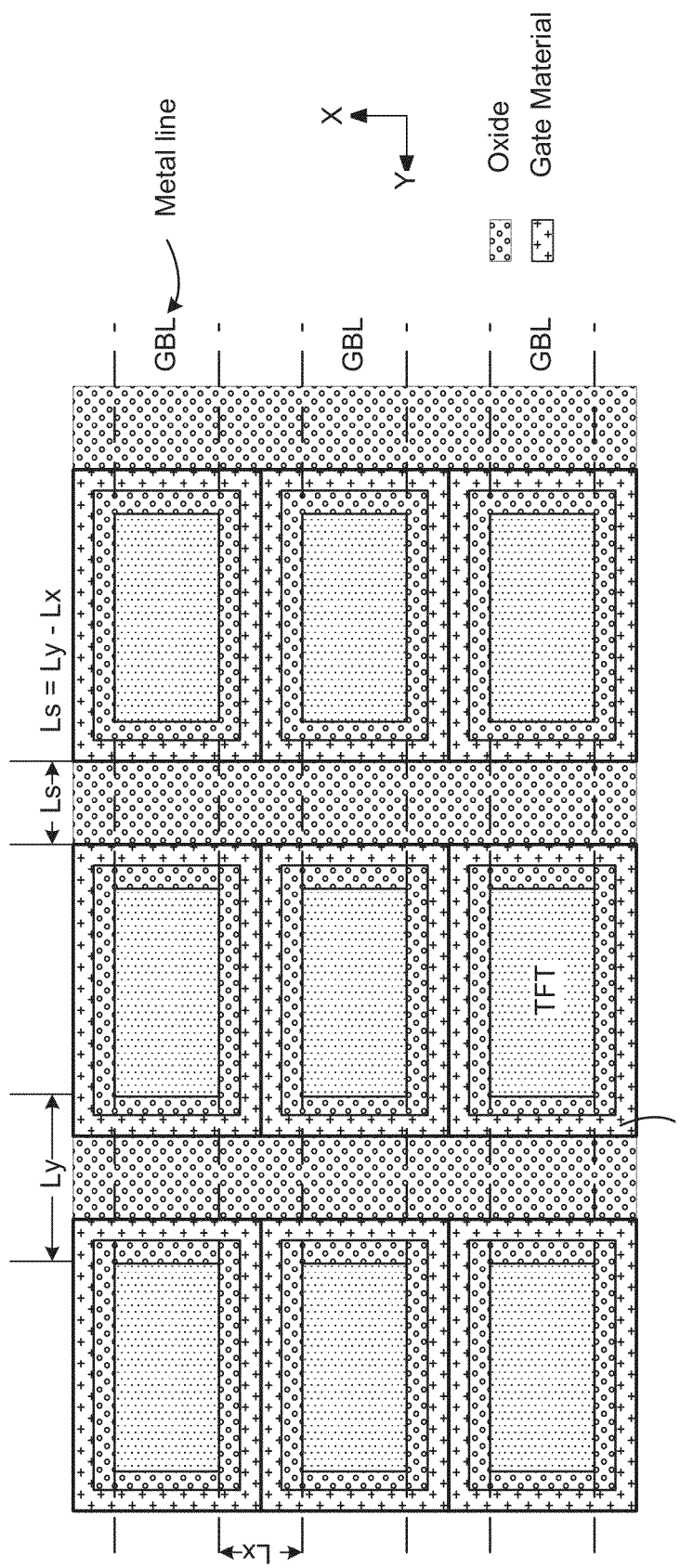
FIG. 27 is a schematic view in the x-y plane of a cross-section of the vertical switches in the select layer 2 for the 3D architecture shown in FIG. 21.

FIG. 27 is a schematic view in the x-y plane of a cross-section of the vertical switches in the select layer 2 for the 3D architecture shown in FIG. 21. As described earlier, each TFT channel is controlled by a surround gate to provide maximum switching or driving capacity. In this case, the surround gates for a row of TFT channels along the x-axis are merged together to form a row select line while individual row select lines are isolated from each other across the y-axis. Each TFT switches between a vertical bit line LBL and a global bit line GBL. The row select line controls the switching of a row of vertical bit lines along the x-axis.

In one example, Lx=24 nm and Ly=48 nm instead of a conventional example of 24 nm×24 nm. The surrounding gate can deliver 3 times the drive current compared to a conventional single-side gate. The required TFT's Ids is reduced from 256 uA/um to 85 uA/um.

FIG. 28 to FIG. 35 illustrate the processes of forming of the vertical switch layer 2. Essentially, a slab of channel material is formed on top of the memory layer. Then the slab is etched to leave a 2D array of individual channel pillars. The separations between channel pillars have a predetermined aspect ratio given by Lx along the x-axis and Ly along the y-axis and where Ly−Lx=Ls. Then gate oxide layer and gate material layer are deposited to form the individual TFTs. In particular, the gate material layer is deposited to a thickness that the gate layers of neighboring channels just merged together. This will form a gate select line for each row of TFTs along the x-axis while leaving a separation of Ls between adjacent gate select lines.

Figure 28:
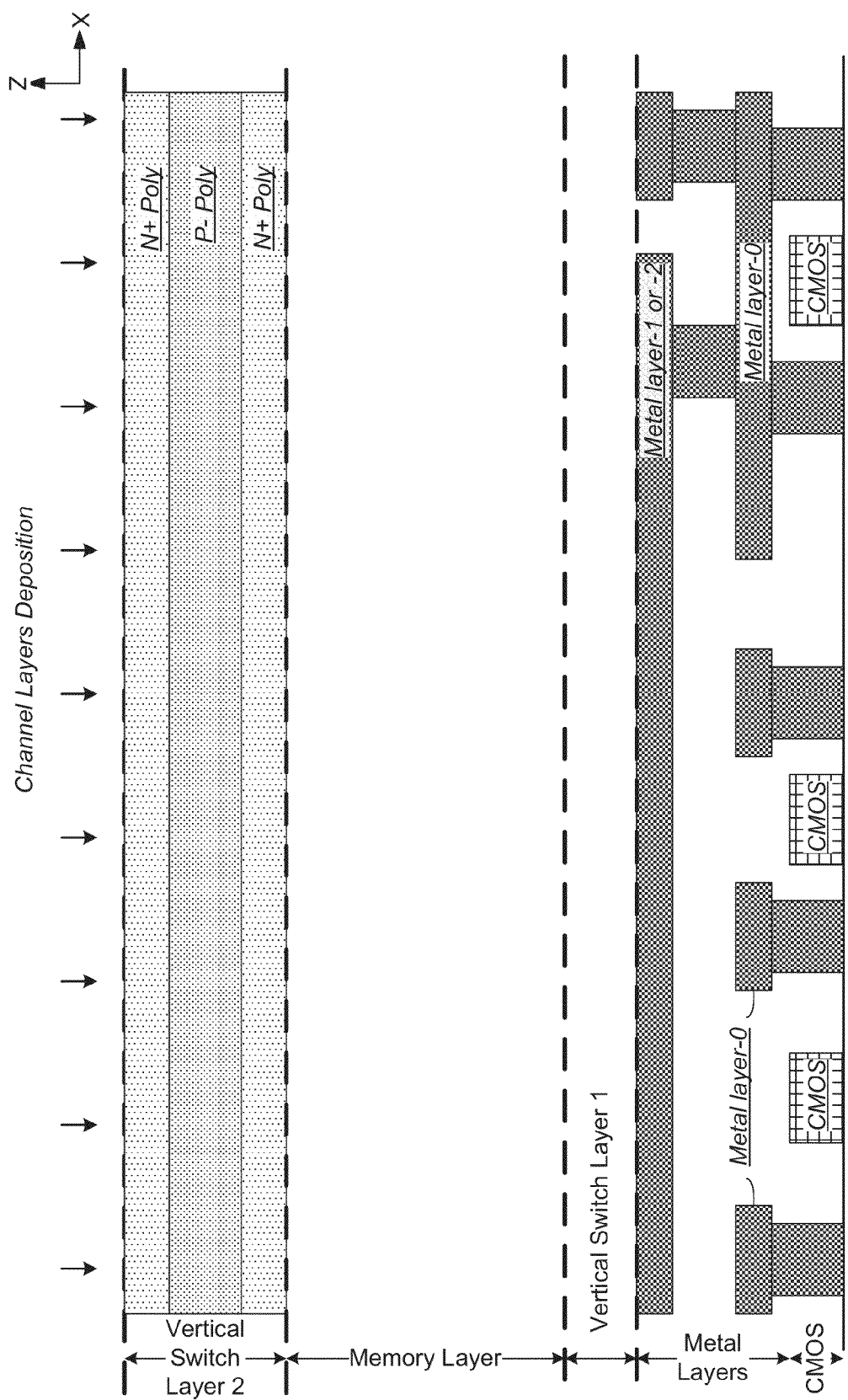
FIG. 28 illustrates the processes of forming of the vertical switch layer 2, including depositing a layer of N+ poly on top of the memory layer, followed by depositing a layer of P-poly and then a layer of N+ poly.

FIG. 28 illustrates the processes of depositing a layer of N+ poly on top of the memory layer, followed by depositing a layer of P-poly and then a layer of N+ poly. This will form a NPN slab suitable for fashioning individual channel pillars for the TFTs.

Figure 29A:
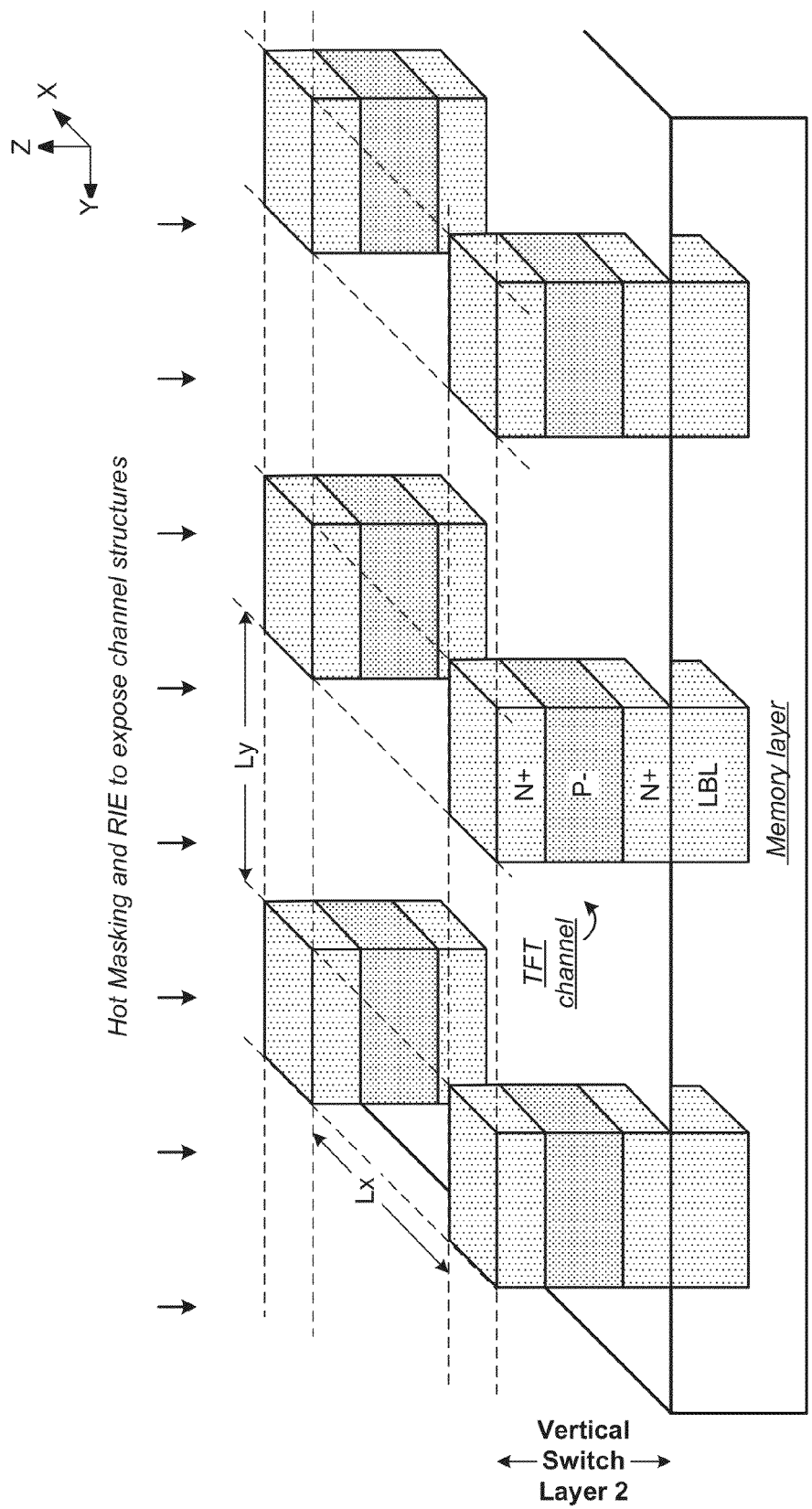
FIG. 29A is a perspective view of the vertical switch layer 2 on top of the memory layer and illustrates the processes of forming the individual channel pillars from the NPN slab.

FIG. 29A is a perspective view of the vertical switch layer 2 on top of the memory layer and illustrates the processes of forming the individual channel pillars from the NPN slab. Each channel pillar is aligned and formed to switch a local bit line LBL in the memory layer below. This is accomplished by photo hot masking and then RIE (Reactive Ion Etch) etching trenches to the top of the memory layer to isolate the slab into individual channel pillars.

Figure 29B:
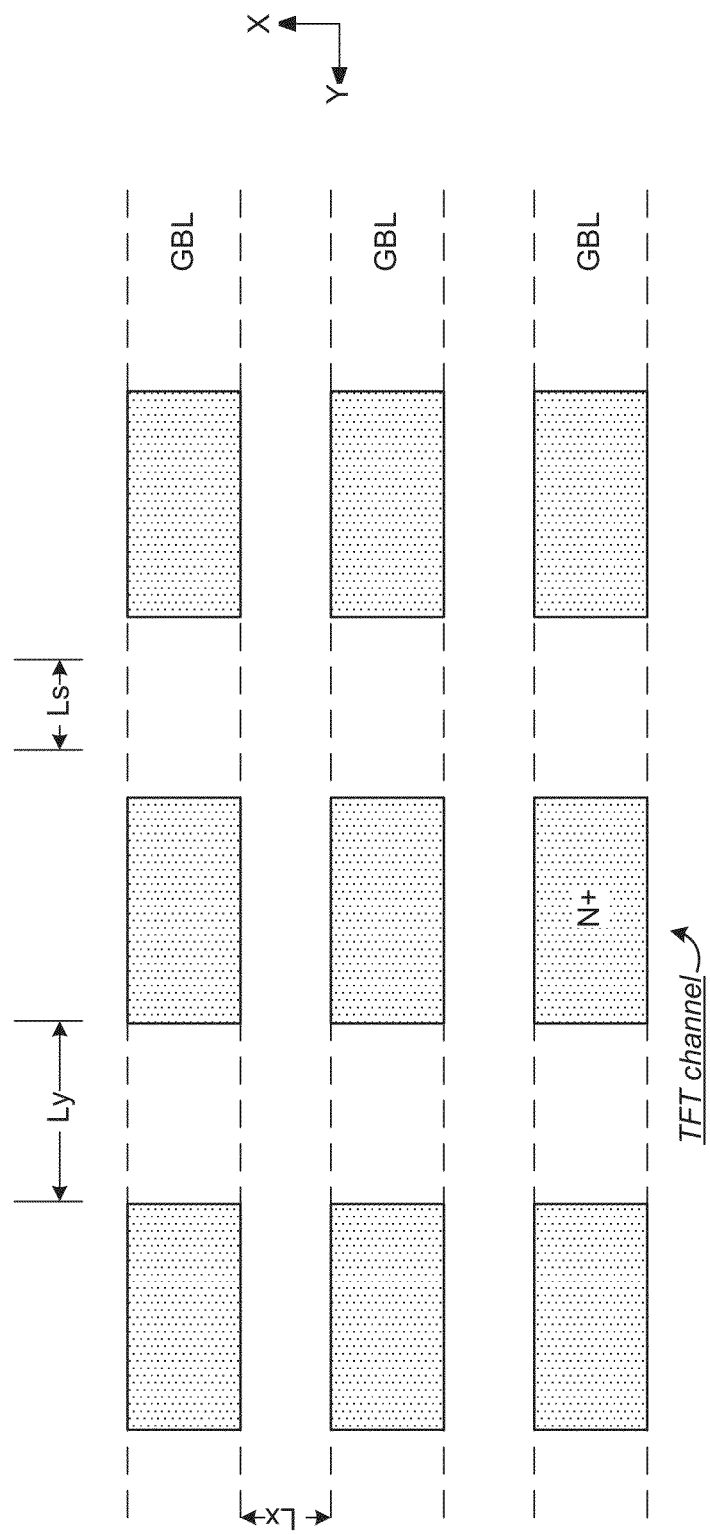
FIG. 29B is a top plan view of FIG. 29A after the individual channel pillars have been formed.

FIG. 29B illustrates a top plan view of FIG. 29A after the individual channel pillars have been formed. As described earlier, the separation between two adjacent channel pillars along the x-axis is Lx and the separation between two adjacent channel pillars along the y-axis is Ly, where Ly=Lx+Ls. The bottom of each channel pillar is connected to a local bit line in the memory layer. The top of each channel pillar will be connected a global bit line GBL to be formed on the top metal layer.

FIG. 30A is a cross-sectional view along the x-axis illustrating depositing a gate oxide layer on top of the channel pillars. For example, a layer of about 5 nm is formed by Atomic Layer Deposition ("ALD').

FIG. 30B is a cross-sectional view along the y-axis of FIG. 30A.

Figure 31A:
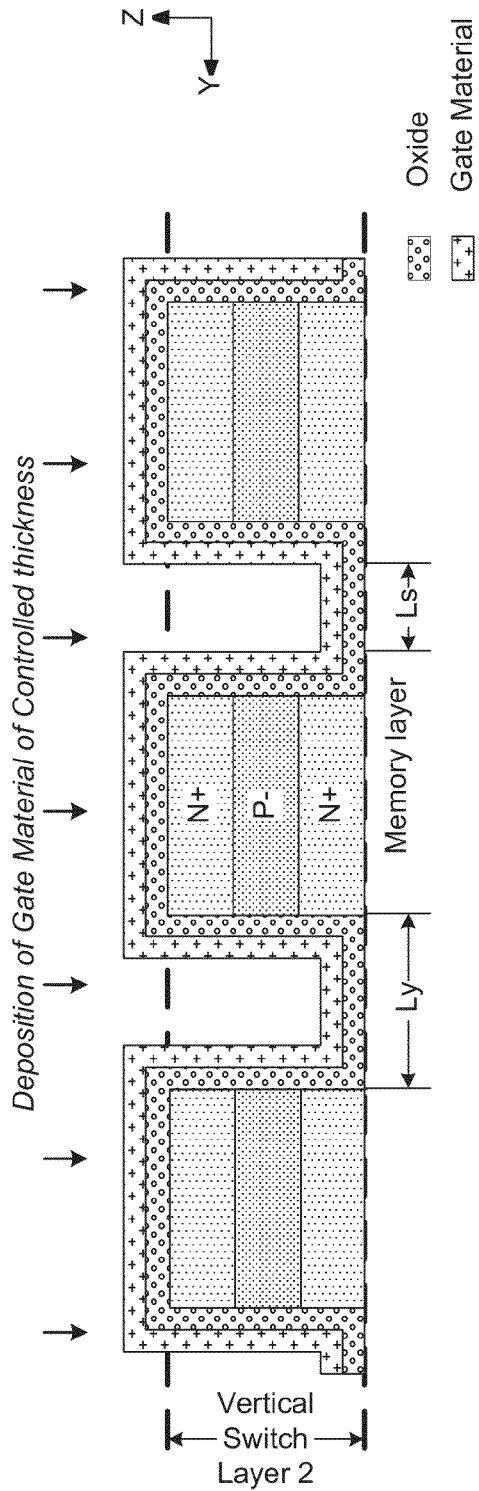
FIG. 31A is a cross-sectional view along the x-axis illustrating depositing a gate material layer on top of the gate oxide layer.

FIG. 31A is a cross-sectional view along the x-axis illustrating depositing a gate material layer on top of the gate oxide layer. The deposition is accomplished by Atomic Layer Deposition ("ALD'). The deposited gate material layer wraps around each channel pillar to form a surround gate. The thickness of the layer is controlled so that the layers from neighboring channels merge into a single gate select line along the x-axis but individual gate select lines remain isolated from each other with a spacing of Ls (see also FIG. 27). For example, the gate layer is 7 nm of TiN and together with the gate oxide layer of 5 nm amount to 12 nm. If Lx=24 nm, adjacent gates along the x-direction will merge.

Figure 31B:
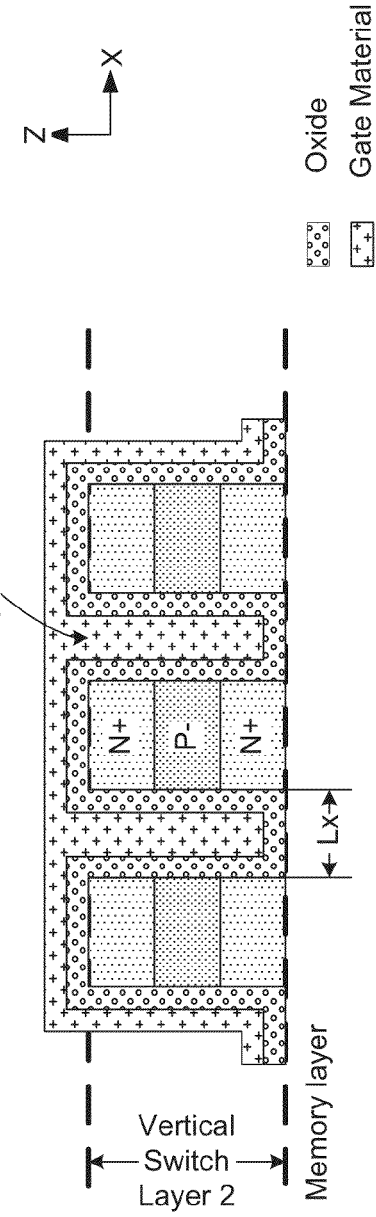
FIG. 31B is a cross-sectional view along the y-axis of FIG. 31A showing that the spacing between adjacent pair of insulated channel pillar are filled with the gate material.

FIG. 31B is a cross-sectional view along the y-axis of FIG. 31A showing that the spacing between adjacent pair of insulated channel pillar are filled with the gate material. If Ly=48 nm, then Ls=24 nm.

FIG. 32A is a cross-sectional view along the x-axis illustrating further etch back of the gate material layer. A mixture of anisotropic and isotropic etches of high selectivity serves to remove the gate material layer from the top of each channel pillar and at the floor between channel pillars along the y-axis and recess the wrapped-around side wall of the layer from the top of each channel pillar. After selective removal of the gate material, the exposed N+ layer at the top of each channel pillar is planarized.

FIG. 32B is a cross-sectional view along the y-axis of FIG. 32A. It will be seen that the gate material are now wrapping around each channel pillar and forming a continuous select gate line along the x-axis while each select gate line for each row of channel pillars along the x-axis are isolated from each other by a separation of Ls (see also FIG. 32A).

Figure 33A:
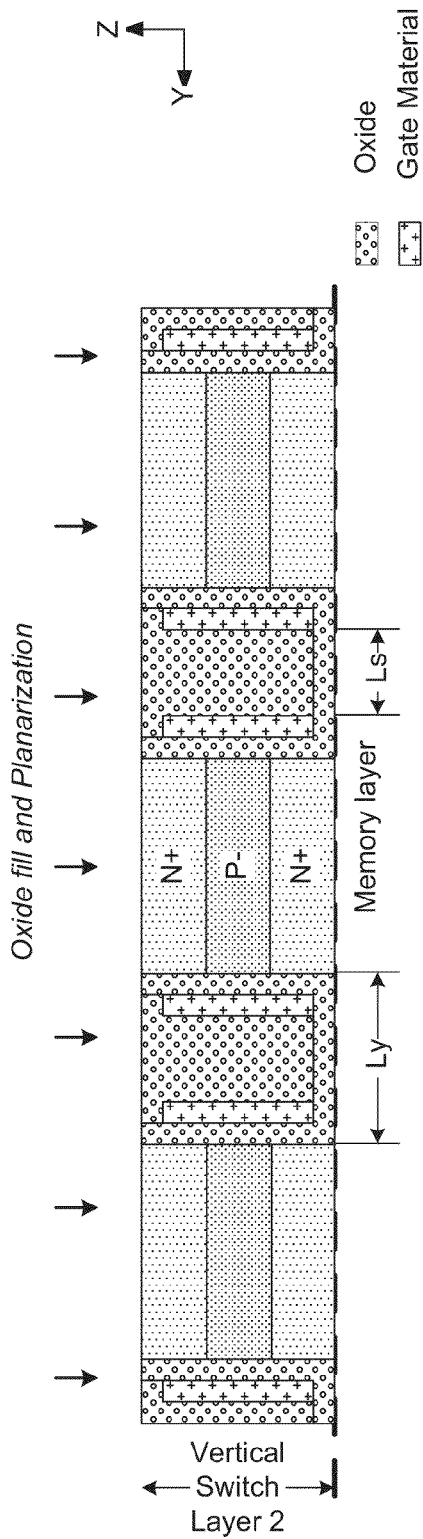
FIG. 33A is a cross-sectional view along the x-axis illustrating the process of depositing oxide to fill in any pits and gaps to complete the vertical switch layer 2.
Figure 33B:
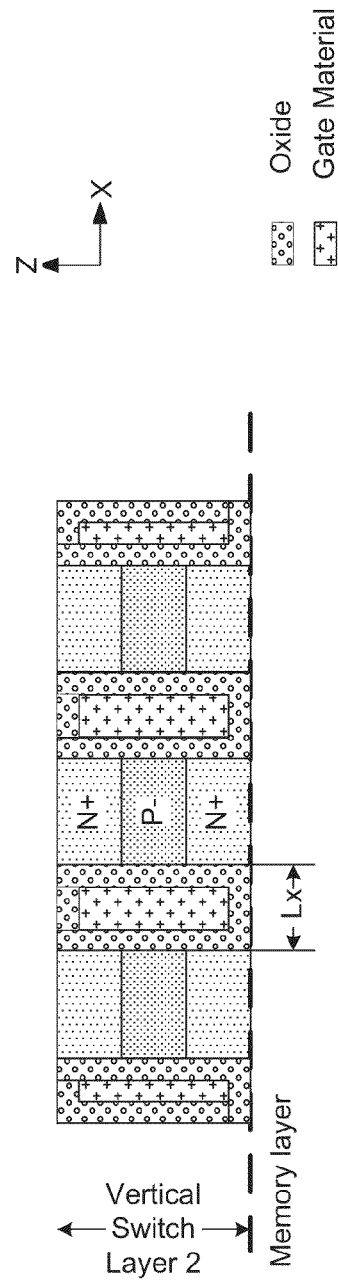
FIG. 33B is a cross-sectional view along the y-axis of FIG. 33A of the completed vertical switch layer 2 having an array of TFTs controlled by select gate lines along the x-axis.

FIG. 33A is a cross-sectional view along the x-axis illustrating the process of depositing oxide to fill in any pits and gaps to complete the vertical switch layer 2. The oxide fill is followed by planarization.

FIG. 30B is a cross-sectional view along the y-axis of FIG. 33A of the completed vertical switch layer 2 having an array of TFTs controlled by select gate lines along the x-axis.

Figure 34A:
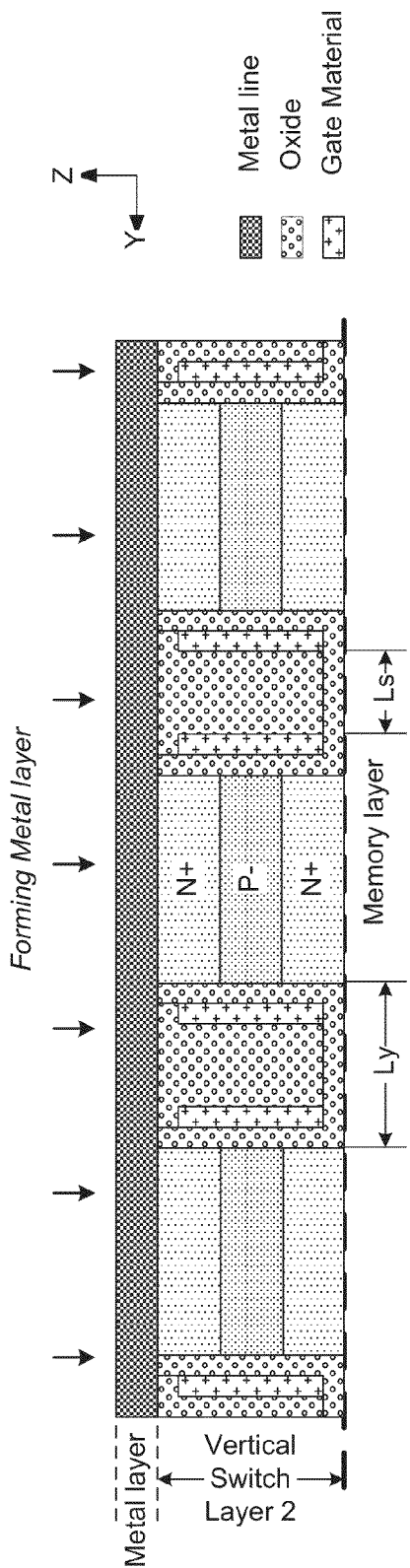
FIG. 34A is a cross-sectional view along the x-axis illustrating the process of forming global bit lines GBLs in the top metal layer.

FIG. 34A is a cross-sectional view along the x-axis illustrating the process of forming global bit lines GBLs in the top metal layer. Each GBL line is connected to the top of channel pillars along a row in the y-axis.

Figure 34B:
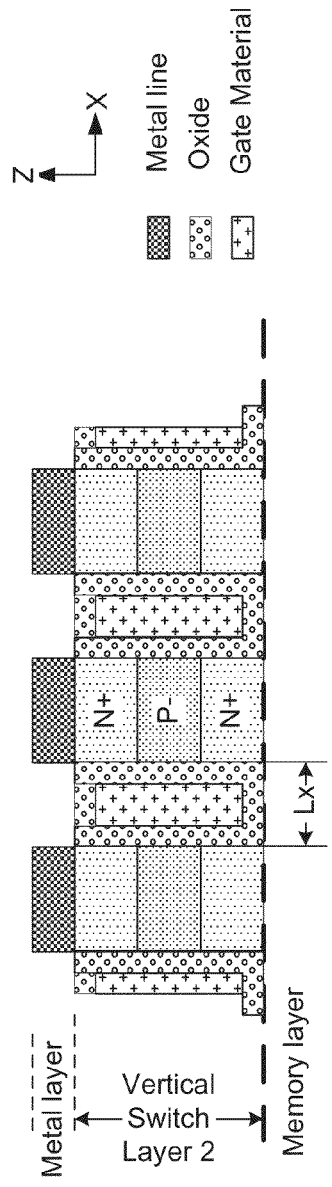
FIG. 34B is a cross-sectional view along the y-axis of FIG. 34A.

FIG. 34B is a cross-sectional view along the y-axis of FIG. 34A.

Figure 35:
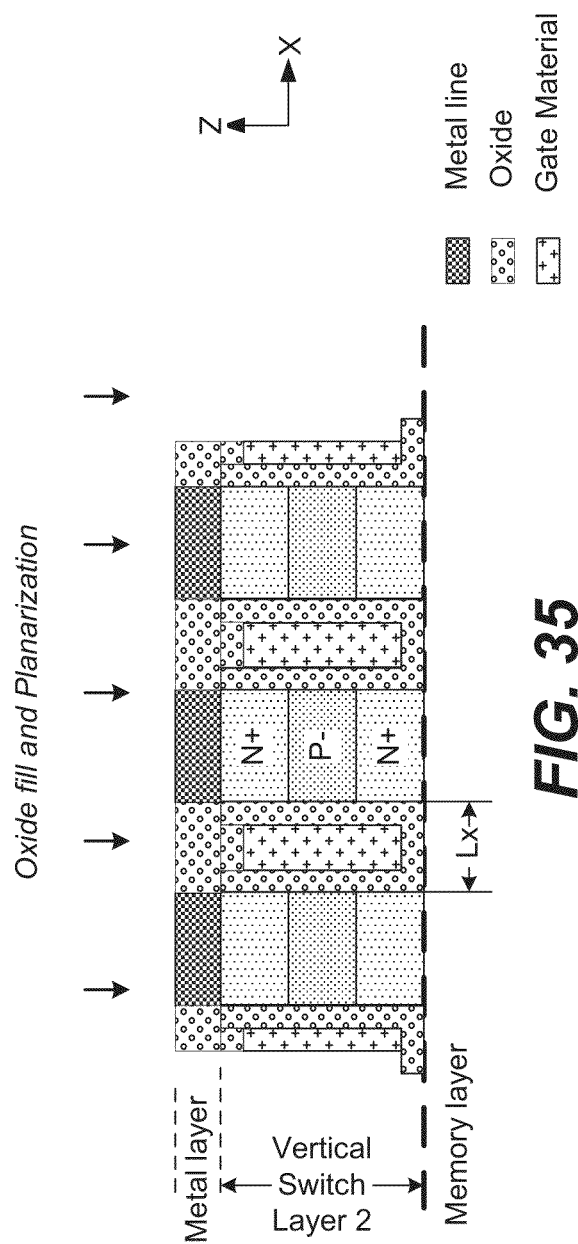
FIG. 35 is a cross-sectional view along the x-axis illustrating the process of filling in the gaps between metal lines.

FIG. 35 is a cross-sectional view along the x-axis illustrating the process of filling in the gaps between metal lines. This is then followed by planarization to complete the vertical switch layer 2.

3D Array of Read/Write Elements with Low Current Cells

According to one aspect of the invention, a nonvolatile memory is provided with a 3D array of read/write (R/W) memory elements as memory cells. Each R/W memory element can be set or reset to at least one of two resistive states. The reading of an R/W memory cell is by detecting a corresponding current resulting from one these resistive states. It is preferable to operate with low current and high resistive states. The resistance of these resistive states depends also on the dimension of the R/W elements. Since each R/W element is formed at a crossing between a word line and a bit line, the dimension is predetermined by the process technology. This aspect of the invention provides another degree of freedom to adjust the resistance of the R/W memory element. This is accomplished by providing the R/W memory element in the form of a shell enclosing an oxide core. The thickness of the shell rather than its surface areas in contact with the word line and bit line determines the conduction cross-section and therefore the resistance. By adjusting the thickness of the shell, independent of the electrode's contact area with either the word line or bit line, each R/W element can operate with a much increased resistance and therefore much reduced current.

In particular, the bit lines oriented in the vertical direction serve multiple layers of 2D arrays. Each layer is a 2D array of R/W elements with the word lines in the horizontal or lateral direction. Each R/W element is in the form of a rectangular tube extending in the vertical direction. Thus, the R/W element is a shell with a rectangular cross-section and extended along the z-axis through the multiple layers. At each crossing between a pair of bit line and word line, a first side of the rectangular tube serves as a first electrode in contact with the bit line and a second side of the rectangular tube serves a second electrode in contact with the word line.

The low current R/W elements are applicable to a 3D memory structure with vertical local bit lines and horizontally formed active R/W memory elements. The 3D memory structure is defined with respect to an x-y-z coordinate system. The local bit lines (LBLs) are in the z-direction, the word lines (WLs) are in the x-direction.

The low current shell structure R/W elements are applicable to a 3D array where each individual word line is confined within each of the multiple layers of 2D arrays, an example of which is shown in FIG. 8.

Preferably, the low current shell structure R/W elements are applicable to a 3D array where each individual word line has a staircase structure that traverse the multiple layers of 2D array, an example of which is shown in FIG. 21.

In one embodiment, the first and second electrodes, respectively in contact with a pair of vertical bit line and word line, are on opposite sides of the rectangular tube.

In a more preferred embodiment, the first and second electrodes, respectively in contact with a pair of vertical bit line and word line, are on adjacent sides of the rectangular tube.

Operating a 3D memory array of low current R/W elements has the advantage of saving power and reducing any potential differentials along a word line due to its finite resistance. Maintaining a more uniform voltage across a word line helps to reduce leakage currents between the different R/W elements in the 3D array.

R/W materials that can be used on RRAM devices such as the 3D memory of the present invention have also been described earlier in connection with FIG. 6. In general, the device is a capacitor like structure with the switching material between first and second electrodes (conductors). The first electrode which acts as an anode includes one of the following: Al (reactive), Pt, Pd, Au, Ag, TiN, TaN, TaCN, Ti(reactive)/TiN, Ni, C, Co. The second electrode which acts as a cathode includes one of the following: Pt, Pd, Au, Ag, Cu, TiN, TaN, TaCN, W, n+Si.

The switching materials fall mainly into one of two categories. The first category is Complex Oxides having a structure of Me doped oxides where Me:Me1Me2 . . . Ox. Examples are: PCMO (PrCaMnO), LCMO (LaCaMnO), LaSrGaMg(Co)O, (CeO2)x(GdO0.5)y, Cu:MoOx/GdOx, Nb:STO (Nb:SrTiO), . . . , Cu:ZrOx, . . . , Y(Sc)SZ (Yt(Sc) Stabilized ZrOx), doped Y(Sc)SZ: YTiZrO, YZrON, . . . .

The second category is Binary oxides having a structure TMOs (Transition Metal Oxides) having a structure of single layers or dual layers: Me1Ox/Me2Ox . . . . Examples are: WOx, HfOx, ZrOx, TiOx, NiOx, AlOx, AlOxNy, . . . , ZrOx/HfOx, AlOx/TiOx, TiO2/TiOx, . . . , GeOx/HfOxNy, . . . .

Figure 36B:
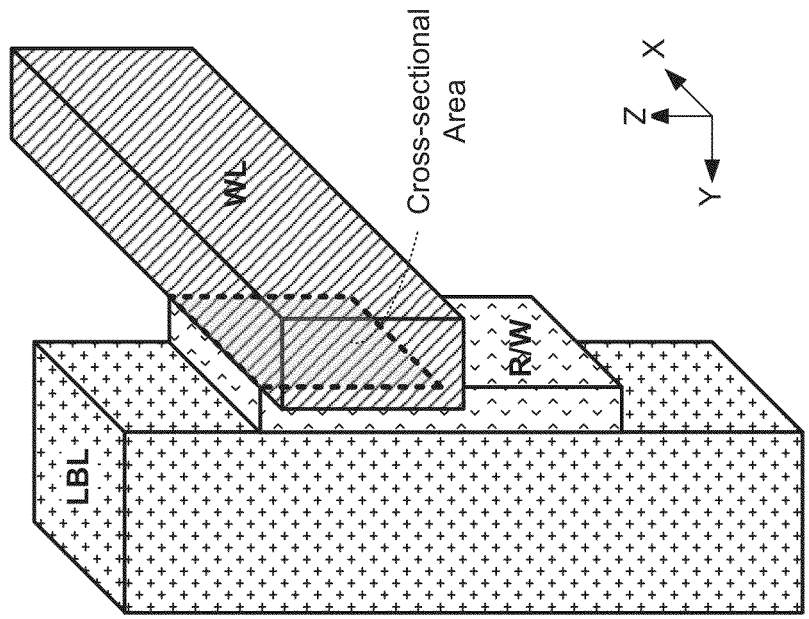
FIG. 36B is an elevation view of the previous R/W element shown in FIG. 36A.
Figure 36A:
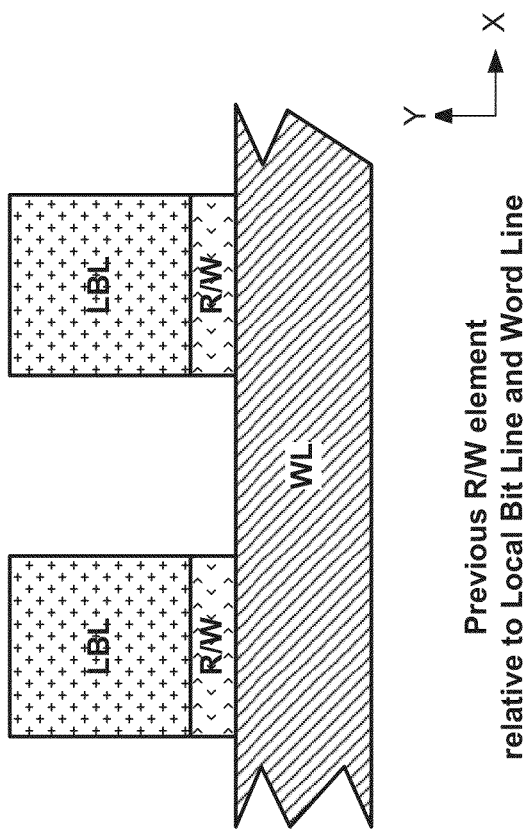
FIG. 36A is a plan view illustrating a previous R/W element formed at the crossing between a word line and a bit line.

FIG. 36A is a plan view illustrating a previous R/W element formed at the crossing between a word line and a bit line. In previous embodiments, the R/W element circuit is formed by having an R/W layer adjacent to both the bit line and the word line to form part of a circuit so that the R/W element respectively has opposite sides contacting the word line and the bit line. However, this will entail any current path through the circuit to have a contact area defined by intersecting the word line with the bit line at their crossing. This contact area cannot be altered without changing the dimensions of the word line and bit line which are determined by process technology.

FIG. 36B is an elevation view of the previous R/W element shown in FIG. 36A. It can be seen from FIG. 36A and FIG. 36B that the current path of the R/W element is determined by the cross-sectional area of the local or vertical bit line (LBL) with the word line (WL).

Figure 37B:
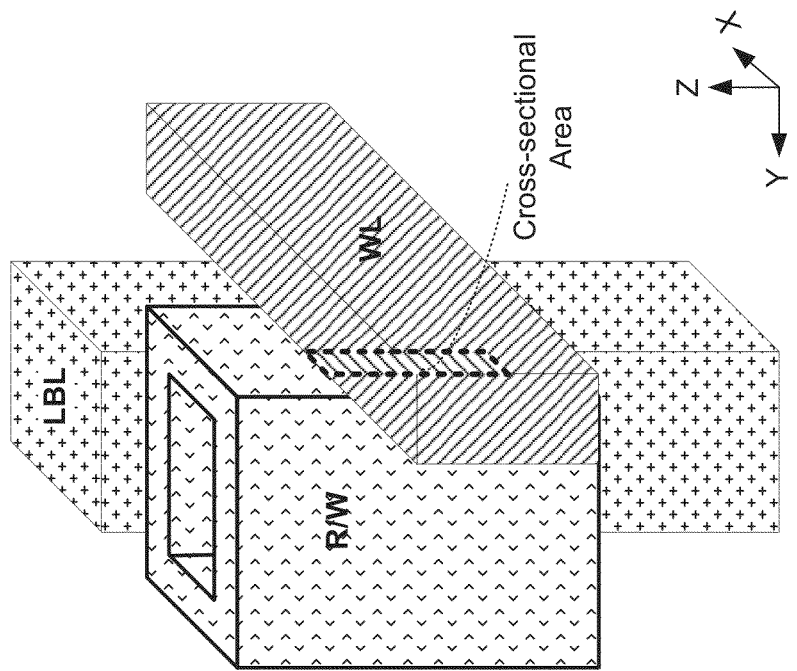
FIG. 37B is an elevation view of the previous R/W element shown in FIG. 37A.
Figure 37A:
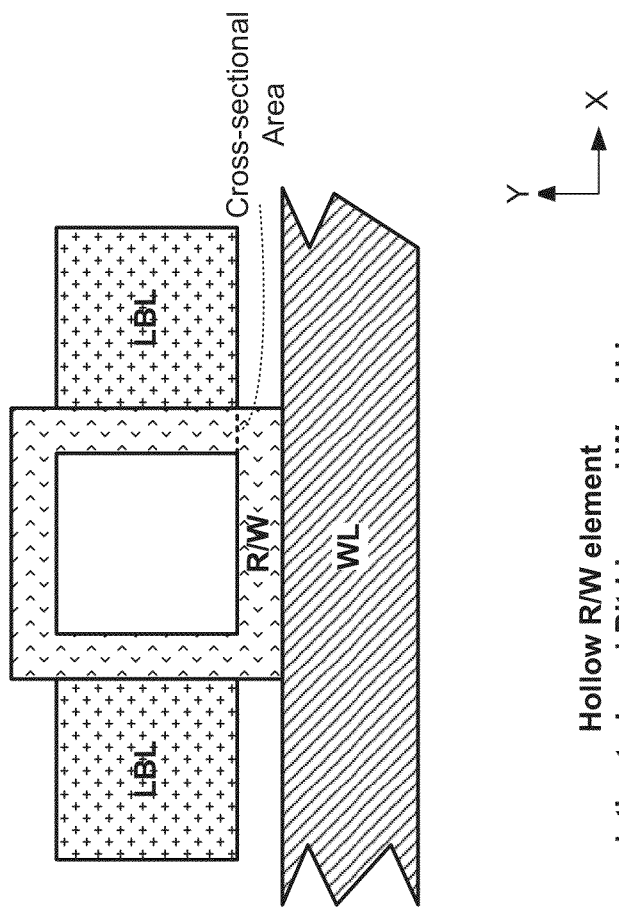
FIG. 37A is a plan view illustrating a shell structure R/W element formed at the crossing between a word line and a bit line.

FIG. 37A is a plan view illustrating a shell structure R/W element formed at the crossing between a word line and a bit line.

FIG. 37B is an elevation view of the previous R/W element shown in FIG. 37A. It can be seen from FIG. 37A and FIG. 37B that the current path of the R/W element is determined by the cross-sectional area of shell of the R/W element.

Figure 38:
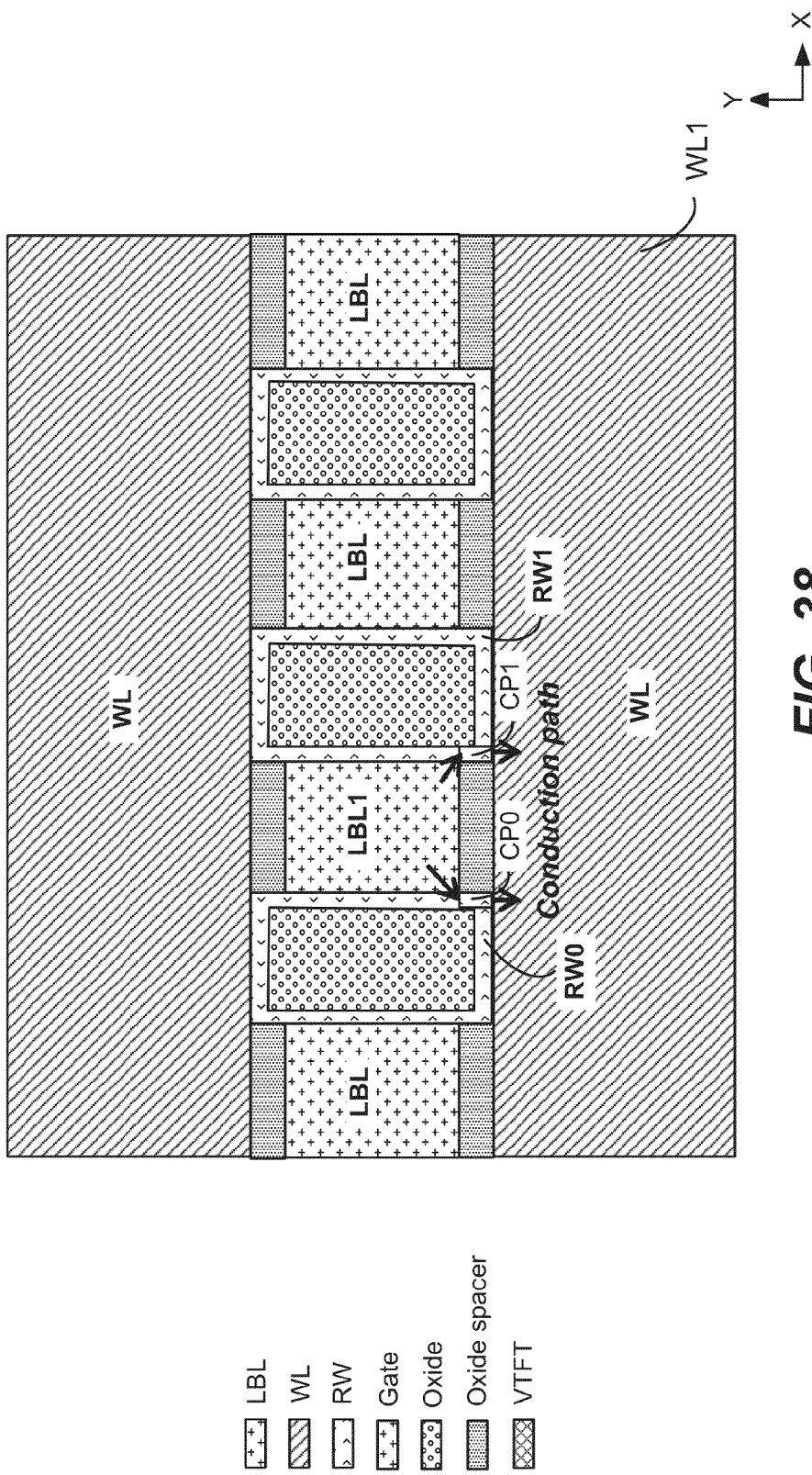
FIG. 38 is a top plan view of an integrated circuit structure with the shell structure R/W elements according to a first embodiment in which the shell structure R/W elements are formed in between every LBL along the x-axis.

FIG. 38 is a top plan view of an integrated circuit structure with the shell structure R/W elements according to a first embodiment in which the shell structure R/W elements are formed in between every LBL along the x-axis. Essentially a page of vertical LBL is formed in the x-axis between two word lines but isolated from each of them by a layer of oxide spacer. The shell structure R/W elements are in the form of rectangular tubes in the z-axis formed in between each pair of LBLs. Thus, each pair of LBL across the x-axis is sandwiching a shell structure R/W element and is in contact with a first two opposite sides of the shell structure R/W element. Also, each pair of WL across the y-axis is sandwiching the shell structure R/W element and is in contact with a second two opposite sides of the shell structure R/W element. It will be seen that when a circuit is formed between the bit line BL1 and WL1, there are two conduction paths. The first conduction path CP0 is LBL1 via R/W0 to WL1. The second conduction path CP1 is LBL1 via R/W1 to WL1. The cell area is the WL thickness times the R/W shell thickness.

FIG. 39A to FIG. 46C illustrate the processes of forming of the 3D memory layer with the structure illustrated in FIG. 38.

Essentially, the 3D memory comprises multiple 2D layers in the x-y plane stacked on top of each other with the vertical bit lines along z-direction running through the 2D layers.

Referring to FIG. 26 the shell structure R/W elements are formed in the memory layer on top of the vertical switch layer 1. In one embodiment, access to the LBLs is accomplished by a corresponding array of pillar switches in the form of vertical thin film transistors (VTFT) formed in the vertical switch layer 1. This allows the LBLs to be accessed by corresponding global bit lines in the metal layer, which is on top of a base portion. The base portion is commonly referred to as FEOL ("Front End Of (Manufacturing) Line") and is supported by a semiconductor substrate on which active CMOS elements may be formed (not shown).

The memory layer comprises of multiple 2D layers. Each 2D layer has an array of R/W elements accessible by vertical local bit lines in the z-direction and word lines in the x-direction.

Essentially, a primitive slab of the multiple 2D layers with word lines and isolated by oxides is formed first. This is applicable to either the embodiment with the self-contained word lines in each 2D layer or the embodiment with the staircase word lines. Then, trenches are cut, and the vertical bit lines and R/W elements are formed in the trenches.

Figure 39B:
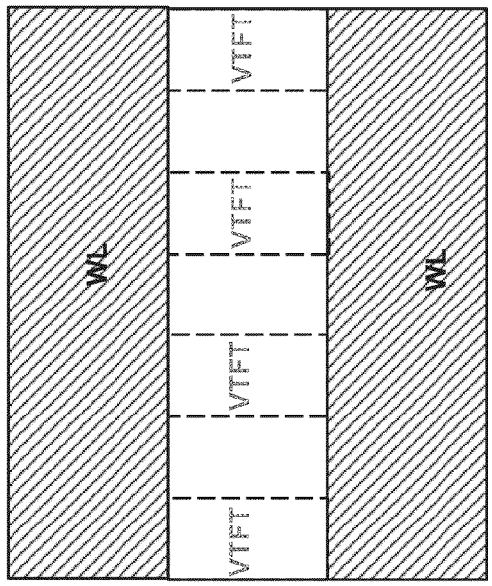
FIG. 39B is a top plan view in the z-direction, illustrating that trenches are cut in the slab aligned with the pillar switches (VTFTs) in the vertical switch layer below the slab.
Figure 39A:
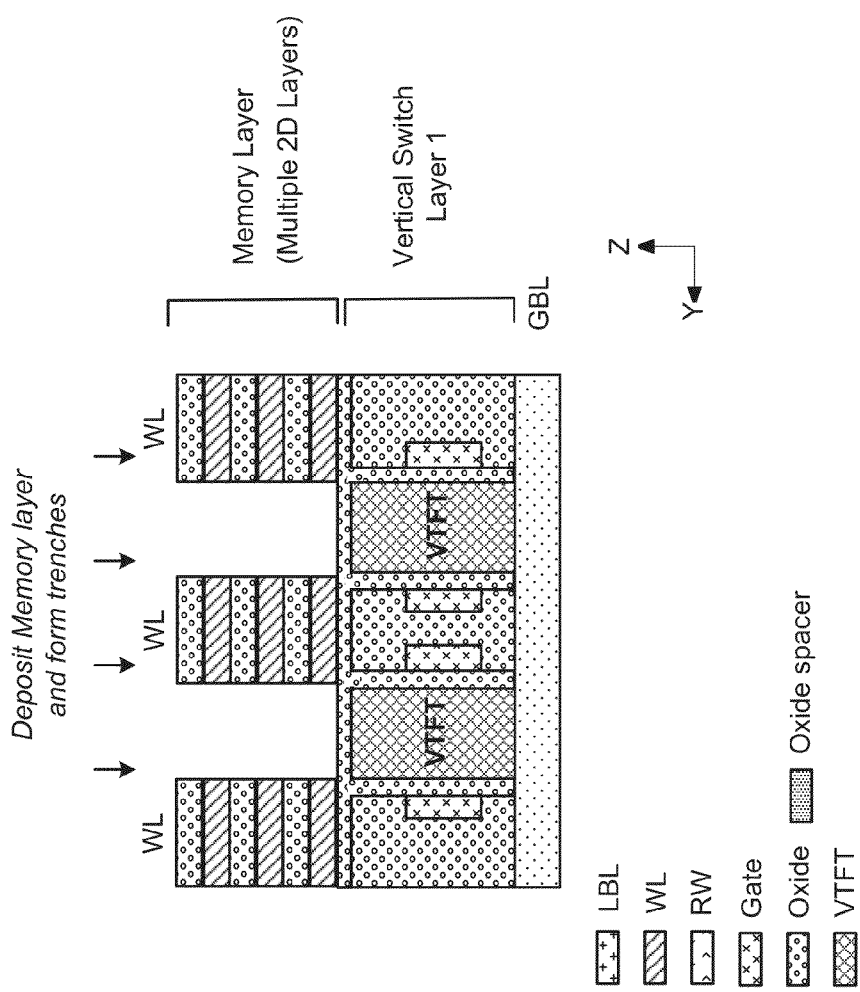
FIG. 39A is a cross-sectional view in the x-direction illustrating the process of cutting trenches in the slab of the multiple 2D layers of the memory layer on top of the array of VTFTs in the switching layer 1.

FIG. 39A is a cross-sectional view in the x-direction illustrating the process of cutting trenches in the slab of the multiple 2D layers of the memory layer on top of the array of VTFTs in the switching layer 1. The trenches are cut in the slab by masking the word lines so that rows of the pillar switches are exposed along the x-direction after RIE (Reactive Ion Etch).

FIG. 39B is a top plan view in the z-direction, illustrating that trenches are cut in the slab aligned with a row of pillar switches (VTFTs) in the vertical switch layer below the slab.

Figure 40:
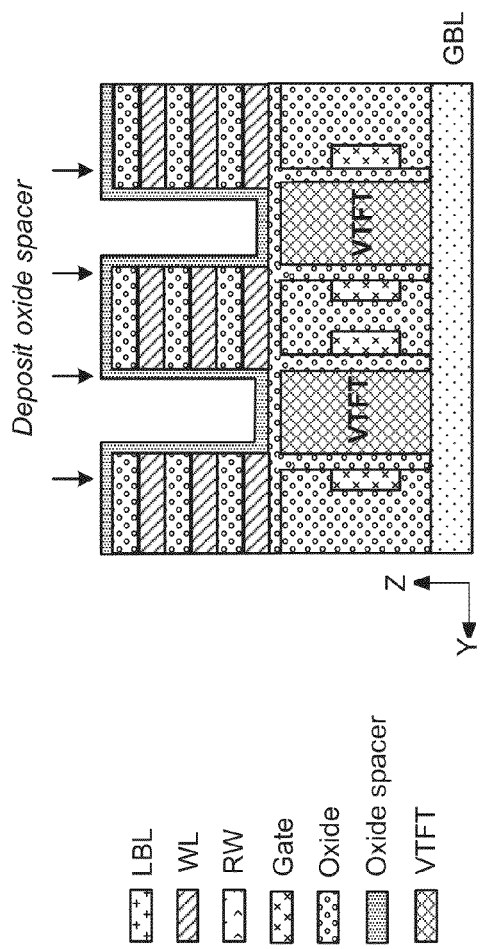
FIG. 40 is a cross-sectional view in the x-direction, illustrating the process of depositing a layer of oxide spacer over the trenches.

FIG. 40 is a cross-sectional view in the x-direction, illustrating the process of depositing a layer of oxide spacer over the trenches. The deposition is accomplished by Atomic Layer Deposition ("ALD").

Figure 41B:
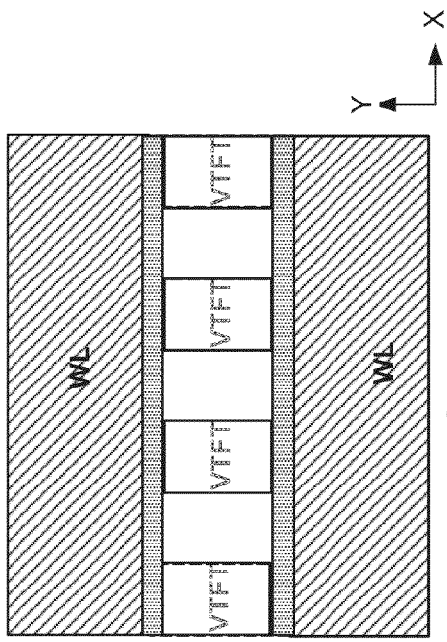
FIG. 41B is a top plan view in the z-direction of the structure shown in FIG. 40A.
Figure 41A:
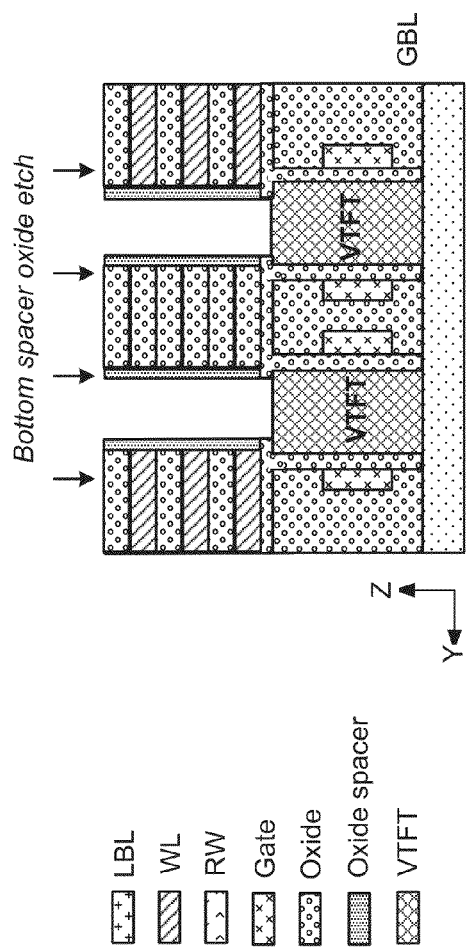
FIG. 41A is a cross-sectional view in the x-direction, illustrating the process of etching the oxide from the bottom of the trenches and the top of the slab.

FIG. 41A is a cross-sectional view in the x-direction, illustrating the process of etching the oxide from the bottom of the trenches and the top of the slab. The bottom of each trench is etched by RIE until the VTFTs are exposed.

FIG. 41B is a top plan view in the z-direction of the structure shown in FIG. 40A.

Figure 42B:
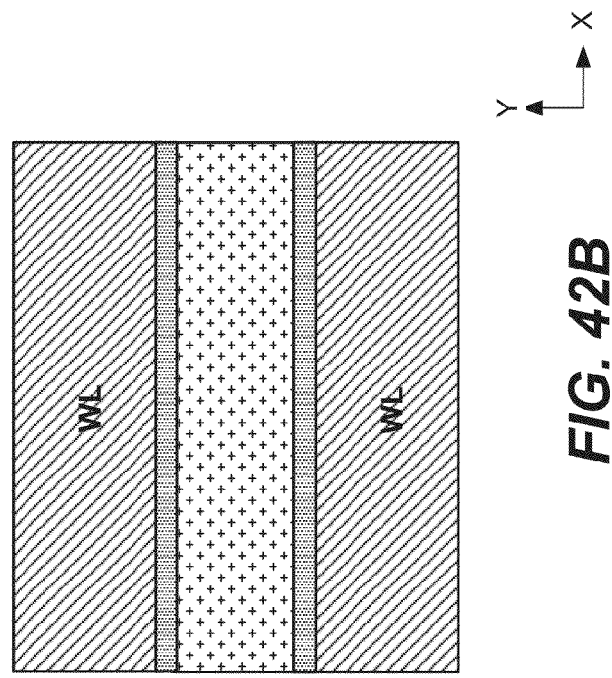
FIG. 42B is a top plan view in the z-direction of the structure shown in FIG. 42A.
Figure 42A:
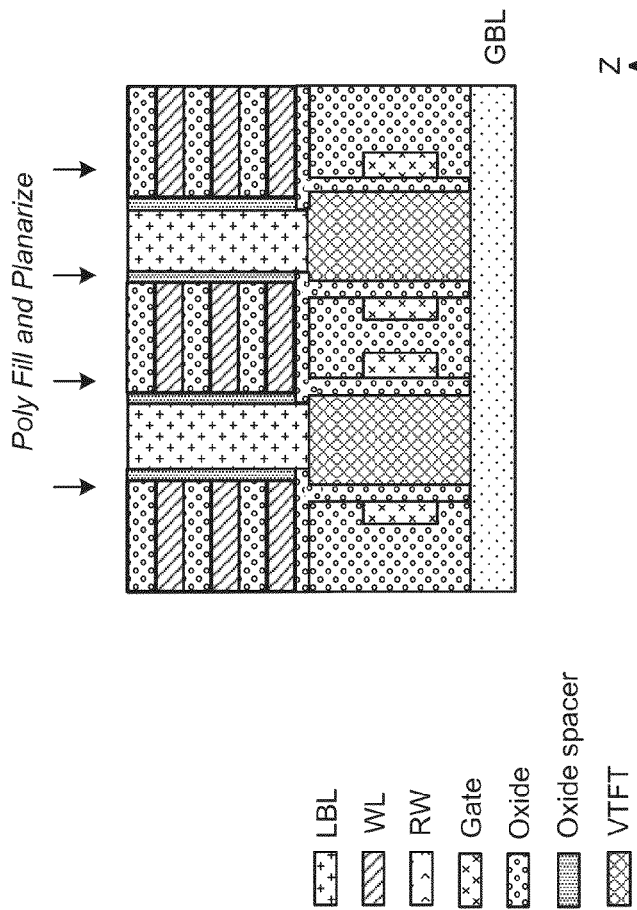
FIG. 42A is a cross-sectional view in the x-direction, illustrating the process of filling the trenches with of N+ poly to form the gross structure of the vertical local bit lines LBLs.

FIG. 42A is a cross-sectional view in the x-direction, illustrating the process of filling the trenches with of N+ poly to form the gross structure of the vertical local bit lines LBLs. The polysilicon fill is followed by planarization.

FIG. 42B is a top plan view in the z-direction of the structure shown in FIG. 42A.

FIG. 43A is a cross-sectional view in the x-direction, illustrating the process of isolating the LBLs in the trenches by RIE etching away the portions of N+ poly and oxide not on top of the VTFTs using a bit line mask to create isolation pits.

FIG. 43B is a top plan view in the z-direction of the structure shown in FIG. 43A.

FIG. 44 is a cross-sectional view in the x-direction, illustrating the process of depositing a layer of R/W material of predetermined thickness in the isolation pits. The deposition is accomplished by Atomic Layer Deposition ("ALD').

FIG. 45A is a top plan view in the z-direction illustrating the process of etching the R/W material from the bottom of the isolation pits to create a shell structure R/W element. This step may be optional if the R/W material from the bottom of the isolation pits do not significantly change the conductance between a pair of local bit line and word line.

FIG. 45B is a cross-sectional view in the x-direction of the structure across the section B shown in FIG. 45A.

FIG. 46A is a top plan view in the z-direction, illustrating the process of filling the shell structure R/W elements in the isolation pits with an oxide core. After planarization to remove excess oxide from the top of the slab, the memory layer with the shell structure R/W elements is completed.

FIG. 46B is a cross-sectional view in the x-direction of the structure across the section 46B shown in FIG. 46A.

FIG. 46A is a cross-sectional view in the x-direction of the structure across the section 46C shown in FIG. 46A.

Alternative Embodiment

Figure 47:
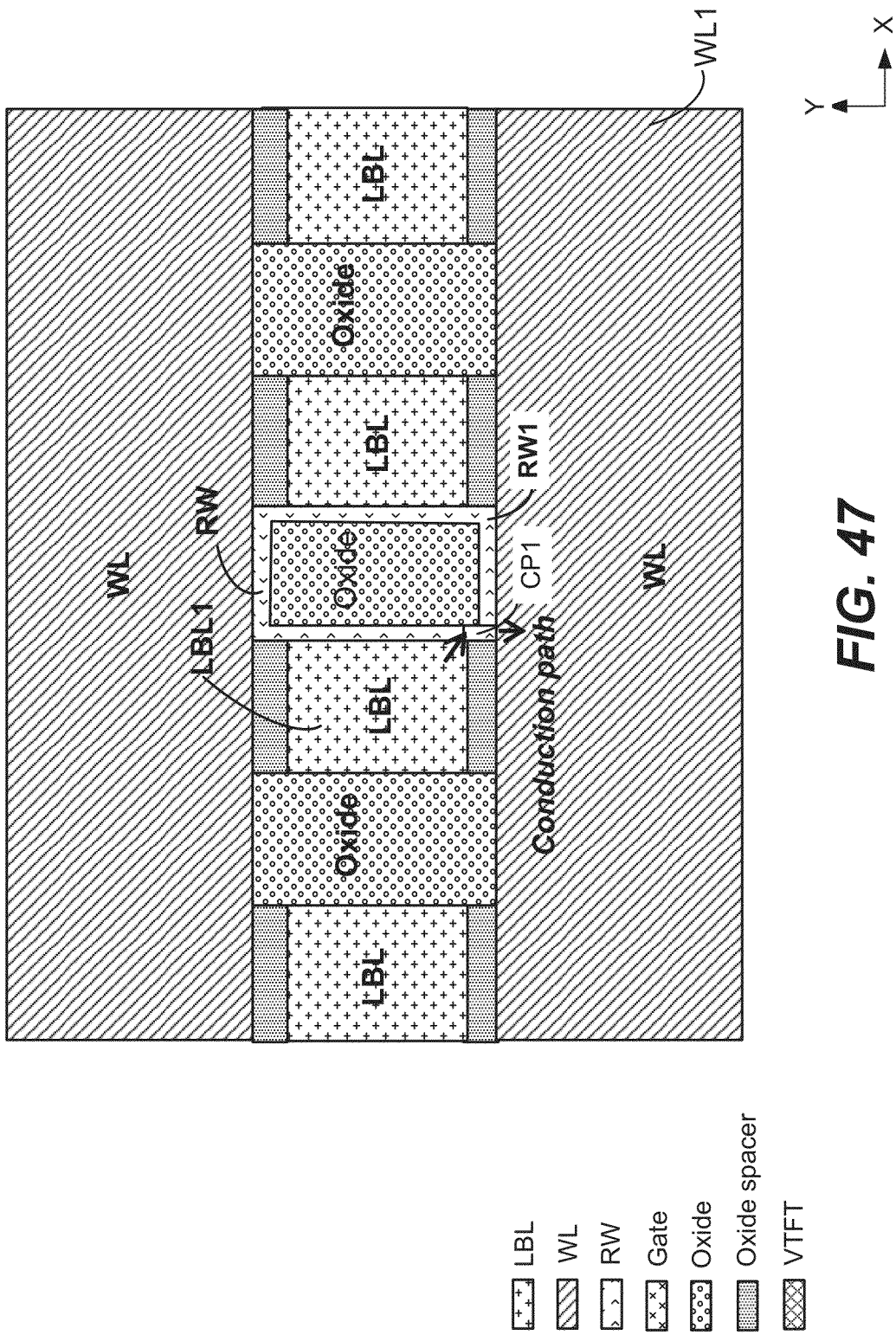
FIG. 47 is a top plan view of an integrated circuit structure with the shell structure R/W elements according to a second embodiment in which the shell structure R/W elements are formed in between every other LBL along the x-axis.

FIG. 47 is a top plan view of an integrated circuit structure with the shell structure R/W elements according to a second embodiment in which the shell structure R/W elements are formed in between every other LBL along the x-axis. Essentially a page of vertical LBL is formed in the x-axis between two word lines but isolated from each of them by a layer of oxide spacer. The shell structure R/W elements are in the form of rectangular tubes in the z-axis formed in between an LBL and an dummy oxide block in place of another LBL. Thus, each shell structure R/W element is in contact with a first side with the LBL. Also, each pair of WL across the y-axis is sandwiching the shell structure R/W element and is in contact with a second two opposite sides of the shell structure R/W element. It will be seen that when a circuit is formed between the bit line BL1 and WL1, there is one conduction path CP1 consisting of LBL1 via R/W0 to WL1. The cell area in this alternative embodiment is the WL thickness times the R/W shell thickness.

FIG. 48A to FIG. 56C illustrate the processes of forming of the 3D memory layer with the structure illustrated in FIG. 47. The processes are similar to those described with respect to FIG. 39A to FIG. 46C for the first embodiment except in the isolation of the LBL using a bit line isolation mask will have double the pitch as that in FIG. 43A so that there is one isolation pit (or R/W element) every other local bit line LBL. Furthermore the missing R/W element is being replaced by oxide fill.

FIG. 48A is a cross-sectional view in the x-direction illustrating the process of cutting trenches in the slab of the multiple 2D layers of the memory layer on top of the array of VTFTs in the switching layer 1. The trenches are cut in the slab by masking the word lines so that the pillar switches are exposed along the x-direction after RIE (Reactive Ion Etch).

FIG. 48B is a top plan view in the z-direction, illustrating that trenches are cut in the slab aligned with rows of pillar switches (VTFTs) in the vertical switch layer below the slab.

FIG. 49A is a cross-sectional view in the x-direction, illustrating the process of filling the trenches with oxide. The oxide fill is followed by planarization. Then a BL1 mask and RIE etch isolate the oxide as shown in FIG. 49B and create open pits in the etched away portions.

FIG. 49B is a top plan view in the z-direction of the structure shown in FIG. 49A.

FIG. 50 is a cross-sectional view in the x-direction, illustrating the process of depositing a layer of oxide spacer over the open pits. The deposition is accomplished by Atomic Layer Deposition ("ALD').

FIG. 51A is a cross-sectional view in the x-direction, illustrating the process of etching the oxide from the bottom of the trenches and the top of the slab. The bottom of each trench is etched by RIE until the VTFTs are exposed.

FIG. 51B is a top plan view in the z-direction of the structure shown in FIG. 51A.

Figures 52A, 52B:
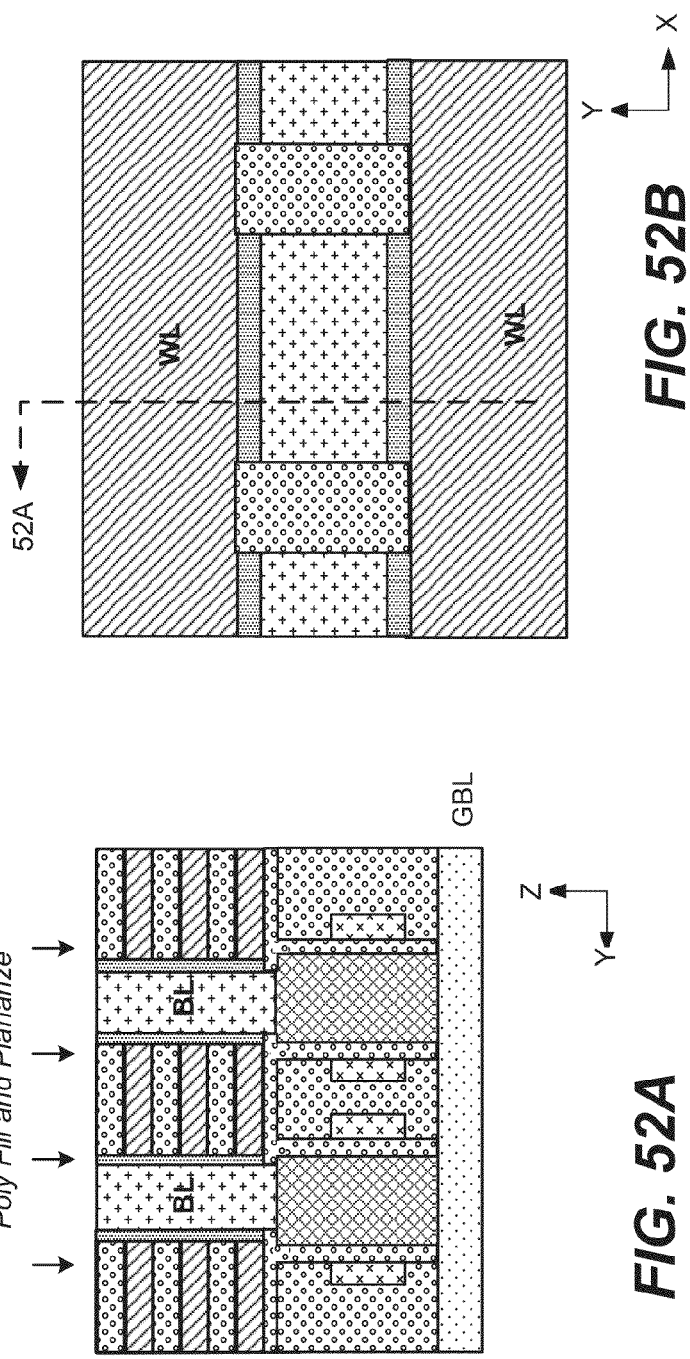
FIG. 52A is a cross-sectional view in the x-direction, illustrating the process of filling the open pits with of N+ poly to form the gross structure of the vertical local bit lines LBLs.
FIG. 52B is a top plan view in the z-direction of the structure shown in FIG. 42A.

FIG. 52A is a cross-sectional view in the x-direction, illustrating the process of filling the open pits with of N+ poly to form the gross structure of the vertical local bit lines LBLs. The polysilicon fill is followed by planarization.

FIG. 52B is a top plan view in the z-direction of the structure shown in FIG. 42A.

Figure 53B:
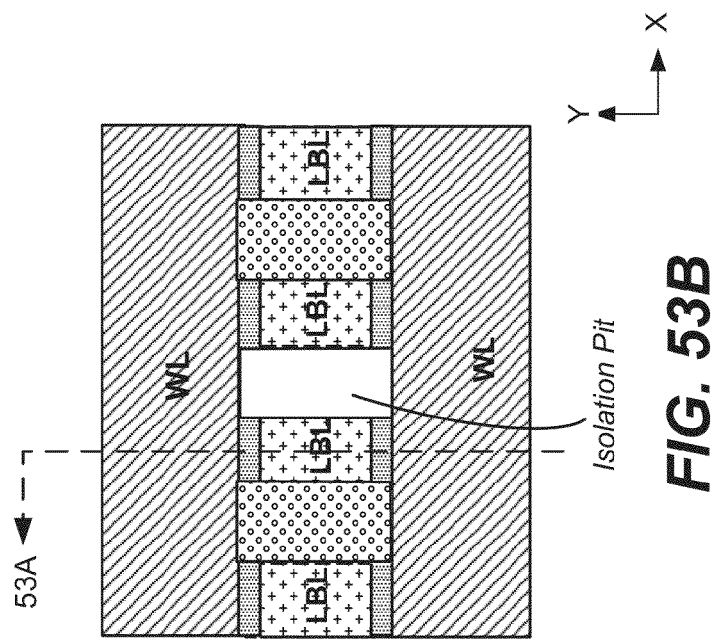
FIG. 53B is a top plan view in the z-direction of the structure shown in FIG. 53A.
Figure 53A:
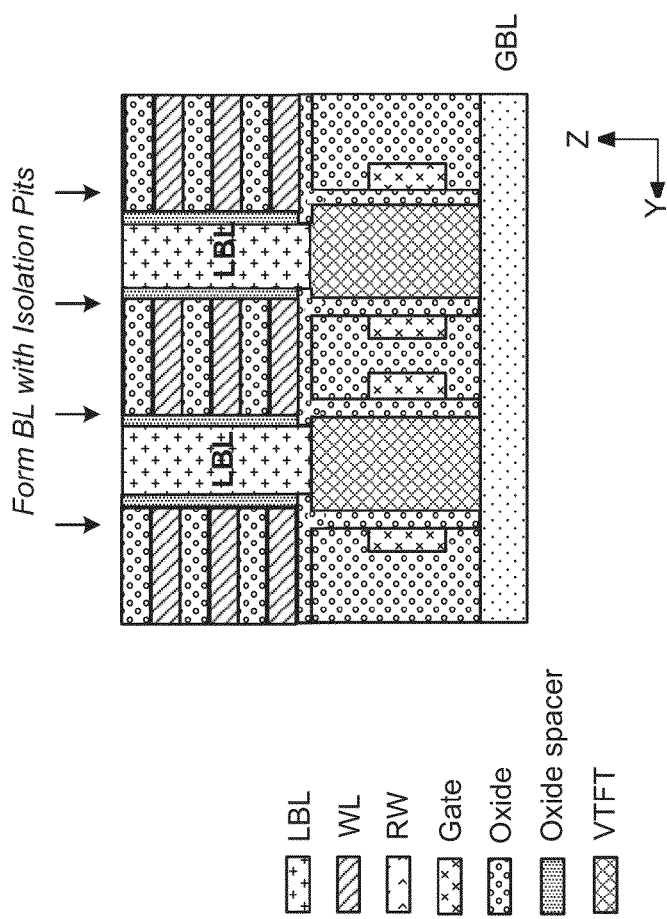
FIG. 53A is a cross-sectional view in the x-direction, illustrating the process of isolating the LBLs in the open pits by RIE etching away the portions of N+ poly and oxide not on top of the VTFTs using a bit line mask BL2 to create isolation pits.

FIG. 53A is a cross-sectional view in the x-direction, illustrating the process of isolating the LBLs in the open pits by RIE etching away the portions of N+ poly and oxide not on top of the VTFTs using a bit line mask BL2 to create isolation pits.

FIG. 53B is a top plan view in the z-direction of the structure shown in FIG. 53A.

FIG. 54 is a cross-sectional view in the x-direction, illustrating the process of depositing a layer of R/W material of predetermined thickness in the isolation pits. The deposition is accomplished by Atomic Layer Deposition ("ALD').

FIG. 55A is a top plan view in the z-direction illustrating the process of etching the R/W material from the bottom of the isolation pits to create a shell structure R/W element. This step may be optional if the R/W material from the bottom of the isolation pits do not significantly change the conductance between a pair of local bit line and word line.

FIG. 55B is a cross-sectional view in the x-direction of the structure across the section 55A shown in FIG. 55A.

FIG. 56A is a top plan view in the z-direction, illustrating the process of filling the shell structure R/W elements in the isolation pits with an oxide core. After planarization to remove excess oxide from the top of the slab, the memory layer with the shell structure R/W elements according to the alternative embodiment is completed.

FIG. 56B is a cross-sectional view in the x-direction of the structure across the section 56B shown in FIG. 56A.

FIG. 56C is a cross-sectional view in the x-direction of the structure across the section 56C shown in FIG. 56A.

CONCLUSION

Although the various aspects of the present invention have been described with respect to exemplary embodiments thereof, it will be understood that the present invention is entitled to protection within the full scope of the appended claims.

It is claimed:

1. A memory including memory elements arranged in a three-dimensional pattern defined by rectangular coordinates having x, y and z-directions and with a plurality of parallel planes stacked in the z-direction over a semiconductor substrate, the memory further comprising:
- a plurality of local bit lines elongated in the z-direction through the plurality of planes and arranged in a two-dimensional rectangular array of bit line pillars having rows in the x-direction and columns in the y-direction;
- a plurality of word lines elongated in the x-direction across individual planes and spaced apart in the y-direction between and separated from the plurality of bit line pillars in the individual planes, wherein the bit line pillars and word lines cross adjacent each other at a plurality of locations across the individual planes;
- a non-volatile re-programmable memory element in contact with a bit line pillar and a word line at individual ones of the crossings;
- said non-volatile re-programmable memory element having a tubular shell with an outer surface, a first portion of the outer surface acts as a first electrode for the bit line pillar and a second portion of the outer surface acts as a second electrode for the word line; and
- wherein the tubular shell has a thickness that controls an electrical conductance of said non-volatile re-programmable memory element across the bit line pillar and the word line.

2. The memory of claim 1, wherein:
said tubular shell has a rectangular cross-section and elongated along a long axis with four sides;
the first electrode is on a first side of the four sides; and
the second electrode is on a second side of the four sides.

3. The memory of claim 1, wherein:
the first of the four sides is adjacent to the second side of the four sides.

4. The memory of claim 1, wherein:
the first side of the four sides is opposite to the second side of the four sides.

5. The memory of claim 1, wherein:
said tubular shell has a rectangular cross-section and elongated along a long axis with four sides along a long axis;
said long axis is aligned in the z-direction; and
said tubular shell is sandwiched between a pair of adjacent bit lines along a row in the x-direction.

6. The memory of claim 1, wherein:
said tubular shell has a rectangular cross-section and elongated along a long axis with four sides along a long axis;
said long axis is aligned in the z-direction; and
said tubular shell is sandwiched between every other pair of adjacent bit lines along a row in the x-direction.

7. The memory of claim 1, wherein:
said tubular shell has a rectangular cross-section extended along a long axis in the z-direction with four sides through the plurality of planes; and
said tubular shell is sandwiched between a pair of adjacent word lines along the y-direction.

8. The memory of claim 1, wherein:
said tubular shell is filled with oxide.

9. The memory of claim 1, wherein said non-volatile re-programmable memory element include at least one of a carbon material or a phase change material.

10. The memory of claim 1, wherein said non-volatile re-programmable memory element is characterized by a level of electrical conductance that changes between at least first and second stable levels in response to an electrical stimulus applied thereto.

11. A method of forming a memory having memory elements arranged in a three-dimensional pattern defined by rectangular coordinates having x, y and z-directions and with a plurality of parallel planes stacked in the z-direction, comprising:
- (a) providing a semi-conductor substrate;
- (b) forming predetermined active elements and metal lines on the semi-conductor substrate;
- (c) forming a vertical switching layer comprising a two-dimensional array of pillar switches on top of the semi-conductor substrate;
- (d) forming a multi-layer structure on top of the vertical switching layer, the multi-layer structure comprising repeated layers of word line material interleaved by dielectric layers;
- (e) opening a plurality of trenches in the x-z plane in the multi-layer structure, each trench being aligned with a row of pillar switches;
- (f) depositing a layer of oxide spacer over the plurality of trenches;
- (g) etching to expose individual pillar switches in each trench;
- (h) filling each trench with doped polysilicon for forming bit line pillars;
- (i) isolating into individual bit line pillars aligned on top of the row of pillar switches by removing the doped polysilicon and the layer of oxide spacer in between the individual bit line pillars to form isolation pits;
- (j) depositing a layer of R/W material in the isolation pits to form a R/W element with a tubular shell; and
- (k) filling the tubular shell with oxide.

12. The method as in claim 11, further comprising:
- (j1) etching to remove the R/W material from the bottom of the isolation pits before performing step (k).

13. The method as in claim 11, wherein said R/W material includes at least one of a carbon material or a phase change material.

14. The method as in claim 11, wherein said R/W material is characterized by a level of electrical conductance that changes between at least first and second stable levels in response to an electrical stimulus applied thereto.

15. A method of forming a memory having memory elements arranged in a three-dimensional pattern defined by rectangular coordinates having x, y and z-directions and with a plurality of parallel planes stacked in the z-direction, comprising:
- (a) providing a semi-conductor substrate;
- (b) forming predetermined active elements and metal lines on the semi-conductor substrate;
- (c) forming a vertical switching layer comprising a two-dimensional array of pillar switches on top of the semi-conductor substrate;
- (d) forming a multi-layer structure on top of the vertical switching layer, the multi-layer structure comprising repeated layers of word line material interleaved by dielectric layers;
- (e) opening a plurality of trenches in the x-z plane in the multi-layer structure, each trench being aligned with a row of pillar switches;
- (f) depositing a layer of oxide over the plurality of trenches;
- (g) etching the oxide to create a space that exposes individual pillar switches in each trench and an isolation pit in between every other pair of pillar switches in each trench;
- (h) depositing a layer of oxide spacer over the space;
- (i) etching to expose individual pillar switches in each trench;
- (j) filling each trench with doped polysilicon for forming bit line pillars;

(k) isolating into individual bit line pillars aligned on top of the row of pillar switches by removing the doped polysilicon and the layer of oxide spacer in between the individual bit line pillars to form isolation pits;

(l) depositing a layer of R/W material in the isolation pits to form a R/W element with a tubular shell; and (m) filling the tubular shell with oxide.

16. The method as in claim 15, further comprising:

(l1) etching to remove the R/W material from the bottom of the isolation pits before performing step (m).

17. The method as in claim 15, wherein said R/W material includes at least one of a carbon material or a phase change material.

18. The method as in claim 15, wherein said R/W material is characterized by a level of electrical conductance that changes between at least first and second stable levels in response to an electrical stimulus applied thereto.

* * * * *